United States Patent [19]

Uchida et al.

[11] Patent Number: 5,544,109

[45] Date of Patent: Aug. 6, 1996

[54] SEMICONDUCTOR MEMORY DEVICE

[75] Inventors: Toshiya Uchida; Masao Taguchi, both of Kawasaki, Japan

[73] Assignee: Fujitsu Limited, Kawasaki, Japan

[21] Appl. No.: 205,361

[22] Filed: Mar. 3, 1994

[30] Foreign Application Priority Data

Apr. 28, 1993 [JP] Japan ................................. 5-103288

[51] Int. Cl.⁶ .................................................... G11C 7/00
[52] U.S. Cl. ................ 365/203; 365/189.06; 365/189.11
[58] Field of Search ............................... 365/203, 230.05, 365/189.01, 168, 195, 189.06, 189.11, 190, 154, 221

[56] References Cited

U.S. PATENT DOCUMENTS

| | | | |
|---|---|---|---|
| 4,665,507 | 5/1987 | Gondou et al. | |
| 4,780,850 | 10/1988 | Miyamoto et al. | 365/203 |
| 5,042,013 | 8/1991 | Sato | 365/230.05 |
| 5,233,560 | 8/1993 | Foss et al. | 365/203 |
| 5,249,165 | 9/1993 | Toda | 365/230.05 |
| 5,282,166 | 1/1994 | Ozaki | 365/203 |
| 5,291,450 | 3/1994 | Fujiwara et al. | 365/203 |
| 5,369,612 | 11/1994 | Furuyama | 365/203 |

FOREIGN PATENT DOCUMENTS

| | | |
|---|---|---|
| 0050529 | 4/1982 | European Pat. Off. . |
| 2242767 | 10/1991 | United Kingdom . |

*Primary Examiner*—David C. Nelms
*Assistant Examiner*—Vu A. Le
*Attorney, Agent, or Firm*—Armstrong, Westerman, Hattori, McLeland & Naughton

[57] ABSTRACT

A semiconductor memory device includes a flip-flop circuit, a switch provided between the flip-flop circuit and a pair of data lines, a write circuit writing data into the flip-flop circuit via the switch, and a circuit applying a predetermined voltage to the pair of data lines when the write circuit performs a write operation so that a voltage amplitude on the pair of data lines is limited so as to be less than a voltage amplitude of the flip-flop circuit in the write operation.

20 Claims, 44 Drawing Sheets

φ IS "H" IN WRITE OPERATION

SIGNAL SWITCHED
TO "H" IN COLUMN                    TO pMOS DC LOAD Tr
SELECTING OPERATION

TO DC LOAD TRANSISTORS
Q7, Q8

READ OPERATION

FIXED TO "H"
WRITE OPERATION

IN READ/WRITE OPERATION (WHEN CONTROLLED)

IN READ/WRITE OPERATION (WHEN NOT CONTROLLED)

PART IN FIG. 24A

TO COLUMN
DECODERS 22A
(DECISION SIGNAL)

READ OPERATION

WRITE OPERATION

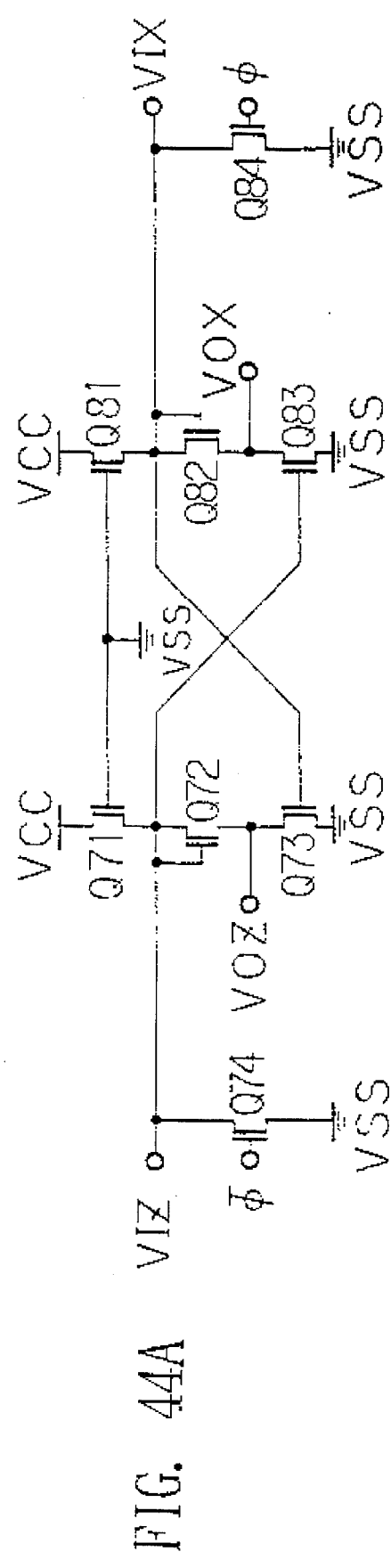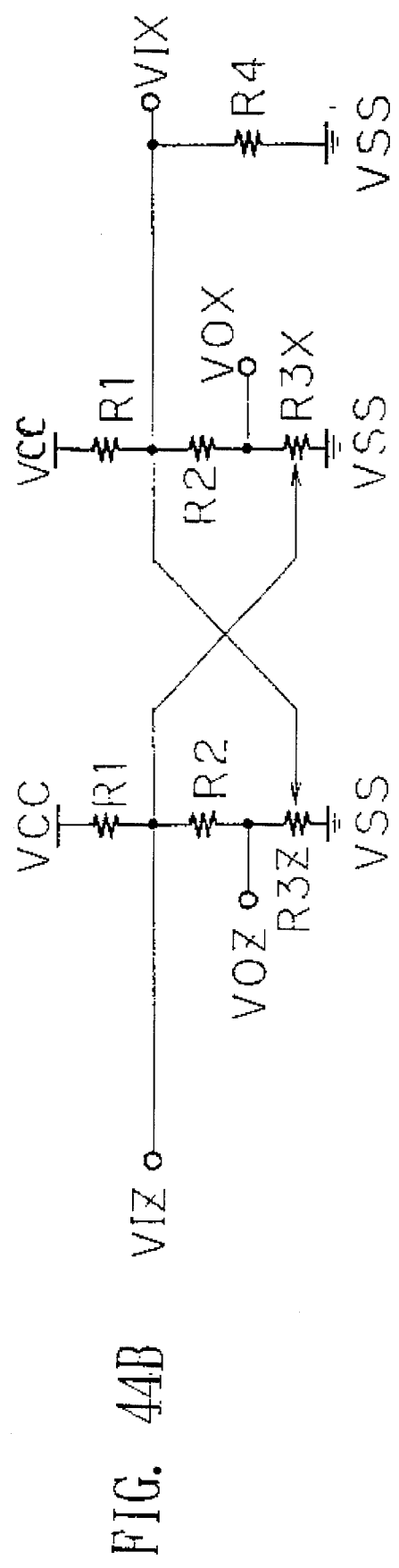
FIG. 44A
FIG. 44B

SEMICONDUCTOR MEMORY DEVICE

BACKGROUND OF THE INVENTION

1. Field of the Invention

The present invention generally relates to semiconductor memory devices, and more particularly to control performed at the time of writing data into and reading data from a semiconductor memory device such as a DRAM (Dynamic Random Access Memory) or an SRAM (Static Random Access Memory).

2. Description of the Related Art

Recently, a semiconductor memory device has employed a relatively large chip and the data lines for transferring data read from memory cells to output circuits have become longer. Further, in order to increase the access speed, a complex read operation has been employed. Examples of such a complex read operation are a page mode and static column mode in the DRAM. In such a complex read operation, a case will frequently occur in which second data is read via a pair of data lines in a state in which first data remains in the pair of data lines.

If the first read data and the subsequent second read data have opposite polarities of the pair of data lines, it takes a long time to reverse the polarities of the pair of data lines due to a parasitic capacitance coupled to the long data lines.

In order to avoid the above problem, conventionally, the pair of data lines is set to constant potentials at the time of reading data from a memory cell. The constant potentials limit the amplitude voltage between the pair of data lines and contribute to reduction of the time it takes to inverse the polarities of the pair of data lines.

FIG. 1 is a circuit diagram of an essential part of a conventional semiconductor memory device. Referring to FIG. 1, m (m is an integer equal to or larger than 1) bistable flip-flop circuits 1 are coupled to a pair 3 of data lines D and /D via m selection transistor circuits 2. It will be noted that "/D" denotes an inverted version of a signal "D" or a signal line carrying the inverted signal /D. The symbol "/" corresponds to "bar" shown in the drawings. The above holds true for the combination of other characters with the symbol "/". A load circuit 4, a read buffer circuit 5 and a write buffer circuit 6 are connected to the pair 3 of data lines of a complementary type.

Each of the flip-flop circuits 1 includes two N-channel MOS transistors (FETs) Q1 and Q2 and two P-channel MOS transistors Q3 and Q4, and stores write data or read data with complementary signals. Power supply voltages VCC and VSS (VCC>VSS) are supplied to each of the flip-flop circuits 1. For example, the power supply voltages VCC and VSS are 5V and 0V, respectively. Each of the selection transistor circuits 2 includes two N-channel MOS transistors (transfer gates) Q5 and Q6. The load circuit 4 includes two P-channel MOS transistors Q7 and Q8. The write buffer circuit 6 includes two P-channel MOS transistors Q9 and Q11, and two N-channel MOS transistors Q10 and Q12. When the circuit shown in FIG. 1 is provided in the DRAM, memory cells (not shown) are connected to the flip-flop circuits 1. When the circuit shown in FIG. 1 is provided in the SRAM, the flip-flop circuits 1 function as memory cells. The flip-flop circuits 1 may be used as sense amplifiers provided for respective pair of bit lines.

FIG. 2 is a waveform diagram of the read operation of the circuit shown in FIG. 1. At the commencement of the read operation, a control signal /φ ("/" denotes the same meaning as that of bar shown in FIG. 1) is set to a low level, and the data lines D and /D are set to a high level (approximately equal to VCC). In the above state, a select signal φm−2, for example, is switched to the high level. It will now be assumed that nodes N1 and /N1 of the flip-flop circuit 1 associated with the select signal φm−2 are at the high level (H) and the low level (L), respectively. When the select signal φm−2 is switched to the high level, the transistor Q5 and Q6 are turned ON, and thus the nodes N1 and /N1 become connected to the data lines D and /D, respectively. The data line D is continuously at the voltage VCC because the node N1 is at the high level, while the potential of the data line /D starts to decrease because the node /N1 is at the low level. Then, the potential of the data line /D is settled to a limited potential depending on the ratio of the ON resistances (internal resistances) of the transistor Q2 of the (m−2)th flip-flop circuit 1, the transistor Q6 and the transistor Q7 of the load circuit 4. It will now be assumed that the above limited potential is denoted as VCC−α.

Thereafter, it will be assumed that a select signal φm−1 is switched to the high level at time t=0, and the (m−1)th flip-flop circuit 1 is selected. It will be assumed that nodes N2 and /N2 of the (m−1)th flip-flop circuit 1 are at the low level (L) and the high level (H), respectively. Since the select circuit 2 is made up of the N-channel MOS transistors Q5 and Q6, the source potentials thereof must be equal to or lower than VCC−Vth (Vth is the threshold voltage of the N-channel MOS transistors) when the gate potential is VCC. The N-channel MOS transistor Q5 connected to the node N2 is strongly turned ON because the source potential thereof is VSS. The N-channel MOS transistor Q6 connected to the node /N2 is little turned ON because the source potential thereof is VCC−α. Hence, the (m−1)th flip-flop circuit 1 is influenced from only the data line D via the transistor Q5 connected to the node N2. Hence, the potential of the data line D is decreased to VCC−α, and the potential of the data line /D is increased to VCC.

As described above, in the read operation, the potential difference between the pair of data lines is limited to a constant voltage (α in the above example) in the high-potential side of the amplitude voltage of the flip-flop circuit 1, so that the potential inverting speed can be facilitated. For example, the above potential difference α is approximately equal to 0.5 V.

A description will now be given, with reference to FIG. 3, of the write operation performed subsequent to the above-mentioned read operation. It will now be assumed that the nodes N1 and /N1 of the (m−2)th flip-flop circuit 1 are at the high level (H) and the low level (L), respectively, as shown in FIG. 1. As shown in FIG. 3, the select signal φm−2 is switched to the high level, and thus data stored in the flip-flop circuit 1 is read. Further, the potentials of the data lines D and /D are respectively VCC and VCC −α. FIG. 3 shows the waveforms obtained when the load circuit 4 is operated and the data line pair is connected to the VCC line.

When data different from data stored in the (m−2)th flip-flop circuit 1 is written therein in the above state, write data signals Dw and /Dw are set to the low and high levels, respectively (write buffer activating operation). At this time, the driving signal /φ applied to the load circuit 4 is set to the low level as in the case of the read operation. The data line D is connected to the VSS line via the transistor Q12, and the data line /D is connected to the VCC line via the transistor Q9. The potential of the data line /D is rapidly increased to the voltage VCC, and the potential of the node /N1 is rapidly increased.

After the write buffer activating operation, the potential of the data line D starts to gradually decrease. When the source voltage of the transistor Q5 becomes lower than the gate voltage thereof by the threshold voltage Vth, the transistor Q5 is turned ON. Then, the potential of the node N1 starts to decrease. Thereafter, the state of the (m–2)th flip-flop circuit 1 is inverted, and the write operation is completed.

The potential of the data line D is settled to a level Vcc–β dependent on the ratio of the ON resistances of the transistors Q8, Q12, Q5 and Q1.

However, the above-mentioned conventional semiconductor memory device has the following disadvantages.

FIG. 4 is a circuit diagram of the configuration of the read buffer circuit 5 shown in FIG. 1. More particularly, the circuit shown in FIG. 4 is a current-mirror circuit made up of MOS transistors Q13–Q22. The data lines D and /D are connected to the gates of the N-channel MOS transistors Q16 and Q20. Read data Dr and /Dr are respectively output via a node at which the transistors Q18 and Q20 are connected together and a node at which the transistors Q14 and Q16 are connected together. It is known that the current-mirror type read circuit as shown in FIG. 4 has the best AC input/output characteristic (operates at the highest speed) when inputs D and /D are approximately equal to VCC/2. However, the aforementioned conventional circuit configuration is designed to stabilize the operation of the flip-flop circuits 1 by precharging the data lines D and /D to the power supply voltage VCC. Hence, the read buffer circuit 5 provided in the conventional circuit configuration cannot be operated in the best AC input/output characteristic. That is, the read buffer circuit 5 operates at a speed lower than the maximum speed.

Further, in the write operation described with reference to FIG. 3, the source potential of the transistor Q5 of the (m–2)th select circuit 2 remains at the voltage VCC for a while, and starts to decrease. Hence, it takes a long time for the transistor Q5 to be turned OFF, and the write operation cannot be performed at high speed.

With the above in mind, it may be considered that the driving signal /φ applied to the load circuit shown in FIG. 1 is switched to the high level when data is written whereby the load circuit 4 is disconnected from the data lines D and /D.

FIG. 5 is a waveform diagram showing the operation observed under the above consideration. At the time of the write operation, the driving signal /φ is switched to the high level in order to rapidly turn ON the transistor Q5 of the (m–2)th select transistor 2. In this case, the amplitude limitation regarding the data lines D and /D activated in the write operation is removed, and the amplitude on the pair of data lines varies within the full range, as shown in FIG. 5, as indicated by τ shown therein. Hence, it takes a long time to reset the data lines D and /D (set the potentials of the data lines D and /D to VCC) after the write operation. In the case shown in FIG. 5, it takes a long time to precharge the data line D to VCC. Furthermore, it is necessary for large current to flow in the circuit in order to precharge the data line D, and a large amount of energy is consumed.

SUMMARY OF THE INVENTION

It is a general object of the present invention to provide a semiconductor memory device in which the above disadvantages are eliminated.

A more specific object of the present invention is to provide a semiconductor memory device capable of performing at least write operation or read operation with low power consumption.

The above objects of the present invention are achieved by a semiconductor memory device comprising; a flip-flop circuit; a switch provided between the flip-flop circuit and a pair of data lines; a write circuit writing data into the flip-flop circuit via the switch; and a circuit applying a predetermined voltage to the pair of data lines when the write circuit performs a write operation so that a voltage amplitude on the pair of data lines is limited so as to be less than a voltage amplitude of the flip-flop circuit in the write operation.

The above objects of the present invention are also achieved by a semiconductor memory device comprising: a flip-flop circuit; a switch provided between the flip-flop circuit and a pair of data lines; a write circuit writing data into the flip-flop circuit via the switch; and potential shift means connected to the pair of data lines, for converting potentials of the pair of data line into different potentials.

BRIEF DESCRIPTION OF THE DRAWINGS

Other objects, features and advantages of the present invention will become more apparent from the following detailed description when read in conjunction with the accompanying drawings, in which:

FIGS. 44A and 44B are equivalent circuit diagrams obtained when a driving signal rises in the potential shift circuit according to the fifth embodiment of the present invention;

DESCRIPTION OF THE PREFERRED EMBODIMENTS

Figure 1:
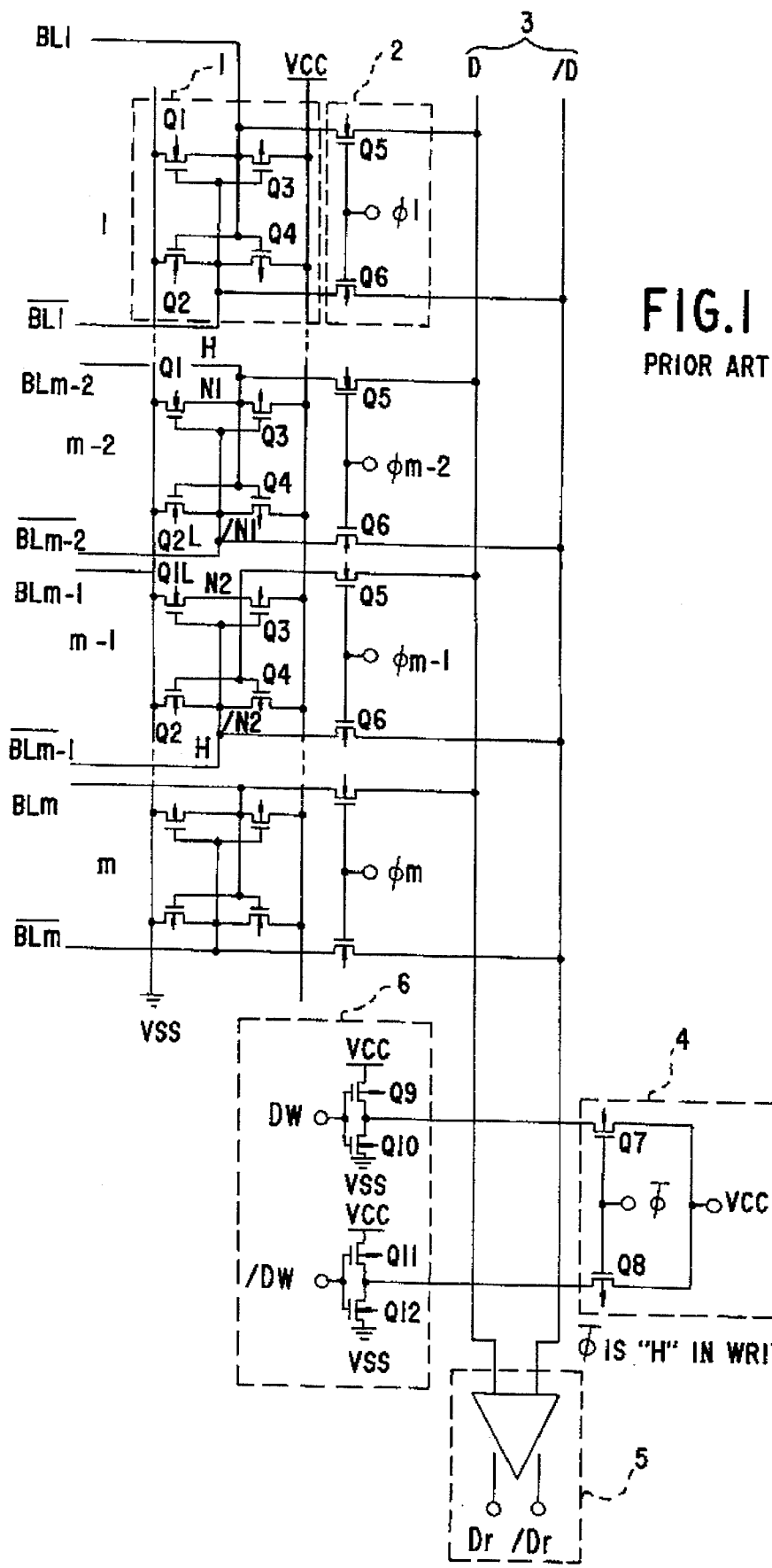
FIG. 1 is a circuit diagram of an essential part of a conventional semiconductor memory device.
Figure 2:
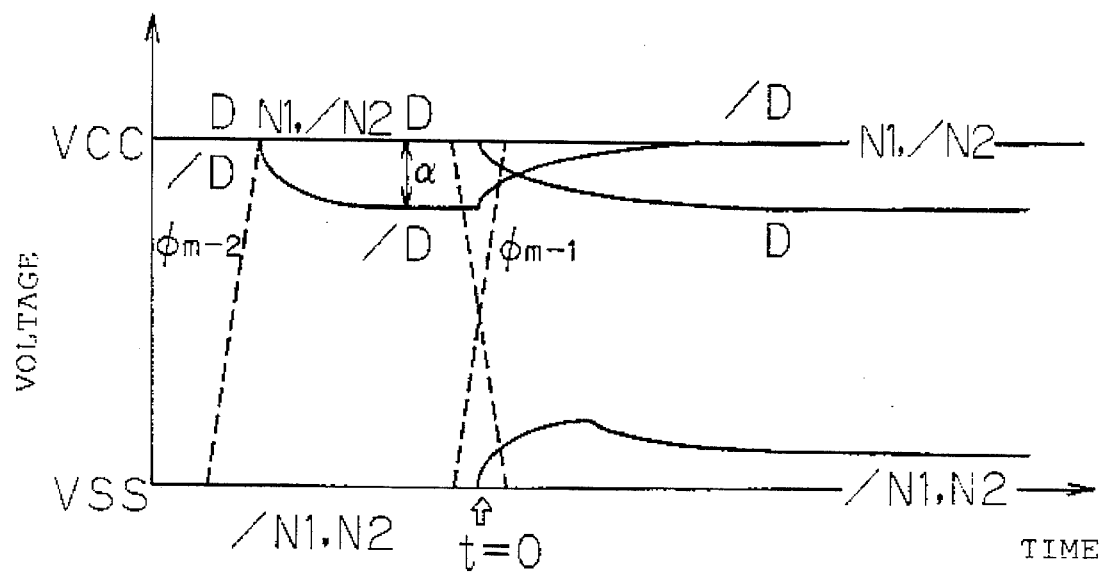
FIG. 2 is a waveform diagram of the read operation of the circuit shown in FIG. 1.
Figure 3:
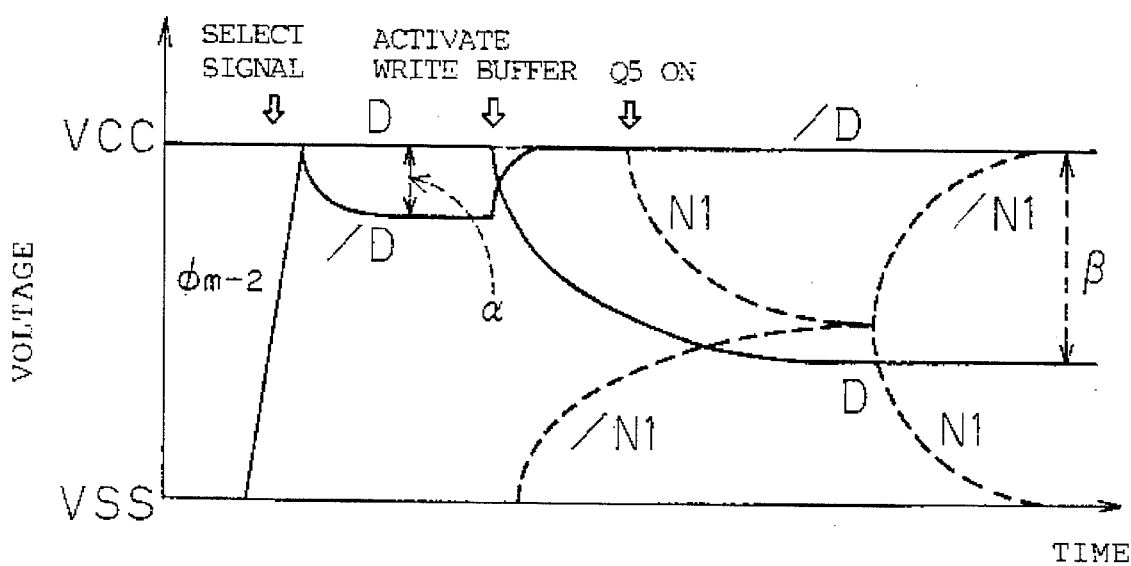
FIG. 3 is a waveform diagram of the operation of the circuit shown in FIG. 1 in a case where a power supply voltage VCC is applied to a pair of data lines in the write operation.
Figure 6:
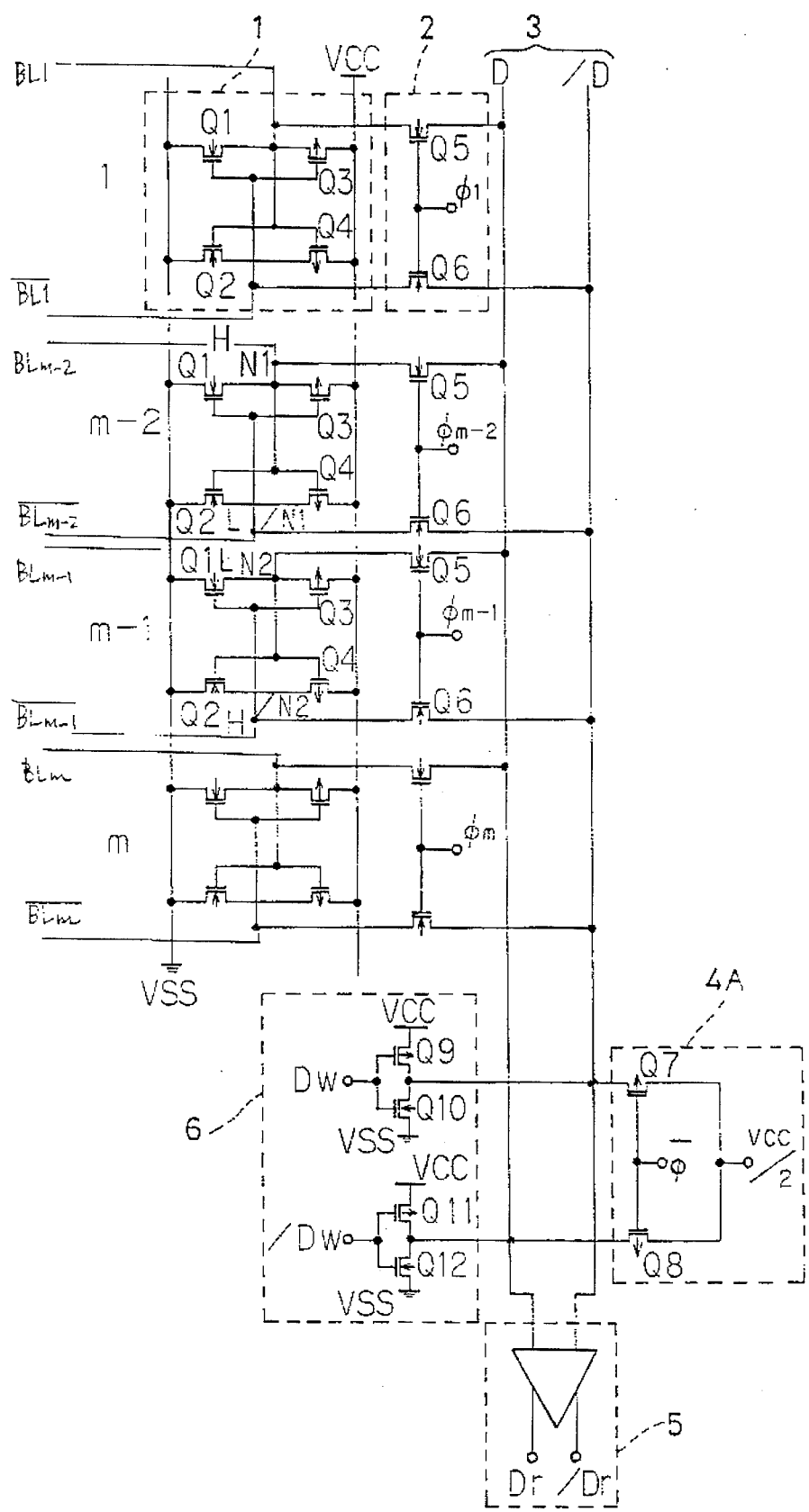
FIG. 6 is a circuit diagram of a first embodiment of the present invention.

FIG. 6 is a circuit diagram of a first embodiment of the present invention. In FIG. 6, parts that are the same as those shown in FIG. 1 are given the same reference numbers.

A semiconductor memory circuit according to the first embodiment of the present invention includes a plurality of (m) flip-flop circuits 1, a pair 3 of data lines D and /D, select transistor circuits 2 selectively connecting the flip-flop circuits 1 and the data line pair 3 in response to a select signal $\phi 1-\phi m$ based on an external input address signal, a read buffer circuit 5 for amplifying data read to the data line pair 3 from one of the flip-flop circuits 1 via the associated select transistor circuit 2, a write buffer circuit 6 for writing one of the flip-flop circuits via the data line pair 3 and the associated select transistor circuit 2, and a load circuit 4A connected to the data line pair 3. The load circuit 4A functions to limit the voltage amplitude between the data lines D and /D to a voltage amplitude of the flip-flop circuits 1 or less, preferably approximately half the voltage amplitude of the circuits 1, at least when the data write operation is performed. For this purpose, the load circuit 4A functions to generate a predetermined voltage (clamp voltage) equal to approximately half the power supply voltage VCC.

It will now be assumed that the nodes N1 and /N1 of the (m–2)th flip-flop circuit 1 are at the high level (H) and the low level (L). When the select signal $\phi m-2$ is switched to the high level, high-level data appears on the data line D, and low-level data appears on the data line /D. In the read operation, the voltage amplitude between the data lines D and /D is limited to the above-mentioned voltage $\alpha$. This voltage $\alpha$ depends on the ratio of the ON resistances of the transistors Q7, Q6 and Q2 and the ON resistances of the transistors Q8, Q5 and Q3.

Figure 7:
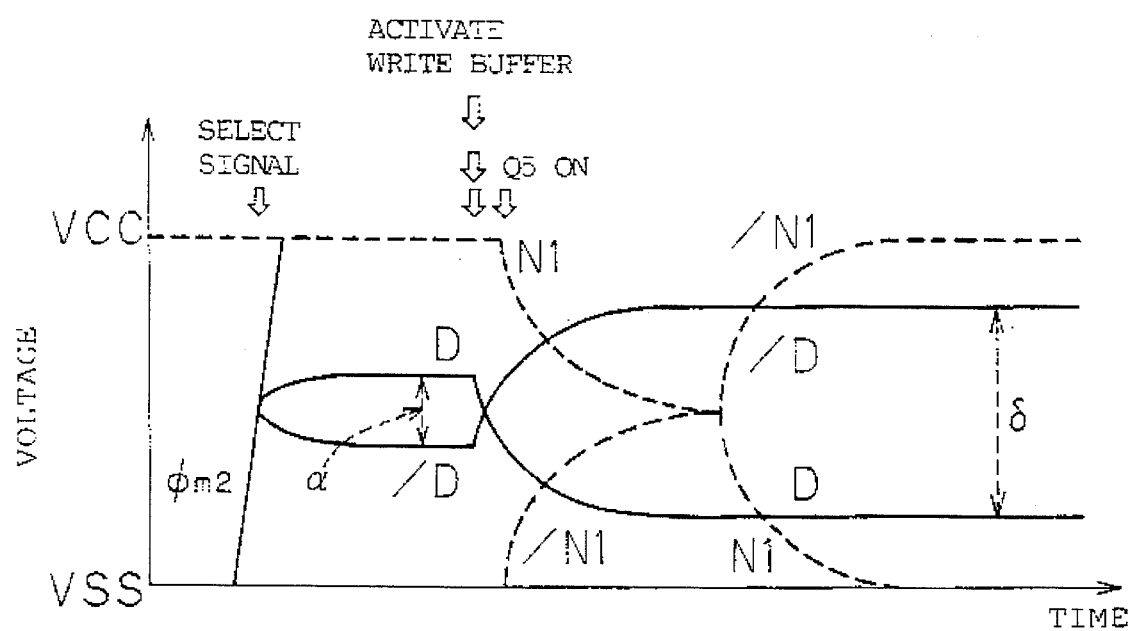
FIG. 7 is a waveform diagram of the operation of the circuit shown in FIG. 6.

When the data read operation is performed, the data line pair 3 has been precharged to VCC/2. That is, when the data read operation is performed, the driving signal $/\phi$ is set to the low level. In this case, as shown in FIG. 7, since the node N1 is at the high level, the potential of the data line D becomes equal to $VCC/2+\alpha/2$, and the potential of the data line /D becomes equal to $Vcc/2-\alpha/2$.

When inverse data is written into the (m–2)th flip-flop circuit 1 in the above state, the data signals Dw and /Dw are set to the low level and the high level, respectively. In the write operation, the driving signal $/\phi$ is maintained at the low level. Hence, the voltage VCC/2 is applied to the data lines D and /D.

The data write circuit 6 has an internal resistance which causes the voltage amplitude between the data lines D and /D appearing at the time of the write operation falls in a predetermined limited range $\delta$ (for example, $\delta=2\alpha$). More specifically, the dimensions of the transistors Q9–Q12, the above limited range $\delta$ is selected. When the write data different from the read data is written into the (m–2)th flip-flop circuit 1, the potential of the data line /D rapidly increases to $VCC/2+\alpha$, and the potential of the data line D rapidly decreases to VCC/2−α. The transistors Q5 and Q6 are strongly turned ON in which the node /N1 functions as the source of the transistor Q6 and the data line D functions as the source of the transistor Q5.

Hence, data can be written into the (m−2)th flip-flop circuit 1 from both the data lines D and /D while there is no need to stop the operation of the load circuit 4A by controlling the control signal /φ, so that data is written at high speed. Further, in the data write operation, the voltage amplitude between the data lines D and /D is limited and has the center equal to VCC/2. Hence, it becomes possible to rapidly reset the data lines D and /D after the write operation is completed. Further, the reset operation precharges the data line set to the high level in the write operation to VCC/2 and precharges the data line set to the low level in the write operation to VCC/2. Hence, the reset operation does not need much current as in the conventional case.

Figure 4:
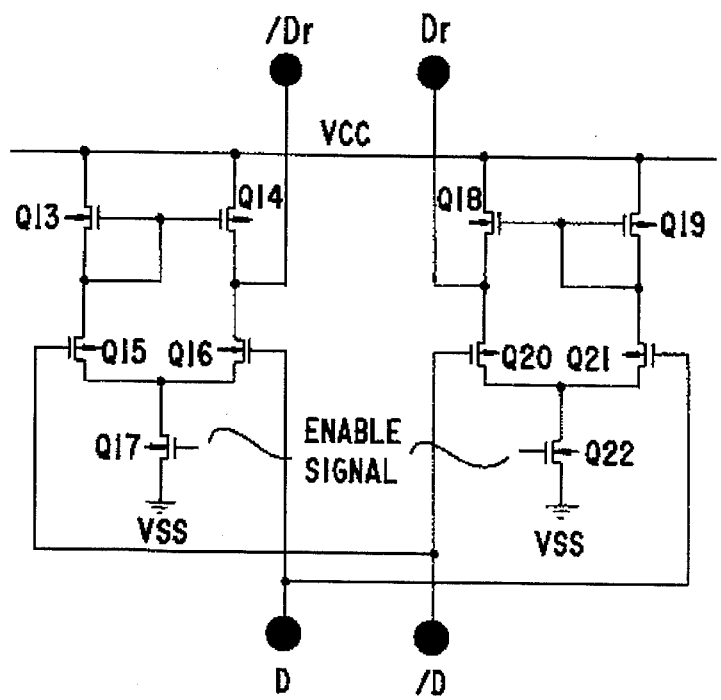
FIG. 4 is a circuit diagram of a read buffer circuit shown in FIG. 1.

At the commencement of the read operation, the data lines D and /D have been precharged to VCC/2, and the voltage amplitude between the data lines D and /D is limited to α. Hence, when the read buffer circuit 5 has the current-mirror type circuit configuration as shown in FIG. 4, the amplifying operation can be performed with the best AC input/output characteristic of the current-mirror type circuit, and data can be read at high speed.

The first embodiment of the present invention will now be described in more detail. The circuit configuration shown in FIG. 6 differs from that shown in FIG. 1 in that the data lines D and /D in the configuration shown in FIG. 6 are precharged to VCC/2 before the read operation or the write operation is performed.

As shown in FIG. 7, before the read operation is started, the data lines D and /D are precharged VCC/2. Assuming that the (m−2)th flip-flop circuit 1 holds data shown in FIG. 6, when the select signal φm−2 rises, the potential difference between the data lines D and /D is increased to α around the voltage VCC/2. When the write data different from the data stored in the (m−2)th flip-flop circuit 1 is written therein, the data signals Dw and /Dw are set to the low level and the high level, respectively. Thereby, the transistor Q9 is turned ON, and the power supply voltage VCC is applied to the data line /D. Further, the transistor Q12 is turned ON, and the power supply voltage VSS is applied to the data line D. Then, the transistors Q5 and Q6 of the select transistor circuit 2 associated with the (m−2)th flip-flop circuit 1 are strongly turned ON in the state in which the node /N1 functions as the source of the transistor Q6 and the data line D functions as the source of the transistor Q5. Hence, the potential of the node N1 is decreased, and the potential of the node /N1 is increased. At a certain time, the state of the (m−2)th flip-flop circuit 1 is inverted.

A current flows to the power supply VCC/2 from the power supply VCC via the transistors Q9 and Q7, and a current flows to the power supply VCC from the power supply VCC/2 via the transistors Q8 and Q12. In this case, it is possible to set the amplitude of the data line /D to VCC/2+α and set the data line D to VCC/2−α by controlling the ON resistances of the transistors Q9, Q7, Q8 and Q12 by designing the dimensions of these transistors. Similarly, the dimensions of the transistors Q10 and Q11 are designed. Hence, the potential of the data line D can be rapidly decreased to VCC/2−α, and the potential of the data line /D can be rapidly increased to VCC/2+α. As a result of the above operation, the transistors Q5 and Q6 can be rapidly turned ON immediately after the write operation is commenced.

It is desirable that the potential difference δ between the data lines D and /D obtained in the write operation is greater than the potential difference α obtained in the read operation (for example, δ=2α). When data is read from the (m−2)th flip-flop circuit 1 according to the above-mentioned read operation, the potential of the data line D becomes equal to VCC/2+α/2 and the potential of the data line /D becomes equal to VCC/2−α/2, as shown in FIG. 7. When α is equal to, for example, 0.5 V, the potential of the data line D becomes equal to VCC/2+0.25 V, and the potential of the data line /D becomes equal to VCC/2−2.25 V.

It will now be assumed that, at the above time, due to a cause, the level of the select signal φm−2 decreases and the (m−1)th flip-flop circuit 1 is selected by the select signal φm−1 in which circuit 1 the node N2 is at the low level (L) and the node /N2 is at the high level (H). In this case, if the amplitude between the data lines D and /D obtained in the write operation is equal to 0.5 V (=α), the situation observed when the (m−1)th flip-flop circuit 1 is selected is the same as that observed in the write operation. In order to distinguish the situation observed in the read operation from that observed in the write operation, the amplitude δ between the data lines D and /D obtained in the write operation should be greater than the amplitude α therebetween obtained in the read operation. For example, when α=0.5 V, the amplitude δ should be set to a voltage greater than 0.5 V.

Figure 8:
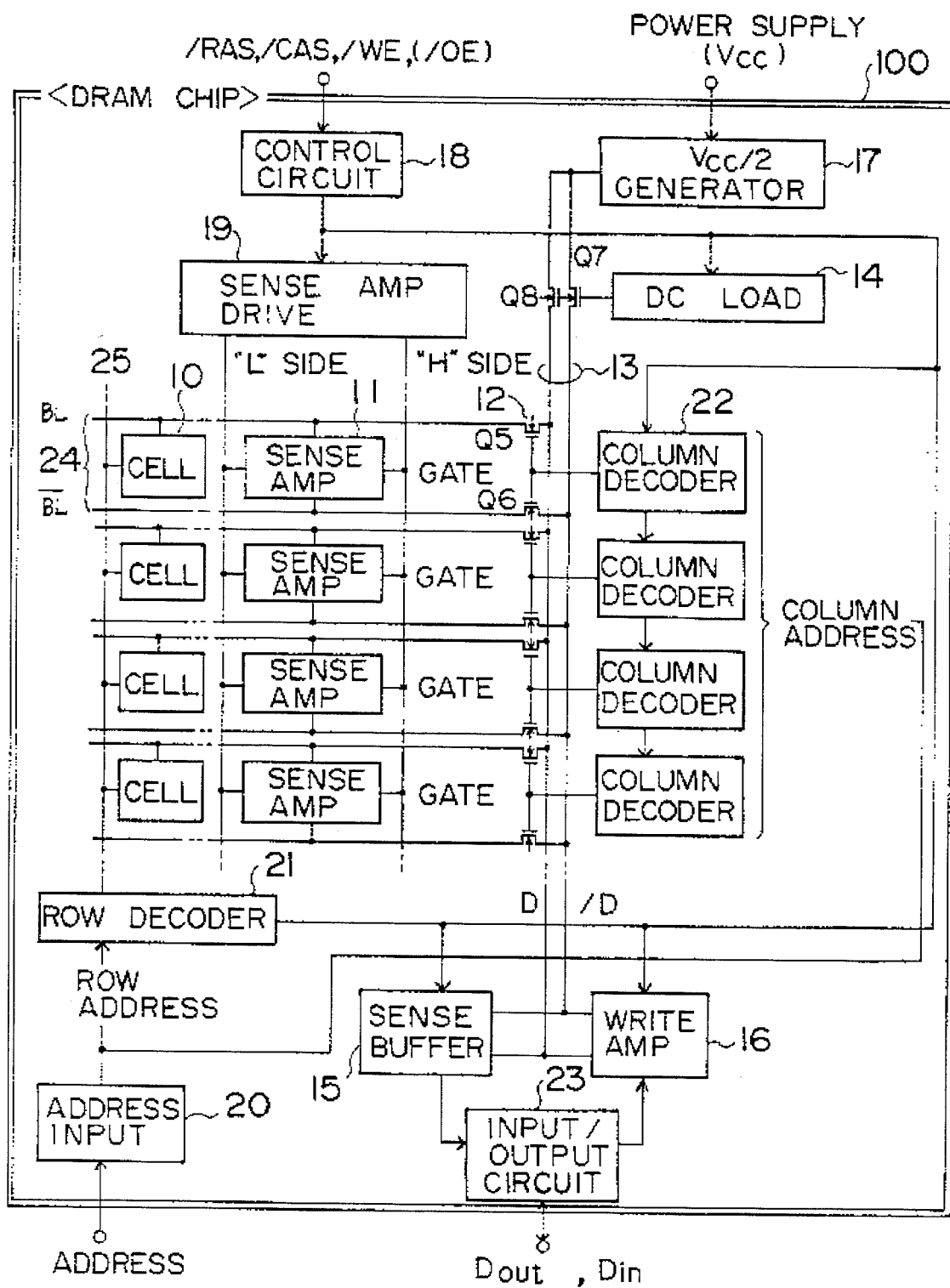
FIG. 8 is a block diagram of a DRAM device to which the first embodiment of the present invention is applied.

FIG. 8 is a diagram of the structure of a DRAM equipped with the circuit shown in FIG. 6 according to the first embodiment of the present invention. A DRAM chip 100 includes a plurality of memory cells arranged in rows and columns, sense amplifiers 11, and column selecting gates 12. The memory cells 10 and the sense amplifiers 11 are connected, via the column selecting gates 12, to a pair of data buses formed with the data lines D and /D. The sense amplifiers 11 and the column selecting gates 12 correspond to the flip-flop circuits 1 and the select transistor circuits 2 shown in FIG. 6, respectively. A sense buffer 15 and a write amplifier 16 are connected to the data bus pair 13. The sense buffer 15 and the write amplifier 16 correspond to the read circuit 5 and the write circuit 6 shown in FIG. 6, respectively. An input/output circuit connected to the sense buffer 15 and the write amplifier 16 outputs input data (write data) Din to the write amplifier 16, and outputs output data (read data) Dout from the sense buffer 15 to an external device.

A DC load control circuit 14 generates the driving signal /φ from a related timing signal among timing signals output by a control circuit 18. The driving signal /φ is switched to the low level in the write and read operations. The driving signal /φ is applied to the gates of the P-channel MOS transistors Q7 and Q8. A VCC/2 voltage generator 17 generates VCC/2 from the power supply voltage VCC supplied from the outside of the DRAM device, and applies the voltage VCC/2 to the data bus pair 13. The transistors Q7 and Q8, the DC load control circuit 14, and the VCC/2 voltage generator 17 correspond to the load circuit 4A shown in FIG. 6.

The control circuit 18 receives, from the outside of the DRAM device, a row address strobe signal /RAS, a column address strobe signal /CAS, and a write enable signal /WE, and generates various timing signals (control signals) necessary for the operation of the DRAM. In a case where there are a plurality of selectable bits, an output enable signal /OE is applied to the control circuit 18. A sense amplifier driving signal generating circuit 19 receives a related control signal from the control circuit 18, and generates sense amplifier driving signals (VSS, VCC) for the low and high level sides. The sense amplifier driving signals are applied in common to the sense amplifiers 11.

An address input circuit 20 receives an address signal from the outside of the DRAM device, and outputs a row address signal to a plurality of row decoders 21 (only one row decoder is shown in FIG. 8 for the sake of simplicity), and a column address signal to a plurality of column decoders 22. Each of the column decoders 22 decodes the received column address signal, and generates a select signal applied to the associated column selecting gate 12.

The row decoders 21 shown in FIG. 8 decodes the row address signal from the address input circuit 20, and selects one of a plurality of word liens 25 (only one word line is shown in FIG. 8 for the sake of simplicity) connected to the memory cells 10. A plurality of pairs 24 of bit lines are connected to the memory cells 10, as shown in FIG. 8.

Figure 9:
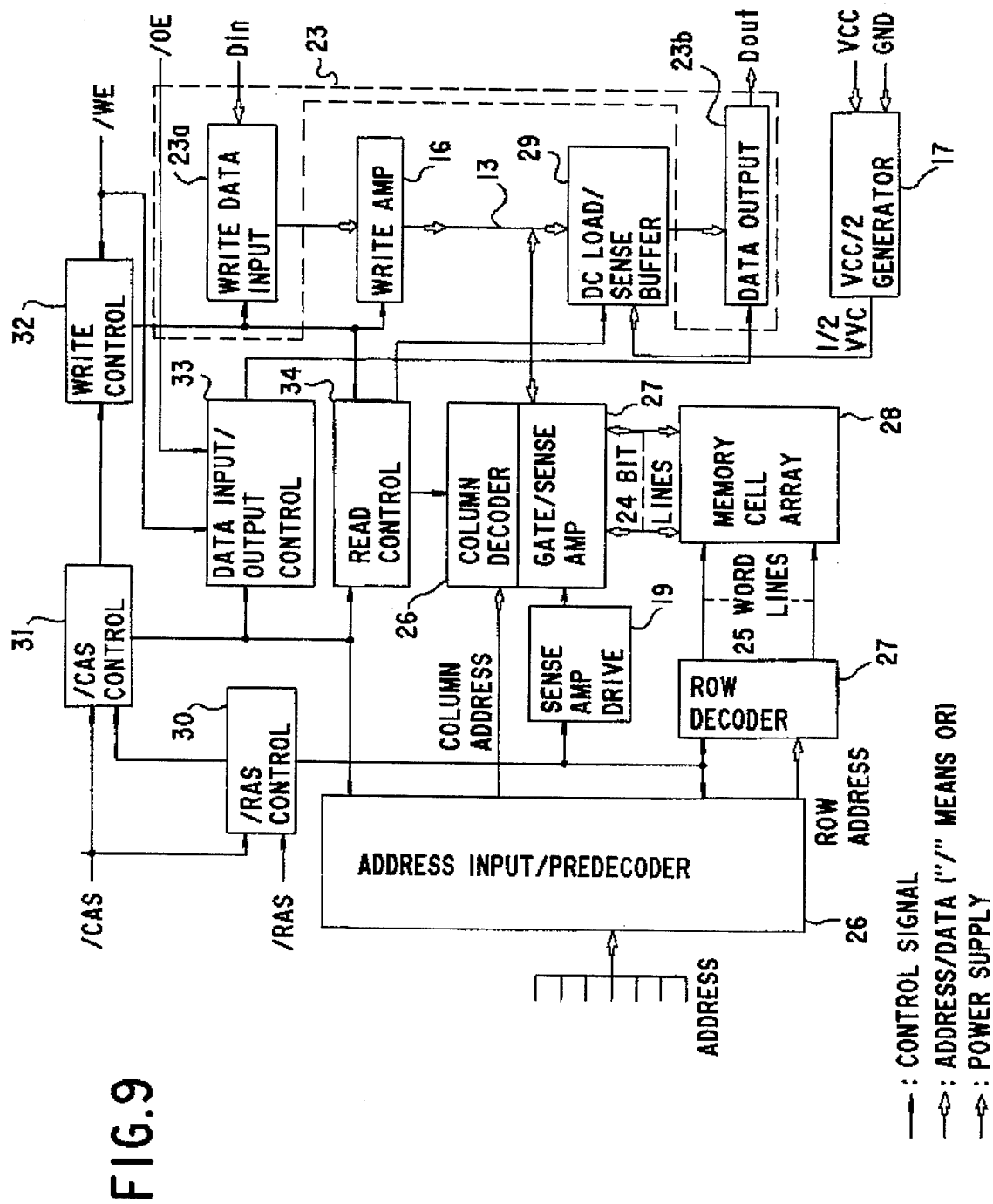
FIG. 9 is a block diagram of the DRAM device shown in FIG. 8 in more detail.

FIG. 9 shows the structure shown in FIG. 8 in more detail. In FIG. 9, parts that are the same as those shown in FIG. 8 are given the same reference numbers. The address signal from the outside of the DRAM device is input to an address input circuit/predecoder 26. A predecoded row address signal is decoded by a row decoder 27, which selectively word liens 25 arranged in a memory cell array 28. A predecoded column address signal is decoded by a column decoder 26, which selectively drives pairs 24 of bit lines arranged in the memory cell array 28 via a column select gate/sense amplifier circuit 27.

The write data Din is written into a selected memory cell in the memory cell array 28 via a write data input circuit 23a, the write amplifier 16, the data bus pair 13, and the column select gate/sense amplifier circuit 27/ Data read from a selected memory cell in the memory cell array 28 is output, as data Dout, to the outside of the DRAM device via the column select gate/sense amplifier circuit 27, the data bus pair 13, a DC load/sense buffer circuit 29, and a data output circuit 23b. The voltage VCC/2 generated by the VCC/2 voltage generator 17 is applied to a DC load/sense amplifier circuit 29. A read operation limit circuit 34 and a DC load/sense buffer circuit 29 correspond to the DC load control circuit 14, the sense buffer 15 and the transistors Q7 and Q8 shown in FIG. 8.

A /RAS (Row Address Strobe) operation control circuit 30, a /CAS (Column Address Strobe) operation control circuit 31, a write operation control circuit 32, a data input/output control circuit 33 and a read operation control circuit 34 shown in FIG. 9 correspond to the control circuit 18 shown in FIG. 8. The /RAS operation control circuit 30 outputs a control signal responsive to the fall of the row address strobe signal /RAS in the write operation and the read operation to the address input circuit/predecoder circuit 26, the row decoder 27 and the sense amplifier driving signal generating circuit 19. The /CAS operation control circuit 31 outputs a control signal responsive to the fall of the column address strobe signal /CAS in the write operation and the read operation to the write operation control circuit 32, the data input/output operation control circuit 33, the read operation control circuit 34 and the address input circuit/ predecoder circuit 26. The write operation control circuit 32 drives the write data input circuit 23a, the write amplifier 16 and the read operation control circuit 34 when the write enable signal /WE falls and then the column address strobe signal /CAS falls.

Figure 10:
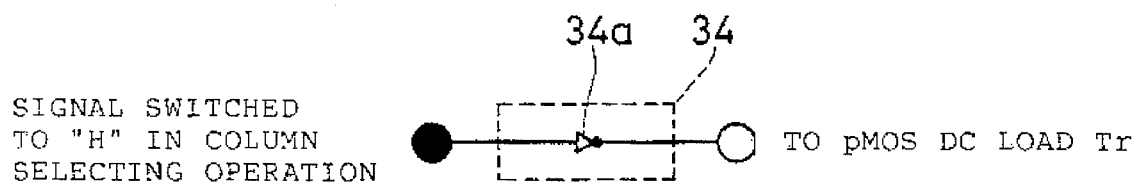
FIG. 10 is a diagram of a configuration of a read operation control circuit shown in FIG. 9.

As shown in FIG. 10, the read operation control circuit 34 includes an inverter 34a. The inverter 34a receives, from the /CAS operation control circuit 31, the control signal which is switched to the high level in the column selecting operation, and outputs, as the driving signal /ϕ, the inverted version of the above control signal to the gates of the P-channel MOS transistors Q7 and Q8 of the DC load/sense buffer circuit 29. That is, the driving signal /ϕ is switched to the low level in the write and read operations. In FIG. 10, dots "." denote input terminals (signals), and dots "o" denote output terminals (signals). This holds true for the following description.

Figure 11:
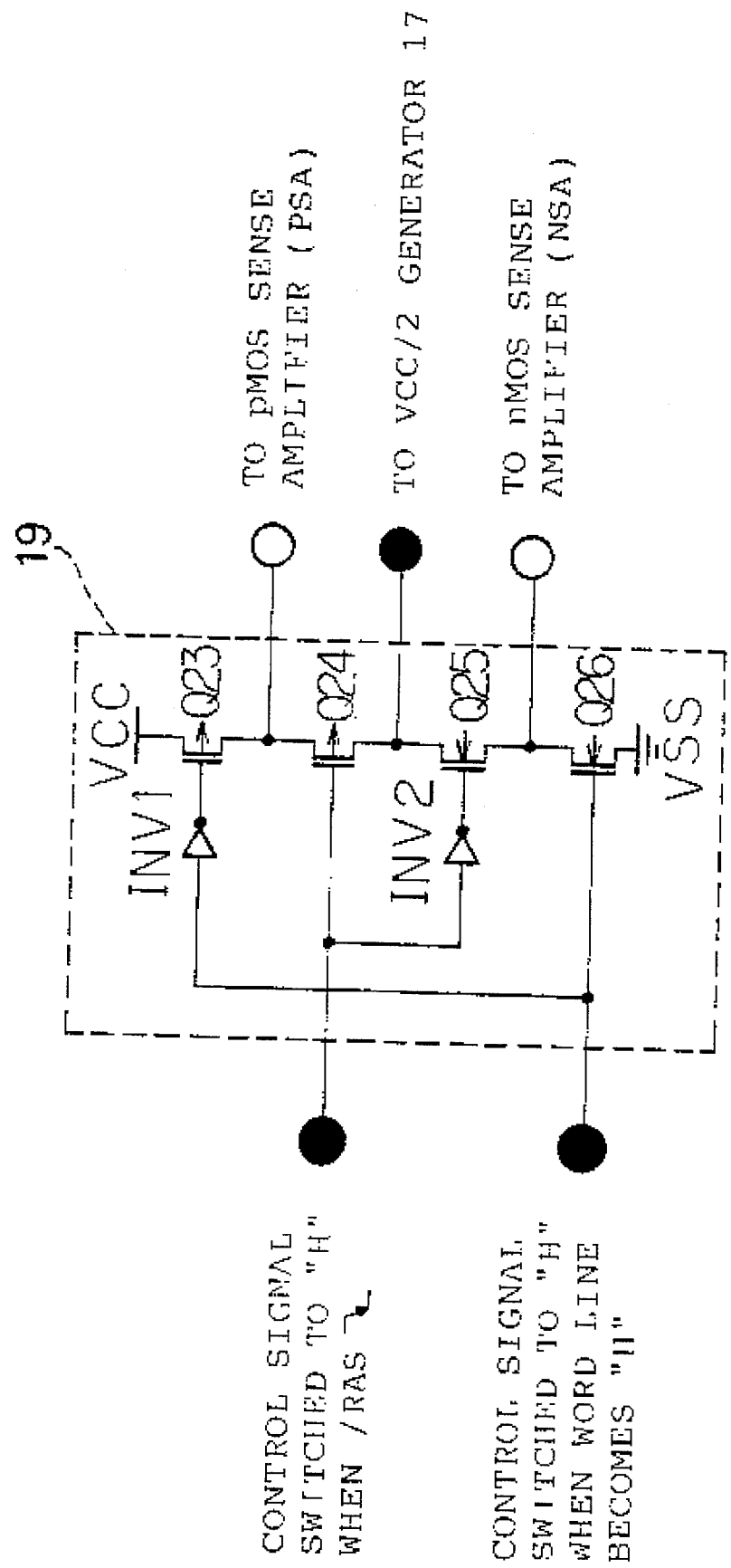
FIG. 11 is a circuit diagram of a configuration of a sense amplifier driving signal generating circuit shown in FIG. 9.

FIG. 11 is a circuit diagram of the sense amplifier driving signal generating circuit 19, which is comprised of two inverters INV1 and INV2, two P-channel MOS transistors Q23 and Q24, and two N-channel MOS transistors Q25 and Q26. A control signal generated by the /RAS operation control circuit 30 and switched to the high level in response to the fall of the row address strobe signal /RAS is applied to the gate of the transistor Q24 and the inverter INV2. A control signal (latch enable signal) switched to the high level in response to the rise of the word line is applied to the gate of the transistor Q26 and the inverter INV1. The voltage VCC/2 generated by the VCC/2 voltage generator 14 is applied to the gates of the transistors Q24 and Q25. Before the read and write operations, the row address strobe signal /RAS is at the high level, and hence the low-level control signal is applied to the transistor Q24 and the inverter INV2. Hence, the voltage VCC/2 (functioning as a signal PSA) is applied to the P-channel MOS transistors Q3 and Q4 (FIG. 6) of the sense amplifier (flip-flop circuit) 1 via the transistor Q24. Further, the voltage VCC/2 (functioning as a signal NSA) is applied to the N-channel MOS transistors Q1 and Q2 of the sense amplifier 1 via the transistor Q25. It will be noted that FIG. 6 shows that the constant power supply voltages VCC and VSS are applied to the sense amplifiers 1 for the sake of simplicity. In the read or write operation, the transistors Q24 and Q25 are turned OFF, and the transistors Q23 and Q26 are turned ON. Hence, the power supply voltage VCC is applied to the transistors Q3 and Q4, and the power supply voltage VSS is applied to the transistors Q1 and Q2.

Figure 12:
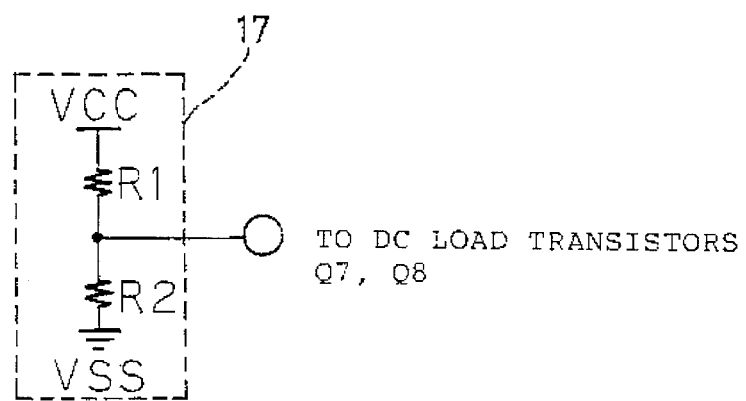
FIG. 12 is a circuit diagram of a configuration of a VCC/2 voltage generator shown in FIG. 9.

FIG. 12 is a diagram of the structure of the VCC/2 voltage generator 14. Resistors R1 and R2 having an identical resistance are connected in series between the power supplies VCC and VSS. The voltage VCC/2 is output via the node at which the resistors R1 and R2 are connected in series. The voltage VCC/2 is applied to the sources (or drains) of the transistors Q7 and Q8 and the sense amplifier driving circuit 19.

Figure 13:
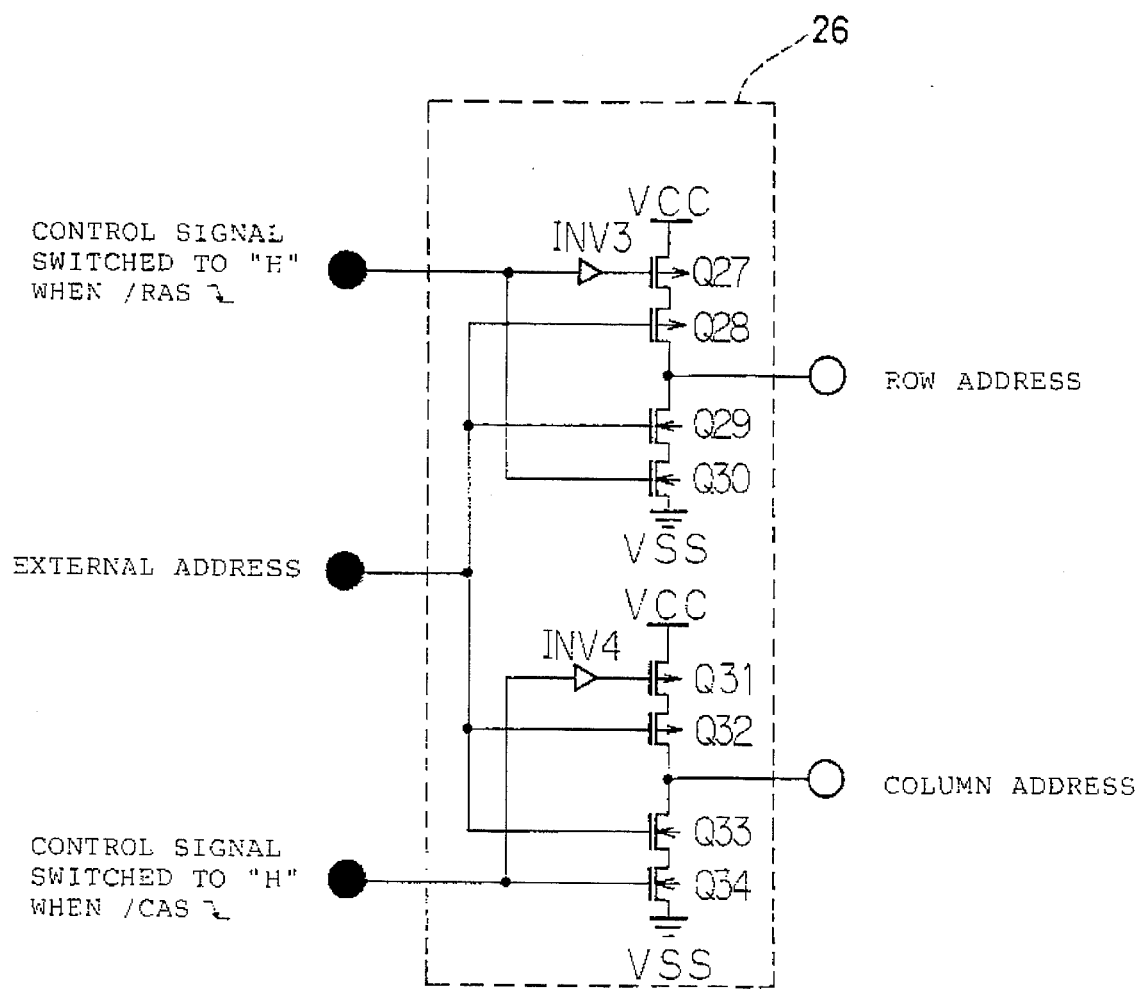
FIG. 13 is a circuit diagram of a configuration of an address input circuit/predecoder circuit shown in FIG. 9.

FIG. 13 is a circuit diagram of the address input circuit/ predecoder circuit 26. As shown in FIG. 13, the circuit 26 is comprises of inverters INV3 and INV4, P-channel MOS transistors Q27, Q28, Q31 and Q32, and N-channel MOS transistors Q29, Q30, Q33 and Q34. The inverter INV3 and the gate of the transistor Q30 receives the control signal generated by the /RAS operation control circuit 30 shown in FIG. 9 and switched to the high level in response to the fall of the row address strobe signal /RAS. The inverter INV4 and the gate of the transistor Q34 receive the control signal generated by the /CAS operation control circuit 31 shown in FIG. 9 and switched to the high level in response to the fall of the column address strobe signal /CAS. The address signal from the outside of the DRAM device is applied to the gates of the transistors Q28, Q29, Q32 and Q33. In the write or read operation, the row address strobe signal falls, and the external address signal is input as a row address signal. Next, the column address strobe signal falls, and the external address is input as a column address signal.

Figure 14:
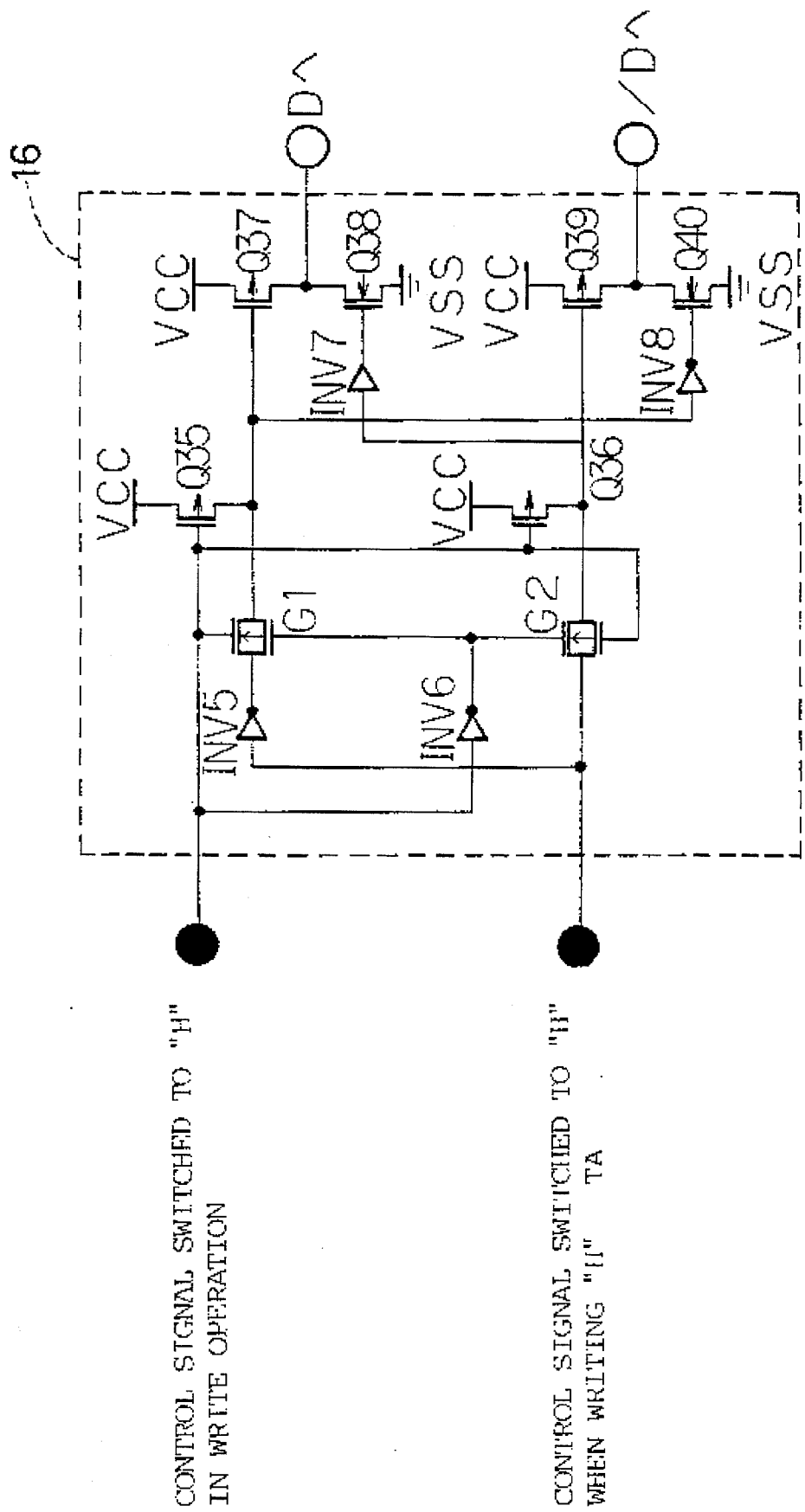
FIG. 14 is a circuit diagram of a configuration of a write amplifier shown in FIGS. 8 and 9.

FIG. 14 is a circuit diagram of the write amplifier 16 shown in FIGS. 8 and 9. As shown in FIG. 14, the write amplifier 16 is comprised of inverters INV5–INV8, P-channel MOS transistors Q35, Q36, Q37 and Q39, N-channel MOS transistors Q38 and Q40, and gates G1 and G2. The write amplifier 16 receives a control signal generated by the write operation control circuit 32 and switched to the high level in the write operation, and a control signal generated by the write data input circuit 23a and switched to the high level when logically high level (H) data is written. In operations other than the write operation, the transistors Q37 through Q40 are all OFF. In the write operation, the gates G1 and G2 are opened, and the data bus lines D and /D are driven by control data related to the write data.

Figure 15:
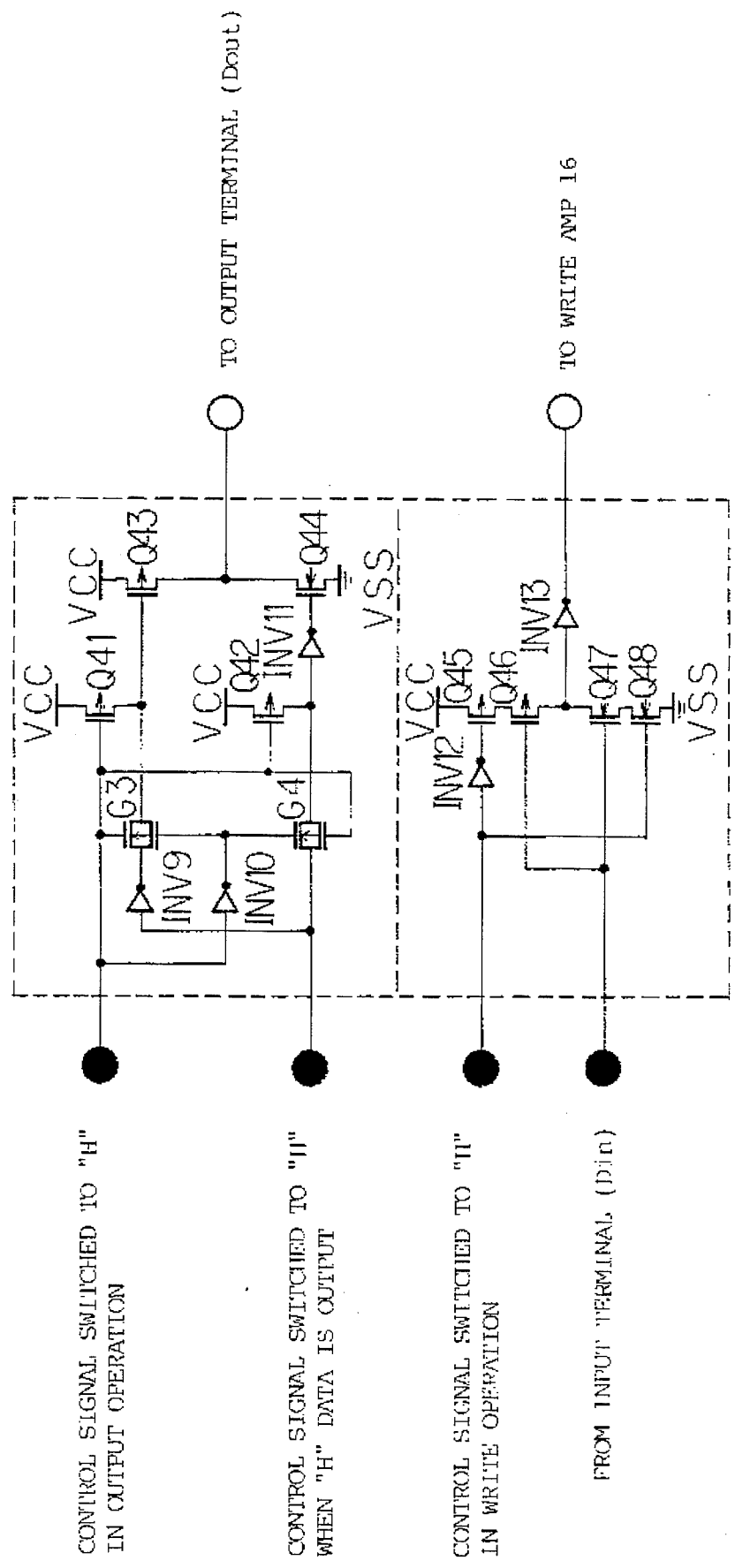
FIG. 15 is a circuit diagram of a configuration of an input/output circuit shown in FIGS. 8 and 9.

FIG. 15 is a circuit diagram of the input/output circuit 23 shown in FIGS. 8 and 9. The data output circuit 23b of the input/output circuit 23 is made up of inverters INV9–INV11, P-channel MOS transistors Q41–Q43,, an N-channel MOS transistor Q44, and gates G3 and G4. The data output circuit 23b receives a control signal switched to the high level in the output operation, and a control signal switched to the high level at the time of outputting high-level data. In the output operation, the transistors Q41 and Q42 are turned OFF, and the gates G3 and G4 are opened. At the time of outputting high-level data, the transistor Q43 is turned ON, and the transistor Q44 is turned OFF. The write data input circuit 23a is made up of inverters INV12 and INV13, P-channel MOS transistors Q45 and Q46, and N-channel MOS transistors Q47 and Q48. The data input circuit 23a receives a control signal switched to the high level in the write operation, and input data from the outside of the DRAM device. In the write operation, the transistors Q46 and Q48 are turned ON, and the transistor Q46 is turned ON with respect to low-level input data. The transistor Q47 is turned ON with respect to high-level input data. The drains of the transistors Q46 and Q47 are connected to the write amplifier 16 via the inverter INV13.

The sense buffer 15 shown in FIG. 8 has the circuit configuration shown in FIG. 4.

Figure 16A:
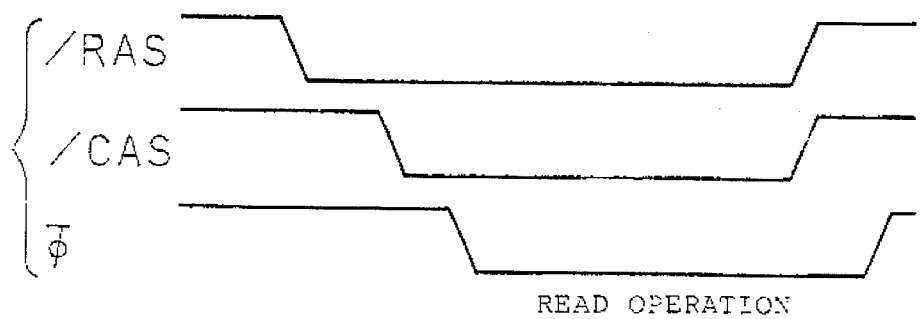
FIGS. 16A and 16B are waveform diagrams of the operation of a conventional DRAM device.
Figure 16B:
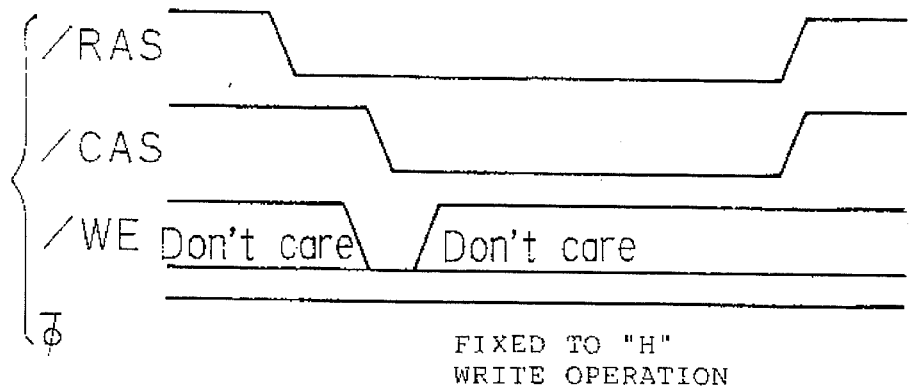

FIGS. 16A and 16B are waveform diagrams of the operation of a DRAM device as shown in FIGS. 8 and 9 with the configuration shown in FIG. 4. In the read operation shown in FIG. 16A, the row address strobe signal /RAS and the column address strobe signal /CAS fall, and thereafter the driving signal /φ to the load circuit 4 (FIG. 1) is switched to the low level. Hence, the power supply voltage VCC is applied to the data lines D and /D. In the write operation shown in FIG. 16B, the row address strobe signal /RAS, the write enable signal /WE and the column address strobe signal /CAS i fall in this order. It will be noted that conventionally, in this write operation, the load circuit 4 is disconnected from the data lines D and /D, and hence the driving signal /φ is fixed to the high level.

Figure 17A:
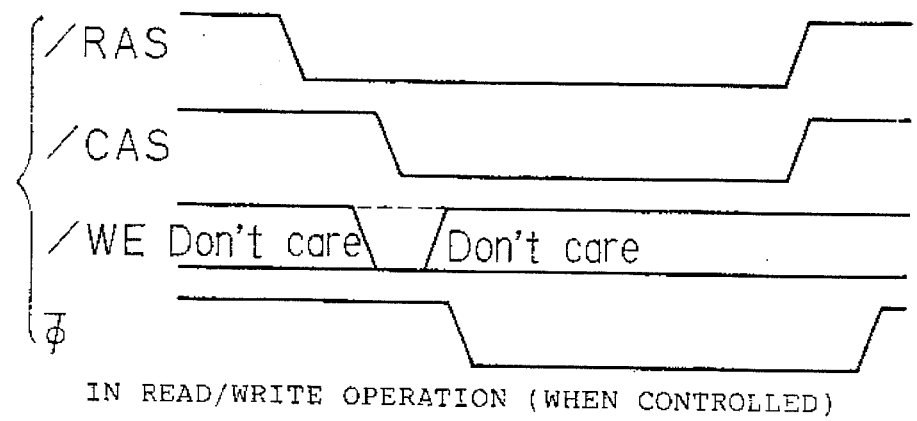
FIGS. 17A and 17B are waveform diagrams of the DRAM device shown in FIGS. 8 and 9.
Figure 17B:
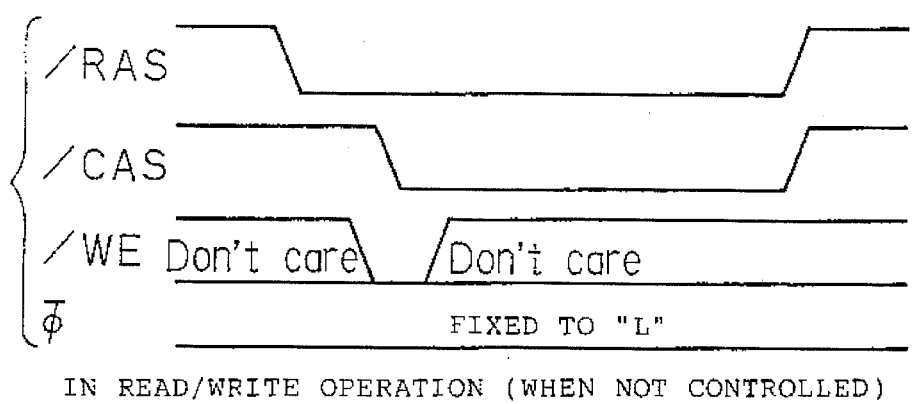

FIGS. 17A and 17B are waveform diagrams of the operation of the DRAM device according to the first embodiment of the present invention. In the read and write operations shown in FIG. 17A, the driving signal /φ is switched to the low level after the column address strobe signal /CAS falls, so that the voltage VCC/2 is applied to the data lines D and /D. As shown in FIG. 17B, the driving signal /φ may be fixed to the low level.

Figure 18:
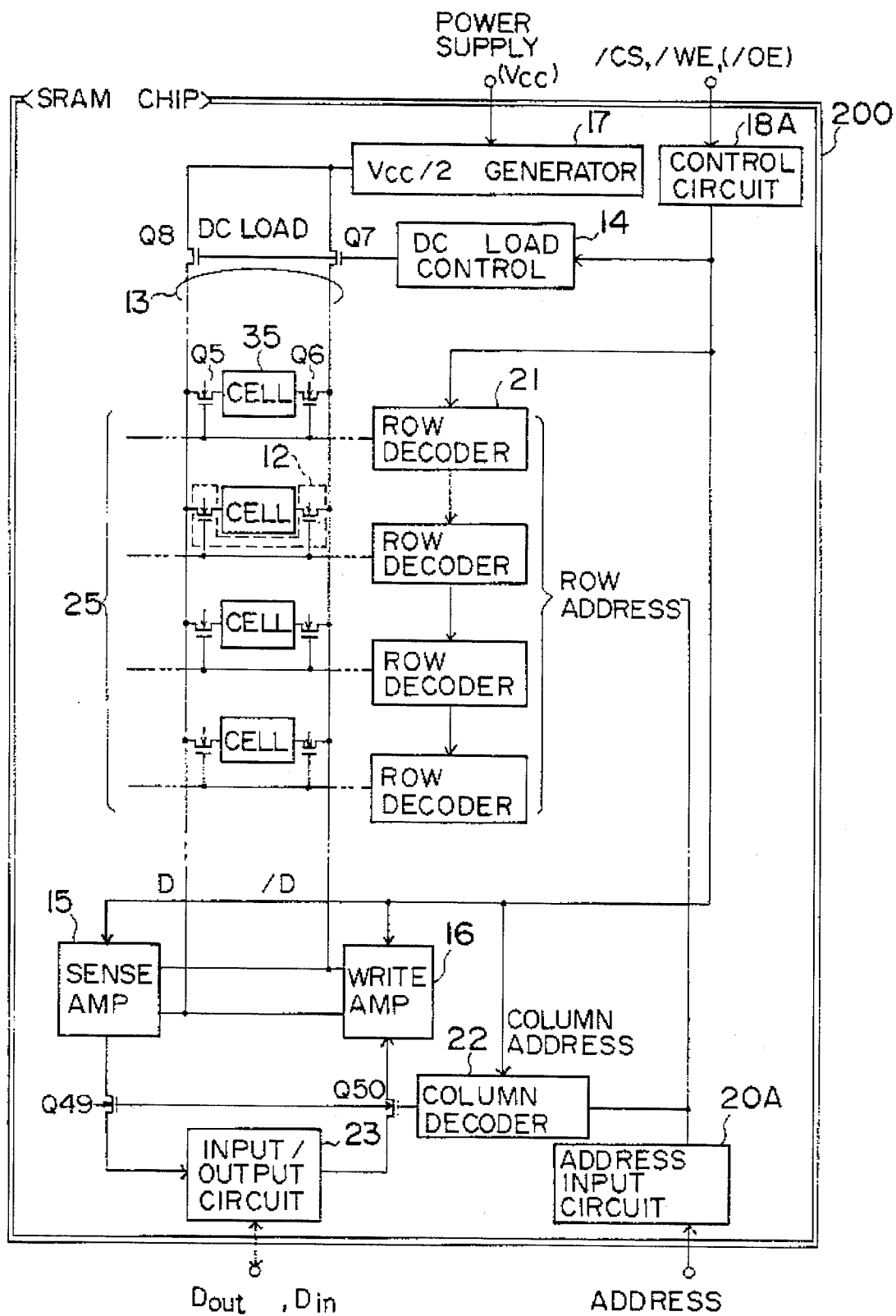
FIG. 18 is a block diagram of an SRAM device to which the first embodiment of the present invention is applied.

FIG. 18 is a diagram of the structure of an SRAM device having the circuit configuration shown in FIG. 6. An SRAM chip 200 includes a plurality of memory cells 35 arranged in rows and columns, transfer gates 12 (which correspond to the column selecting gates in the DRAM device). Each of the transfer gates 12 includes the N-channel MOS transistors Q5 and Q6. The memory cells 35 are connected to a pair of bit lines formed with the data lines D and /D via the transistors Q5 and Q6. The memory cells 35 and the word transfer gates 12 correspond to the flip-flop circuits 1 and the select transistor circuits 2 shown in FIG. 6, respectively. Generally, the data lines D and /D are called data buses in the DRAM devices, and called bit lines in the SRAM devices.

The sense amplifier 15 and the write amplifier 16 are connected to the bit line pair 13. The sense amplifier 15 and the write amplifier 16 correspond to the read circuit 5 and the write circuit 6 shown in FIG. 6, respectively. Generally, circuits called as sense buffers in the DRAM devices are called as sense amplifiers in the SRAM devices. The input/output circuit 23 connected to the sense amplifier 15 and the write amplifier 16 output input data (write data) Din to the write amplifier 16, and output data (read data) Dout from the sense amplifier 15 is output to the outside of the SRAM device. The output signals of the column decoders 22 are applied to the gates of the N-channel MOS transistors Q49 and Q50.

The DC load control circuit 14 generates the driving signal /φ switched from the low level in the read and write operations from the related timing signal among the timing signals (control signals) output by a control circuit 18A. The driving signal /φ is applied to the gates of the P-channel MOS transistors Q7 and Q8. The aforementioned VCC/2 voltage generator 17 generates the voltage VCC/2 from the power supply voltage VCC, and applies the voltage VCC/2 to the data bus pair 13. The transistors Q7 and Q8, the DC load control circuit 14 and the VCC/2 voltage generator 17 correspond to the load circuit 4A shown in FIG. 6.

A control circuit 18A receives, from the outside of the SRAM device, a chip select signal /CS and the write enable signal /WE, and generates timing (control) signals necessary for the SRAM operation. If there are a plurality of selectable bits, the output enable signal /OE is applied to the control circuit 18A.

Figure 19:
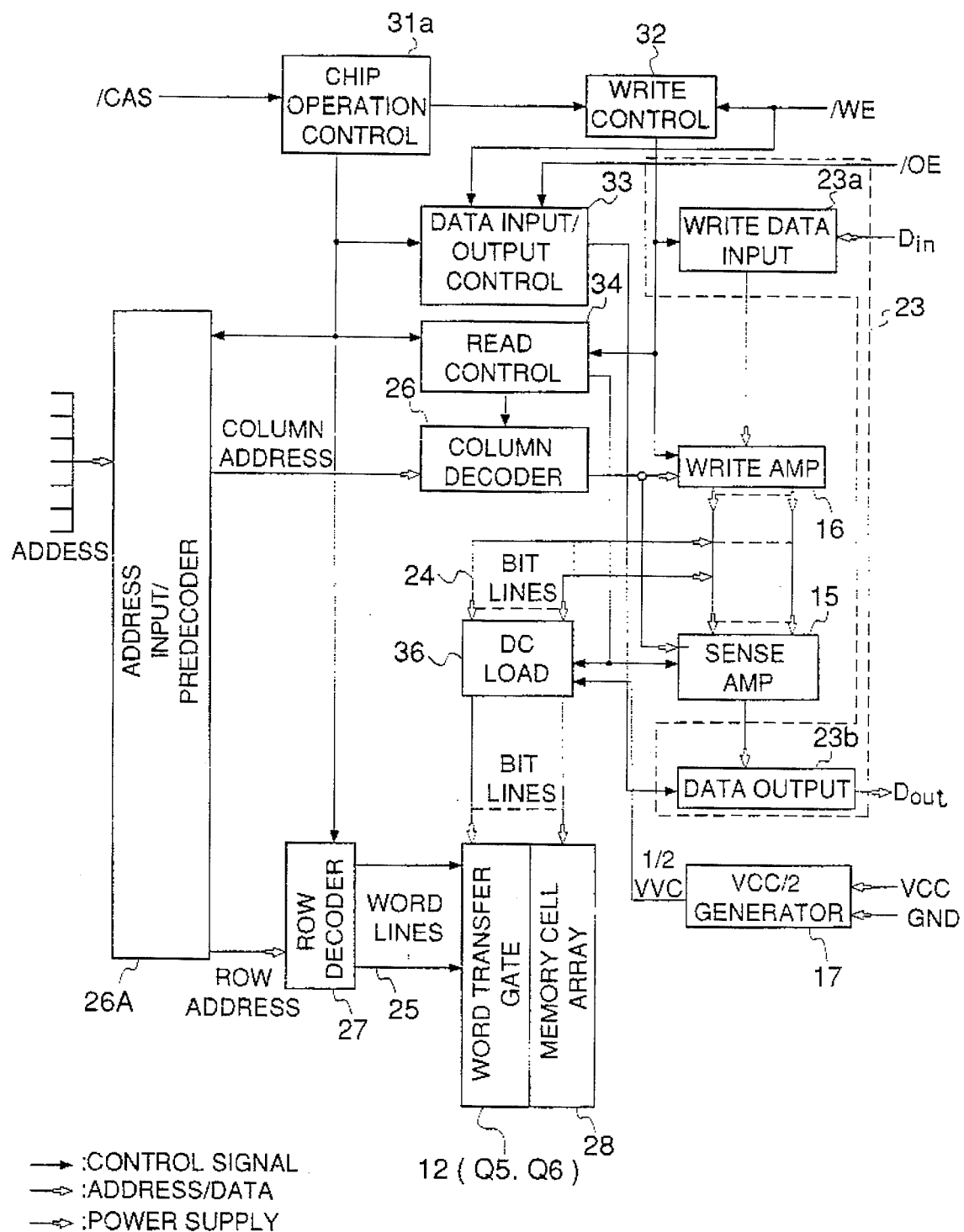
FIG. 19 is a block diagram of the SRAM device shown in FIG. 18 in more detail.

FIG. 19 is a block diagram showing, in more detail, the structure of the SRAM device shown in FIG. 18. In FIG. 19, parts that are the same as those shown in FIG. 18 are given the same reference numbers. The memory cell array 28 having a plurality of memory cells 35 arranged in rows and columns is connected to a plurality of pairs 24 of bit lines via the column selecting gates (especially called word transfer gates in the DRAM devices) 12, each including the transistors Q5 and Q6. A plurality of word lines 25 are connected to the gates of the transistors Q5 and Q6 of the associated word transfer gates 12. The DC load circuits 36, each including the P-channel MOS transistors Q7 and Q8, are provided for the respective pairs 24 of bit lines. The control circuit 18A shown in FIG. 18 includes a chip operation control circuit 31a, which receives the chip select signal /CS and outputs predetermined control signals.

The read operation control circuit 34 outputs a control signal switched to the high level in the write or read operation to the sense amplifier circuit 15. The DC load circuit 36 receives the voltage VCC/2 from the VCC/2 voltage generator 17. The sense amplifier 15 is configured as shown in FIG. 4.

Figure 20:
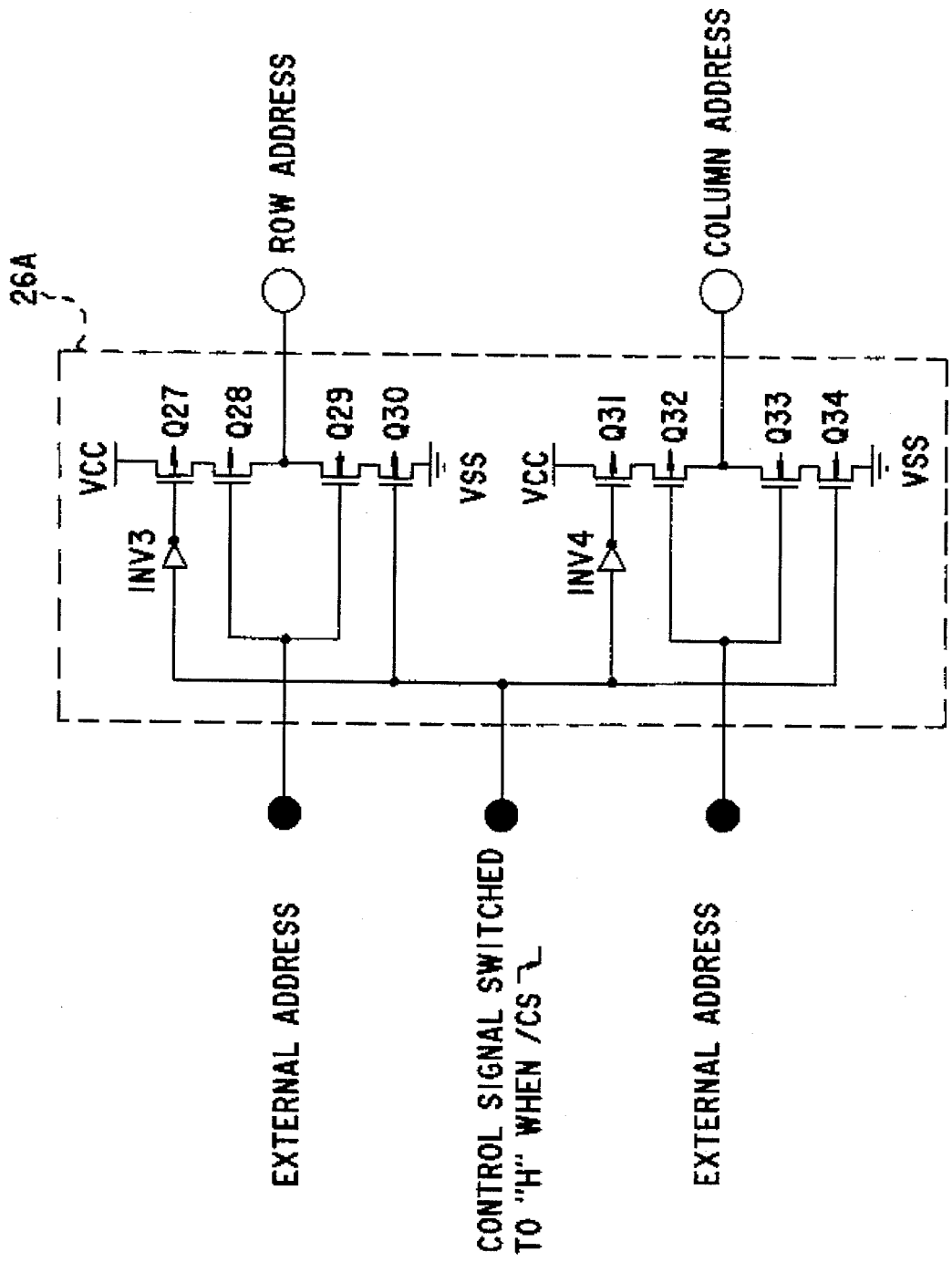
FIG. 20 is a circuit diagram of an address input circuit/ predecoder circuit shown in FIG. 19.

FIG. 20 is a circuit diagram of the address input circuit/predecoder circuit 26A shown in FIG. 19. The address input circuit/predecoder circuit 26A includes the inverters INV3 and INV4, and the MOS transistors Q27 through Q34 in the same manner as the address input circuit/predecoder circuit 26. However, the signals applied to the gates of the MOS transistors Q27–Q34 shown in FIG. 20 differ from those applied to the MOS transistors Q27–Q34 shown in FIG. 13. More particularly, in the case shown in FIG. 20, a control signal generated by the chip operation control circuit 31a and switched to the high level in response to the chip select signal /CS is applied to the gates of the transistors Q30 and Q34, and to the gates of the transistors Q27 and Q31 via the inverters INV3 and INV4. The external address signal is applied to the gates of the transistors Q28, Q29, Q32 and Q33. In the case of SRAM devices, the row address and the column address are received at the same timing. The row address is output via the drains of the transistors Q28 and Q29, and the column address is output via the drains of the transistors Q32 and Q33.

The other parts shown in FIG. 19 are the same as those used in the aforementioned DRAM device, and a detailed description thereof will be omitted. The operation of the SRAM device shown in FIGS. 18 and 19 is almost the same as that of the convention SRAM devices except that the voltage VCC/2 is applied to the pairs 24 of bit lines in the data read and write operation. Hence, a detailed description of the SRAM device according to the first embodiment of the present invention will be omitted.

As described above, according to the first embodiment of the present invention, it becomes possible to greatly reduce the time it takes to reset the data line pairs after the write operation is completed, as compared with the conventional operation in which the amplitude of the data line pairs is limited. Further, the reset potential of the data lines is VCC/2 and hence power consumed when resetting the data line pairs can be reduced. These advantages contribute to speeding up of semiconductor memory devices and reduction in power consumption.

A description will now be given of a second embodiment of the present invention. In the aforementioned first embodiment of the present invention, there is a possibility that the states of the flip-flop circuits 1 shown in FIG. 6 may be inverted in the read operation, as will be described later. The second embodiment of the present invention is intended to eliminate the above possibility, and is configured as shown in FIG. 21.

Figure 21:
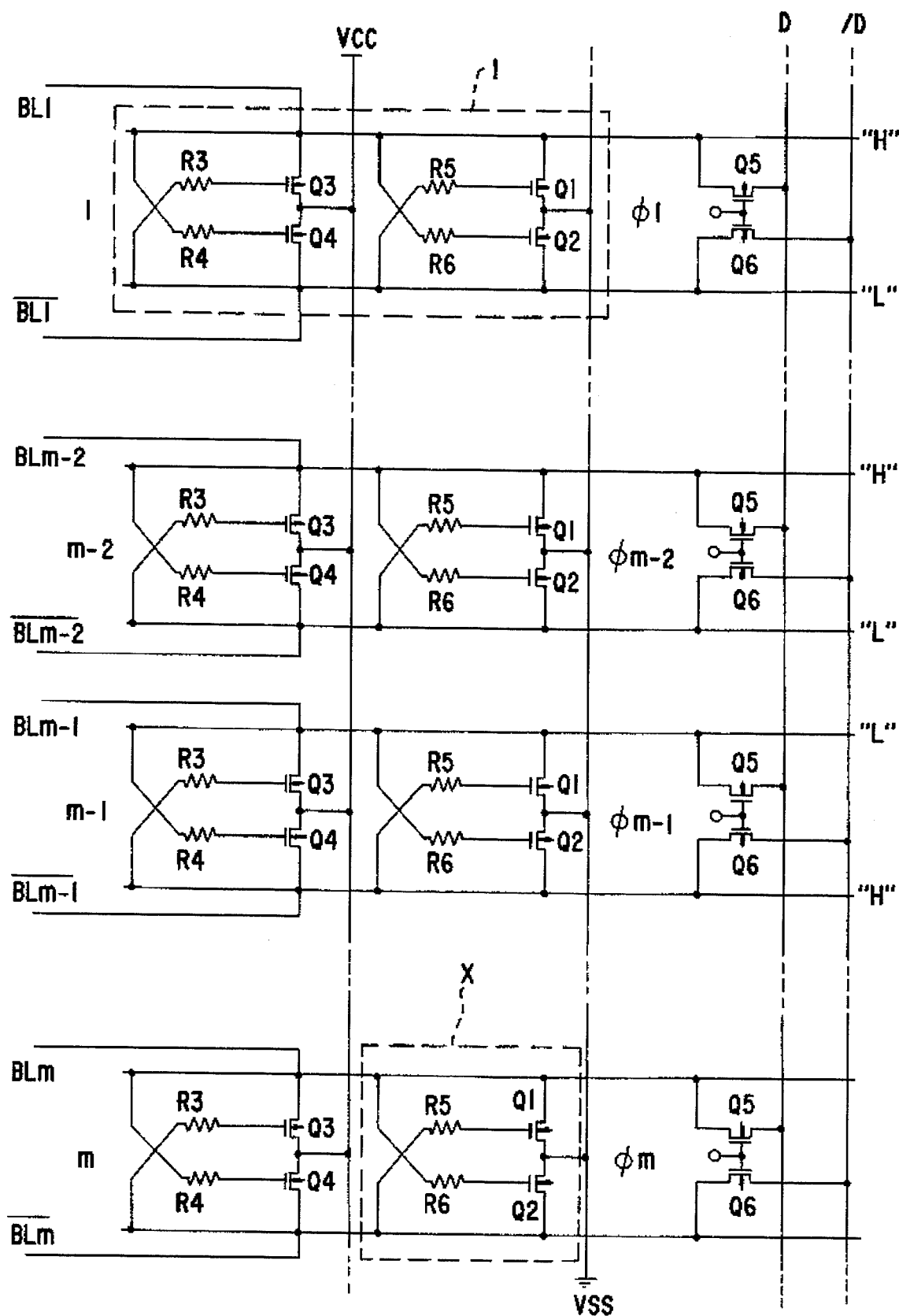
FIG. 21 is a circuit diagram of a second embodiment of the present invention.

FIG. 21 is a circuit diagram of the second embodiment of the present invention. In FIG. 21, parts that are the same as those shown in FIG. 6 are given the same reference numbers. It can be seen, by comparing FIG. 21 with FIG. 6, that the flip-flop circuits 1 shown in FIG. 21 are respectively equipped with four resistors R3, R4, R5 and R6. More particularly, the resistor R3 is connected between the gate of the transistor Q3 and the transistor Q6 connected to the data line /D. The resistor R4 is connected between the gate of the transistor Q4 and the transistor Q5 connected to the data line D. The resistor R5 is connected between the gate of the transistor Q1 and the transistor Q6. The resistor R6 is connected between the gate of the transistor Q2 and the transistor Q5.

Figure 22:
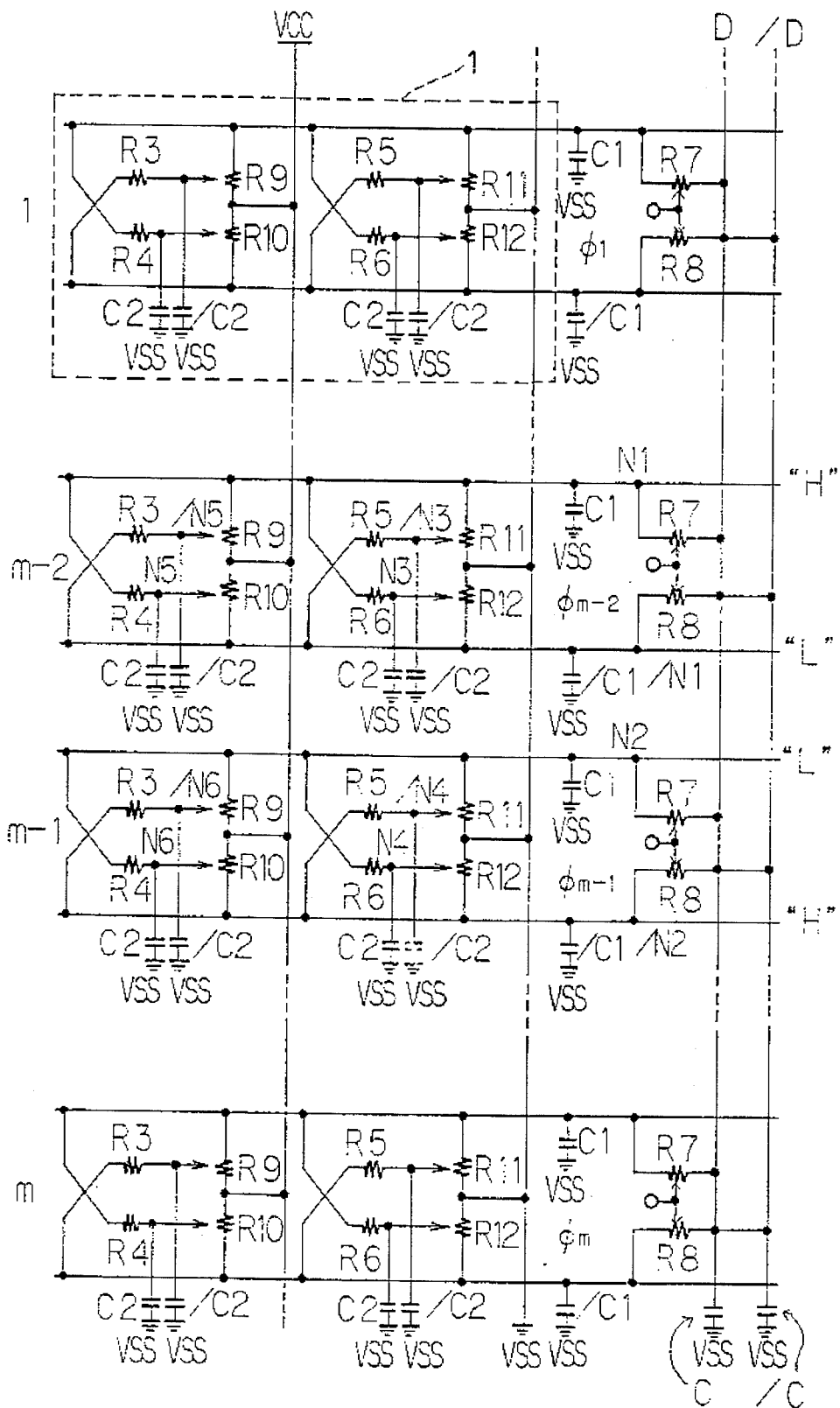
FIG. 22 is an equivalent circuit diagram of the circuit shown in FIG. 21 in the read operation.

FIG. 22 is an equivalent circuit of the semiconductor memory device shown in FIG. 21 related to the read operation. In FIG. 22, resistors R7 and R8 denote the internal resistances of the transistors Q5 and Q6, respectively. Resistors R9 and R10 denote the internal resistances of the transistors Q3 and Q4, respectively. Further, resistors R11 and R12 denote the internal resistances of the transistors Q1 and Q2, respectively. Furthermore, the voltage VCC/2 is applied to the data lines D and /D in the read and write operations in the same manner as the first embodiment of the present invention.

It will now be assumed that the (m–2)th flip-flop circuit 1 holds nigh-level data on the data line D side, and the (m–1)th flip-flop circuit 1 holds high-level data on the data line /D side, as shown in FIG. 22.

Figure 23:
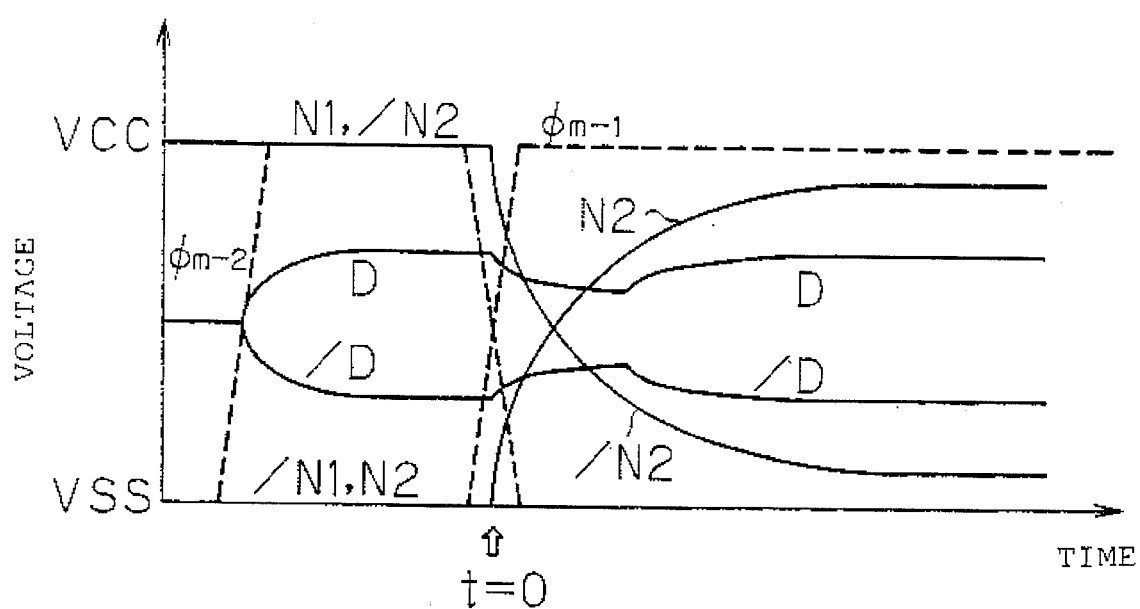
FIG. 23 is a waveform diagram of an operation in which the state of a flip-flop circuit is inverted.

FIG. 23 is a waveform diagram of a case where the state of a flip-flop circuit 1 is inverted in the read operation. It will be assumed that the (m–2)th flip-flop circuit 1 is selected in response to the related select signal φm–2 at time t<0. At this time, the data lines D and /D have been precharged to VCC/2. In response to the select signal φm–2, high-level data starts to appear on the data line D, and low-level data starts to appear on the data line /D. At time t=0, due to a cause (noise, for example), the select signal φm–2 falls and the select signal φm–1 rises whereby the (m–1)th flip-flop circuit 1 is selected. A charge stored in a parasitic capacitance C coupled to the data line D starts to flow, via the select transistor R7 (Q5) of the (m–1)th flip-flop circuit 1, to a parasitic capacitance C1 coupled to the node N2 of the (m–1)th flip-flop circuit 1 and parasitic capacitances C2 respectively connected to nodes N4 and N6 thereof (discharge). Along with the above discharging, a parasitic capacitance /C coupled to the data line /D is charged via the select transistor R8 (Q6) of the (m–1)th flip-flop circuit 1 by charges stored in a parasitic capacitance /C1 coupled to the node /N2 of the (m–1)th flip-flop circuit 1 and parasitic capacitances /C2 respectively coupled to input nodes /N4 and /N6.

Within the (m–1)th circuit, discharging of the parasitic capacitances C1 and C2 via the resistor R11 to the ground (VSS) is carried out at the same time as charging of the parasitic capacitances /C1 and /C2 from the power supply VCC via the resistor R10. Hence, the mutual function of the above discharging and charging determines whether or not the state of the (m–1)th flip-flop circuit 1 is inverted.

The parasitic capacitances C and /C coupled to the data lines D and /D are relatively large, and therefore function as power sources until most of the charges stored therein disappear. In this case, if the resistors R3, R4, R5 and R6 are substantially zero or very small, the potential of the node N2 is almost the same as the potentials of the nodes N4 and N6, and similarly the potential of the node /N2 is almost the same as the potentials of the nodes /N4 and /N6. Hence, the ratio of the resistor R7 to that of the resistor R11 and the ratio of the resistor R8 to that of the resistor R10 may invert the state of the flip-flop circuit 1.

In FIG. 23, at time t=0, the potential of the node N2 increases near to VCC, and the potential of the node /N2 decreases near to VSS. The potentials of the nodes N4 and N6 are almost equal to the potential of the node N2, and the potentials of the nodes /N4 and /N6 are almost equal to the potential of the node /N2. Hence, the state of the (m–1)th flip-flop circuit 1 is inverted, and the data is read from the (m–1)th flip-flop circuit 1 nevertheless the logical states of the data lines D and /D do not change.

When the resistors R3, R4, R5 and R6 are relatively large, charging and discharging by means of the parasitic capacitances C2 and /C2 with respect to the potential depending on the ratio of the resistance of the resistor R7 to that of the resistor R11 and the ratio of the resistance of the resistor R8 to that of the resistor R10, is limited. Hence, it becomes possible to suppress variations in the potentials of the nodes N4, /N4, N5 and /N5. As a result, it becomes difficult for the states of the flip-flop circuits 1 to be inverted.

According to the second embodiment of the present invention, the resistors R3–R6 are intentionally provided in the flip-flop circuits 1 in order to limit the flow of charges in the current paths having these resistors, so that the influence by large variations in the potentials of the nodes N2 and /N2 can be reduced.

Figure 24A:
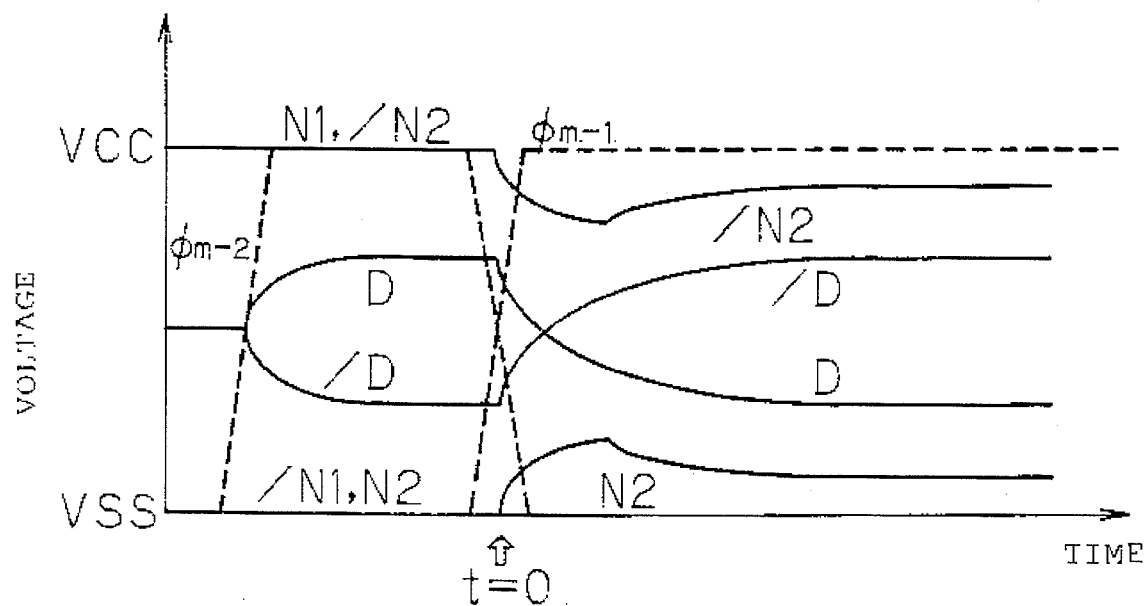
FIGS. 24A and 24B are waveform diagrams of the operation of the circuit shown in FIG. 21.

FIG. 24A is a waveform diagram of the operation of the second embodiment of the present invention. Data is read from the (m–2)th flip-flop circuit 1 in response to the select signal φm–2. Then, the select signal φm–2 falls, and the select signal φm–1 rises so that the (m–1)th flip-flop circuit 1 is selected. The potential of the node N2 starts to increase at time t=0, while the potentials of the nodes N4 and N6 little vary due to the functions of the resistors R6 and R4. Then, the charges stored in the parasitic capacitances C1 and C2 flow in the resistor R11, and the potential of the node N2 starts to decrease. The potential of the node /N2 temporarily decreases. However, due to the function of the resistors R5 and R3, the parasitic capacitances /C1 and /C2 are charged. Hence, the potential of the node /N2 starts to increase. As a result, the state of the (m–1)th flip-flop circuit 1 is not inverted.

Figure 24B:
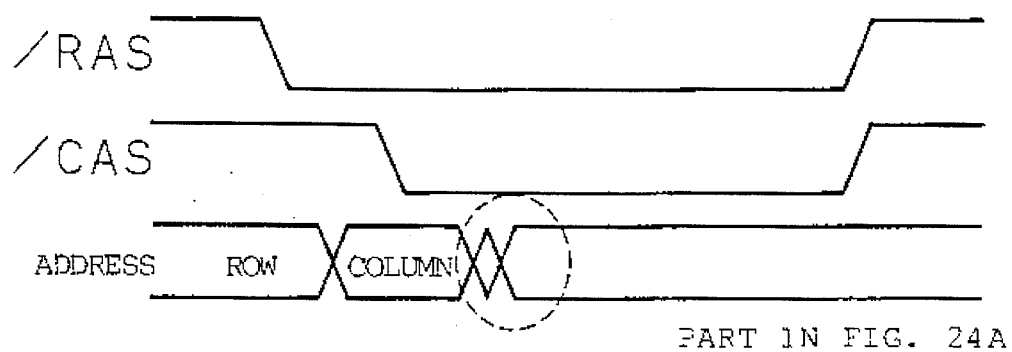

FIG. 24B shows the read operation of a DRAM device to which the second embodiment of the present invention is applied. The operation shown in FIG. 24A corresponds to a part surrounded by the broken line shown in FIG. 24B.

Figure 25:
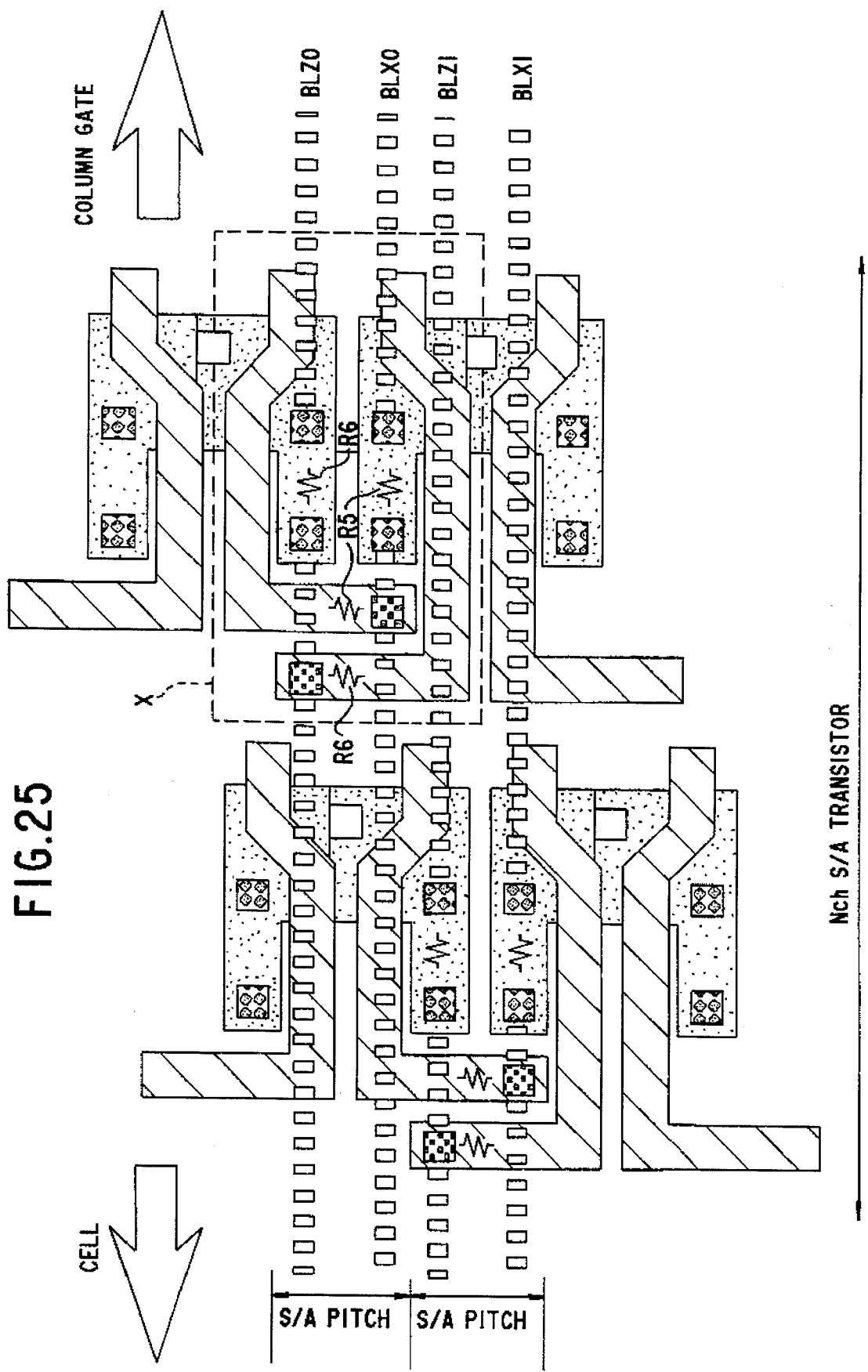
FIG. 25 is a plan view of a layout pattern of an N-channel MOS transistors within a part X shown in FIG. 21.

FIG. 25 shows an integrated circuit layout pattern for realizing part X (including the N-channel MOS transistors Q1 and Q2) shown in FIG. 21. As shown in FIG. 25, the resistors R5 and R6 can be realized by diffusion resistors. The resistance values of these resistors depend on the widths and lengths of the diffusion resistors. A line BLZ0 and a line BLX0 are connected to the data lines D and /D via the select transistors Q5 and Q6, respectively. The resistors R5 and R6 may be formed with wiring line resistors made of polysilicon or the like.

The above-mentioned second embodiment of the present invention can be applied to DRAM and SRAM devices as in the case of the first embodiment thereof. The structure of the DRAM or SRAM device according to the second embodiment of the present invention is the same as that of the DRAM or SRAM device according to the first embodiment thereof, and a description thereof will be omitted.

A description will now be given of a third embodiment of the present invention.

The third embodiment of the present invention is intended to eliminate the possibility that the state of the flip-flop circuit 1 may be inverted when data is read therefrom as in the case of the second embodiment thereof. According to the third embodiment of the present invention, instead of the resistors R3 through R6, the gate voltages of the select transistors Q5 and Q6 used in the read operation are made to differ from those used in the write operation.

Figure 26:
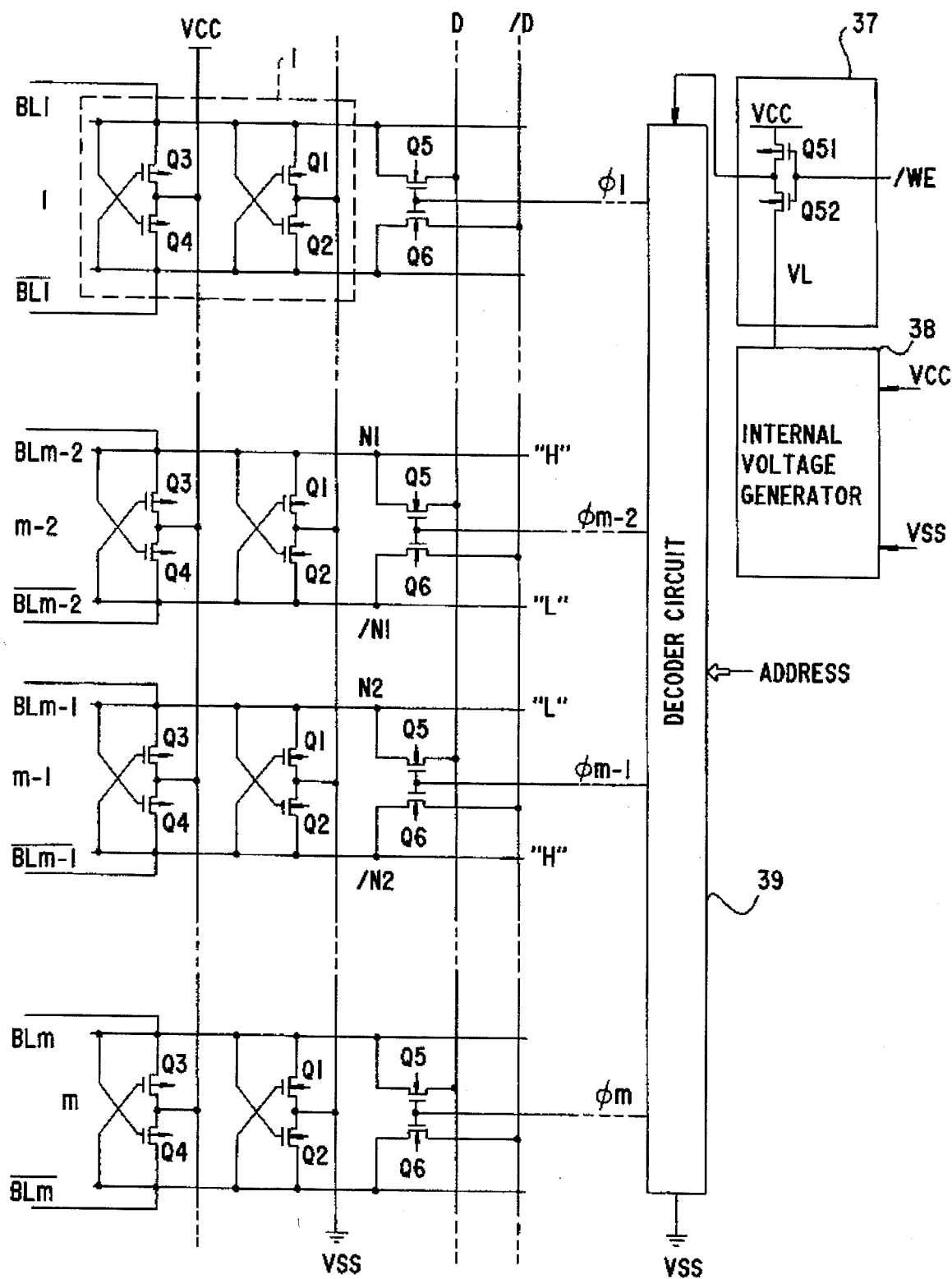
FIG. 26 is a circuit diagram of a third embodiment of the present invention.

FIG. 26 is a circuit diagram of the third embodiment of the present invention. In FIG. 26, parts that are the same as those shown in the previously described figures are given the same reference numerals as previously. It will be noted that the resistors R3–R6 shown in FIG. 18 are not connected to the gates of the transistors Q1–Q4 in each of the memory cells 1.

In the third embodiment of the present invention, a voltage switch 37 and an internal voltage generator 38 are added to the circuit configuration shown in FIG. 6. The internal voltage generator 38 generates an internal voltage VL (VSS<VL<VCC) from the power supply voltages VCC and VSS. The voltage switch 37 outputs either the power supply voltage VCC or the internal voltage VL in accordance with the level of the write enable signal /WE to a decoder circuit 39 (which corresponds to the column decoder in the DRAM device and the row decoder in the SRAM device). More particularly, the voltage switch 37 includes a P-channel MOS transistor Q51 and an N-channel MOS transistor Q51 and an N-channel MOS transistor Q52. The write enable signal /WE is applied in common to the gates of the transistors Q51 and Q52. In the write operation, that is, when the write enable signal is at the low level, the power supply voltage VCC is applied to the decoder circuit 39. In the read operation, that is, when the write enable signal /WE is at the high level, the internal voltage VL is applied to the decoder 39.

Figure 27:
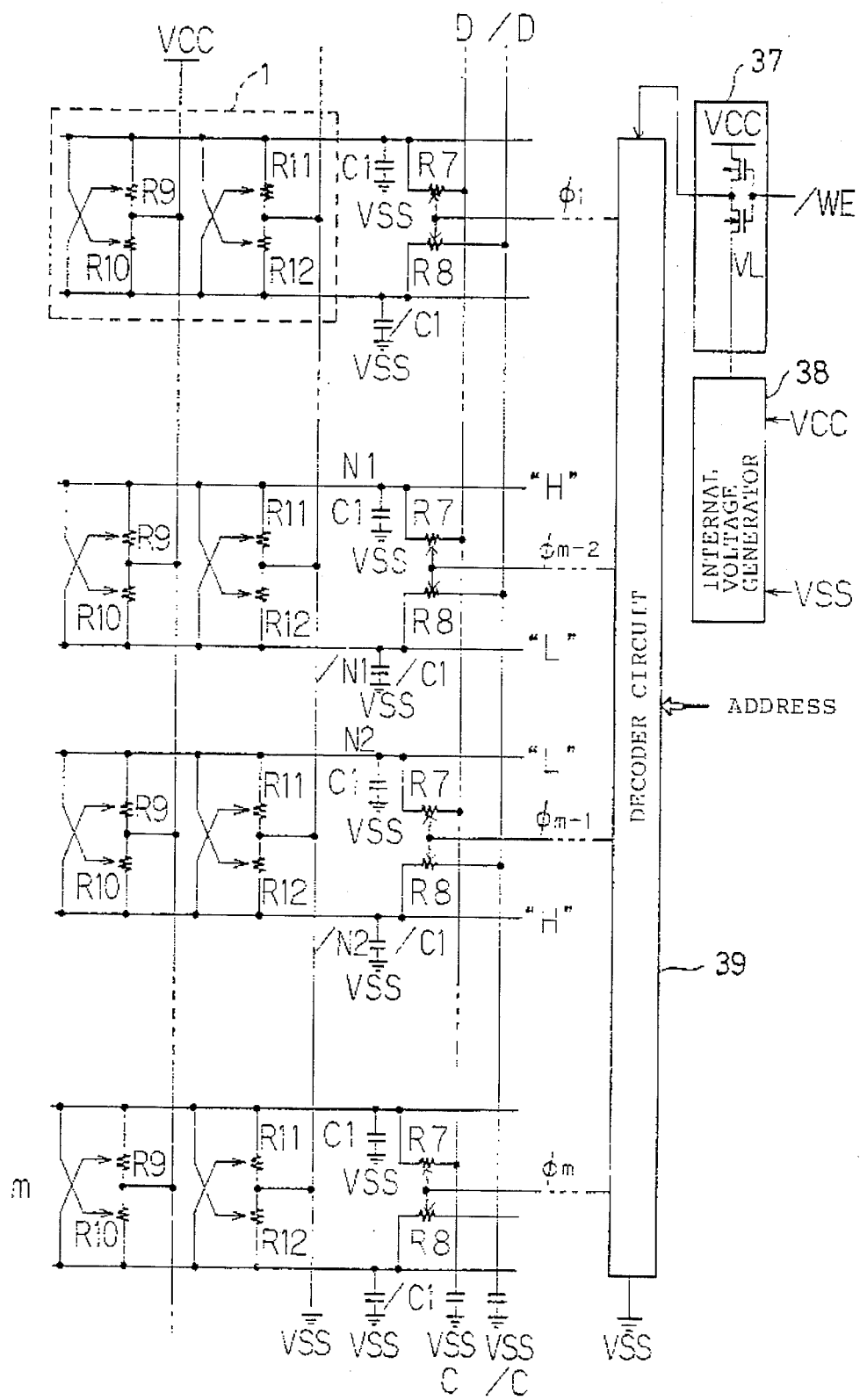
FIG. 27 is an equivalent circuit diagram of the circuit shown in FIG. 26 in the read operation.

FIG. 27 is an equivalent circuit of the circuit shown in FIG. 26 in the read operation. It will now be assumed that data is read from the (m–2)th flip-flop circuit 1 storing high-level data on the data line D side and that the select signal φm–2 falls and the select signal φm–1 rises. The (m–1)th flip-flop circuit 1 holds low-level data on the data line D side. In this case, a charge stored in the parasitic capacitance C coupled to the data line D charges the parasitic capacitance C1 via the select transistor Q5 (R7) of the (m–1)th circuit. Further, a charge stored in the parasitic capacitance /C of the (m–1)th circuit charges the parasitic capacitance /C coupled to the data line /D via the select transistor Q6 (R8). Simultaneously, the function of charging the parasitic capacitance C1 via the resistor R11 in the (m–1)th circuit and the function of charging the parasitic capacitance /C1 via the resistor R10 are activated. The mutual function of the above charging and discharging determines whether or not the state of the (m–1)th flip-flop circuit 1 is inverted.

As has been described, the parasitic capacitances C and /C are relatively large, and therefore function as power sources until most of the charges stored therein disappear. In this case, if the resistances R7 and R8 are relatively small, charging from the parasitic capacitance C to C1 via the resistor R7 and discharging from the parasitic capacitance /C to /C1 via the resistor R8 become stronger than charging from the power supply VCC to the parasitic capacitance /C via the resistor R10 and discharging of the parasitic capacitance C1 to the ground via the resistor R11. Hence, the charges (information) stored in the parasitic capacitances C1 and /C1 become equal to the charges (information) stored in the parasitic capacitances C and /C. This corresponds to a change in the stored information, and generates a read error when the next read operation on the (m–1)th flip-flop circuit 1 is performed.

With the above in mind, the voltage switch 37 selects the internal voltage VL which is enough large to perform the read operation and which sufficiently increases the internal resistances Q5 and Q6 of the select transistors Q5 and Q6. Hence, the charging and discharging via the resistors R7 and R8 can be suppressed.

In the write operation, it is desired that information stored in the (m–1)th flip-flop circuit 1 (charges stored in the parasitic capacitances C1 and /C1) are easily influenced by information of the data lines D and /D (charges stored in the parasitic capacitances C and /C). Hence, it is necessary to facilitate charging from the parasitic capacitance C to C1 and discharging from the parasitic capacitance /C1 to C. Hence, in the write operation, the voltage switch 37 selects the power supply voltage VCC, whereby the gate voltages of the select transistors Q5 and Q6 are increased to the power supply voltage VCC.

Figure 28:
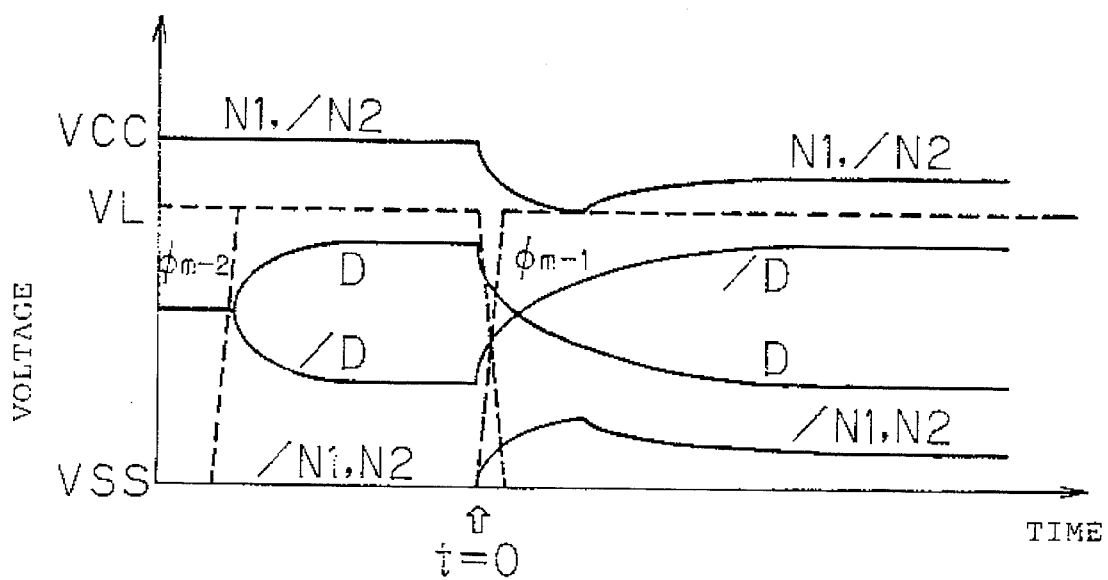
FIG. 28 is a waveform diagram of the read operation of the circuit shown in FIG. 27.

FIG. 28 is a waveform diagram of the read operation of the circuit shown in FIG. 27. In the read operation, the select signal applied to the select transistors Q5 and Q6 are equal to the internal voltage VL lower than the power supply voltage VCC. Hence, the internal resistances R7 and R8 of the select transistors Q5 and Q6 are increased and charging and discharging performed via these transistors are suppressed. Hence, the state of the (m–1)th flip-flop circuit 1 cannot be inverted.

Figure 29:
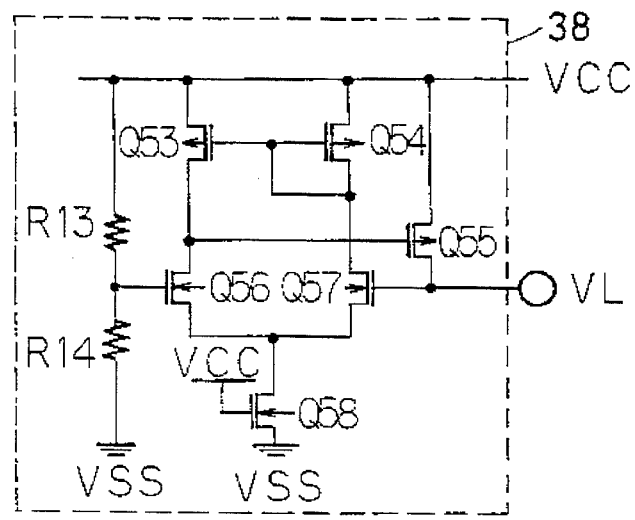
FIG. 29 is a circuit diagram of an internal voltage generator shown in FIGS. 26 and 27.

FIG. 29 is a circuit diagram of the internal voltage generator 38. As shown in FIG. 29, the internal voltage generator 38 is comprised of P-channel MOS transistors Q53, Q54 and Q55, N-channel MOS transistors Q56, Q57 and Q58, and two resistors R13 and R14. A voltage divided by the resistors R13 and E14 is applied to the gate of the transistor Q56. The constant internal voltage VL is output via the drain of the transistor Q55.

If the internal voltage VL is decreased, current flowing in the transistors Q54 and Q57 is decreased, and the drain potential of the transistor Q54 is increased. The drain of the transistor Q54 is connected to the gates of the transistors Q53 and Q54 (so as to form a current-mirror circuit), and hence the current flowing in the transistor Q53 is decreased in accordance with increase in the drain potential of the transistor Q54. Hence, the drain potential of the transistor Q56 is decreased. The decrease in the drain voltage of the transistor Q56 decreases the gate potential of the transistor Q55 and increases the drain potential of the transistor Q55. That is, the decrease in the internal voltage VL can be suppressed.

Figure 30:
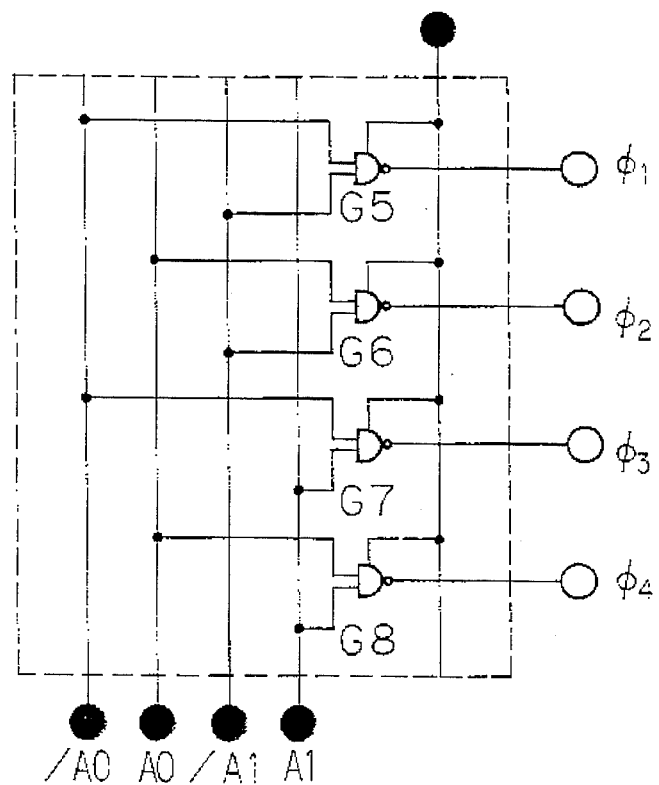
FIG. 30 is a circuit diagram of a decoder circuit shown in FIGS. 26 and 27.

FIG. 30 is a circuit diagram of the decoder circuit 39 shown in FIGS. 26 and 27. The decoder circuit 39 corresponds to the column decoder (FIG. 8) in the DRAM device and the row decoder 21 (FIG. 18) in the SRAM device. In FIG. 30, the address signal (the predecoded address signal) consists of four bits /A0, A0, /A1 and A1 for the sake of simplicity. NOR gates G5 through G8 are connected to address bit lines to which the address bits /A0, A0, /A1 and A1 are applied. These NOR gates G5 through G8 are supplied, as power supply voltage, with either the internal voltage VL generated by the internal voltage generator 38 shown in FIG. 29 or the power supply voltage VCC via the voltage switch 37.

Figure 31:
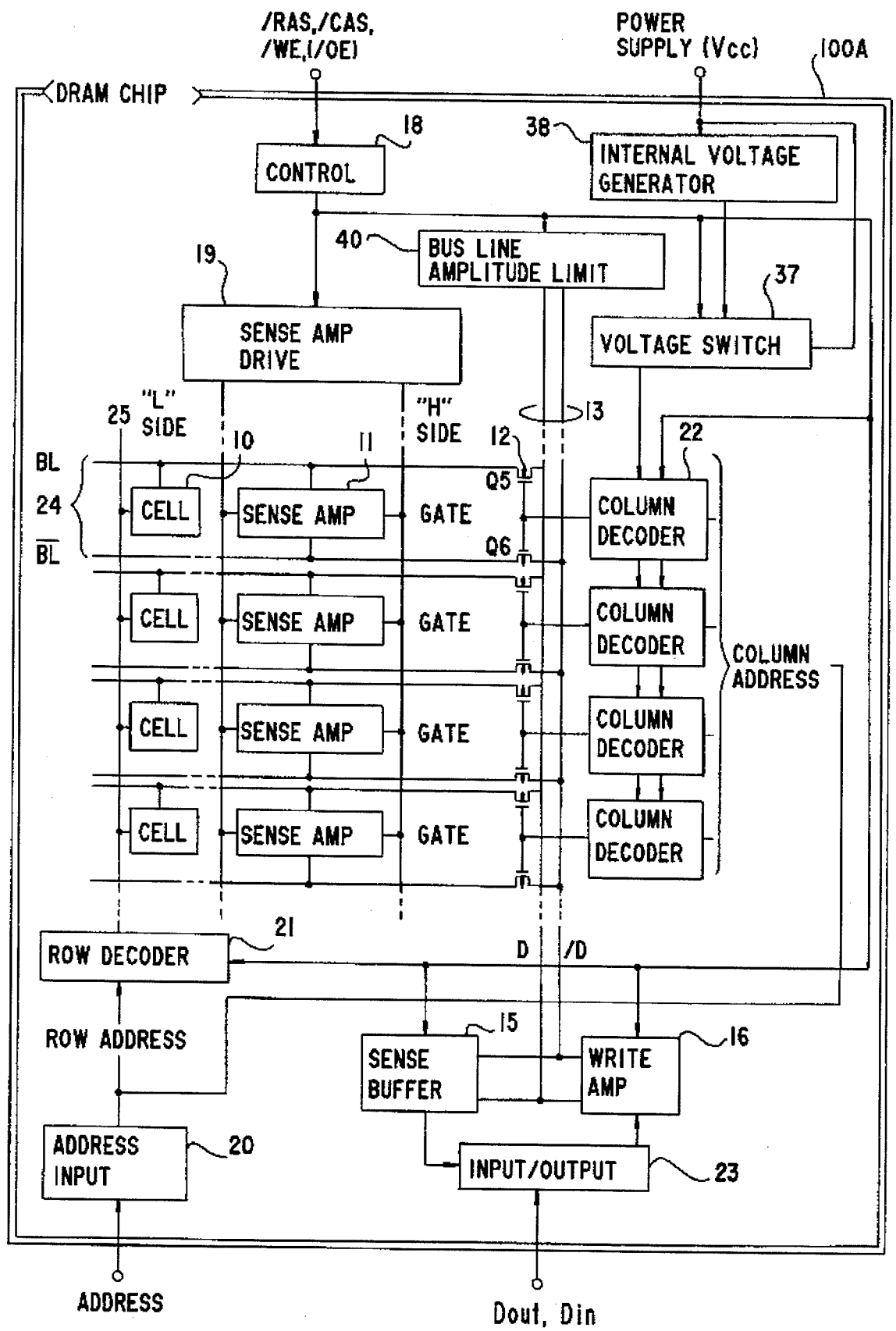
FIG. 31 is a block diagram of a DRAM device to which the third embodiment of the present invention is applied.

FIG. 31 shows the structure of a DRAM 100A according to the third embodiment of the present invention. In FIG. 31, parts that are the same as those shown in the previously described figures are given the same reference numbers as previously. A bus line amplitude limit circuit 40 includes the VCC/2 voltage generator 17, the DC load control circuit 14 and the transistors Q7 and Q8. In the read operation, the voltage switch circuit 37 outputs VL to the column decoders 22 in accordance with the level of the write enable signal /WE applied via the control circuit 18. In the write operation, the voltage switch circuit 37 applies the power supply voltage VCC to the column decoders 22.

Figure 32:
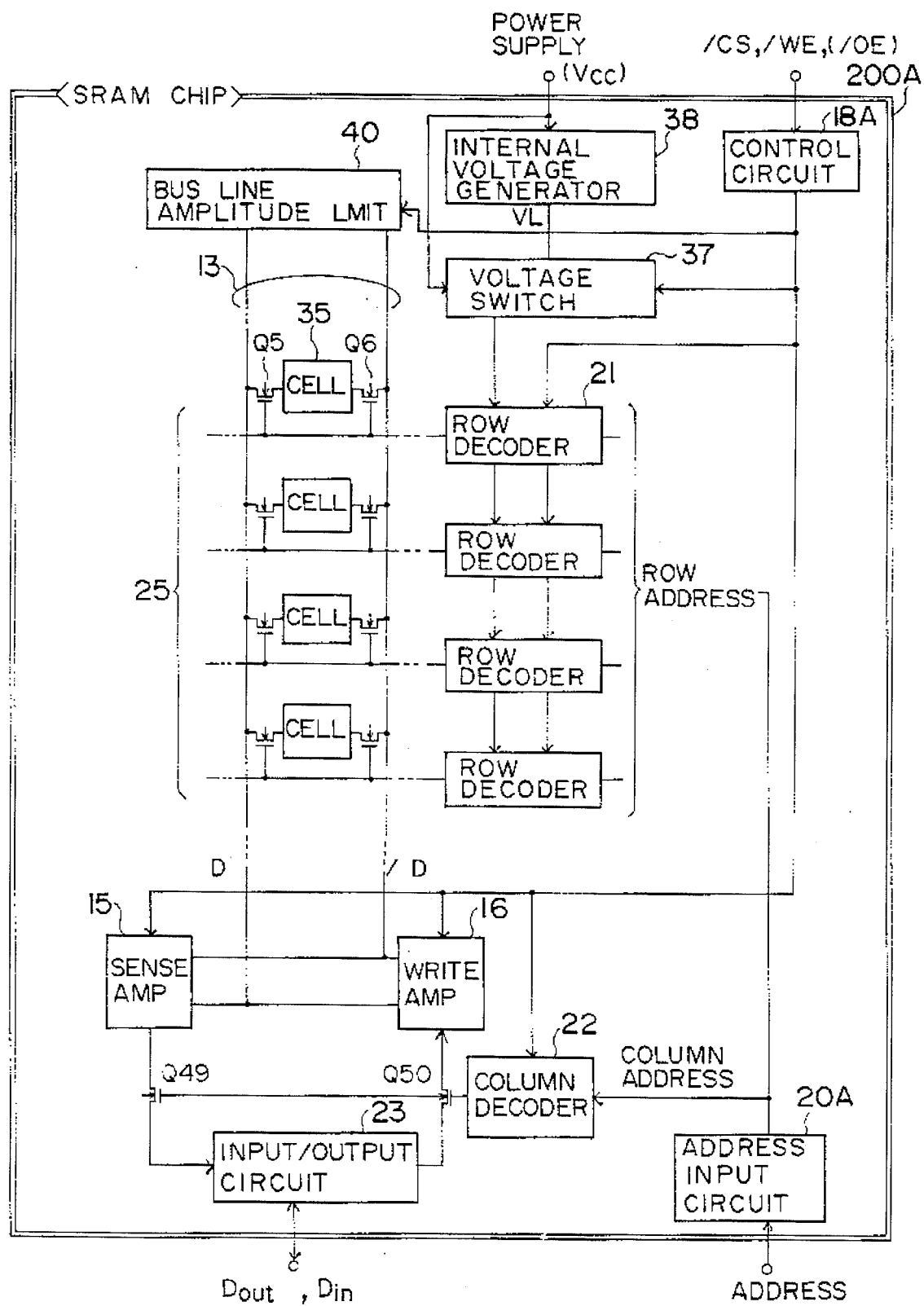
FIG. 32 is a block diagram of an SRAM device to which the third embodiment of the present invention is applied.

FIG. 32 is a block diagram of the structure of an SRAM device 200A according to the third embodiment of the present invention. In FIG. 32, parts that are the same as those shown in the previously described figures are given the same reference numerals. In the read operation, the voltage switch 37 applies the internal voltage VL to the row decoders 21 in accordance with the level of the write enable signal /WE applied via the control circuit 18. In the write operation, the voltage switch 37 applies the power supply voltage VCC to the row decoders 21.

A description will now be given of a fourth embodiment of the present invention. In the above-mentioned third embodiment of the present invention, the gate voltage applied to the select transistors Q5 and Q6 in the read operation is the internal voltage VL lower than the power supply voltage VCC used in the write operation in order to prevent the state of the related flip-flop circuit 1 from being inverted. According to the fourth embodiment of the present invention, the resistances between the flip-flop circuits 1 and the pair of data lines D and /D used in the read operation is set to be different from that in the write operation, whereby the state of the related flip-flop circuit 1 is prevented from being inverted.

Figure 33:
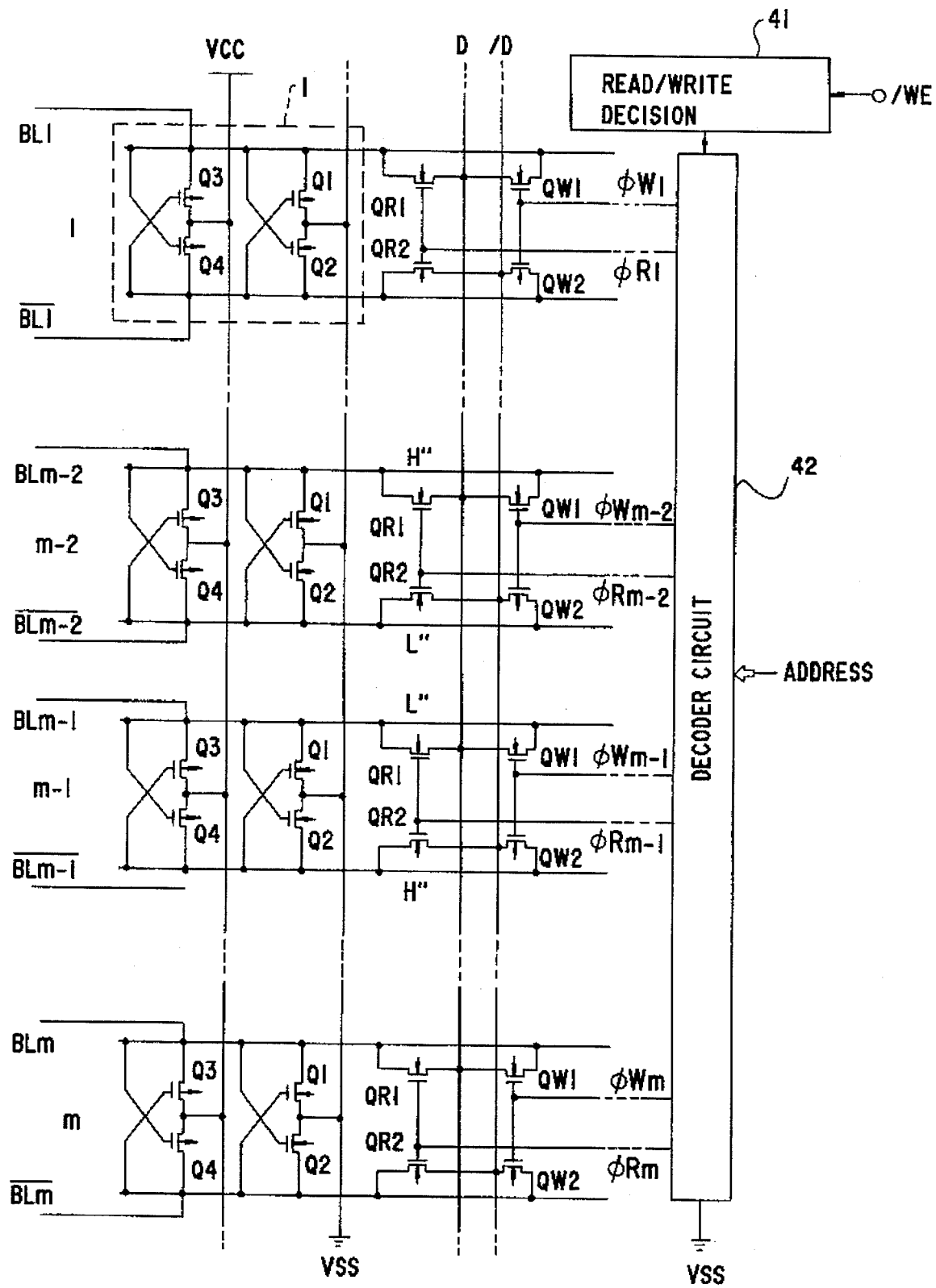
FIG. 33 is a circuit diagram of a fourth embodiment of the present invention.

FIG. 33 is a circuit diagram of a semiconductor memory device according to a fourth embodiment of the present invention. In FIG. 33, parts that are the same as those shown in the previously described figures are given the same reference numerals. A read/write decision circuit 41 refers to the level of the write enable signal /WE and determines whether the read operation or the write operation is performed. The decision result is output to a decoder circuit 42. The decoder circuit 42 corresponds to the column decoder in the DRAM device and the row decoder in the SRAM device. The decoder circuit 42 outputs select signals φR1–φRm in the read operation, and outputs select signals φW1–φWm in addition to the select signals φR1–φRm.

Instead of the select transistors Q5 and Q6 used in the first, second and third embodiments of the present invention, each of the m circuits uses four N-channel MOS transistors QR1, QR2, QW1 and QW2. The transistors QR1 and QW1 are connected in parallel, and the common node thereof is connected to the data line D. The other terminals of the transistors QR1 and QW1 are connected to one of the two terminals of the related flip-flop circuit 1. The transistors QR2 and QW2 are connected in parallel, and the common node thereof is connected to the data line /D. The other terminals of the transistors QR2 and QW2 are connected to the other terminal of the related flip-flop circuit 1. The select signals φR1–φRm are applied to the gates of the transistors RQ1 and RW2. The select signals φW1–φWm are applied to the gates of the transistors QW1 and QW2.

Figure 34:
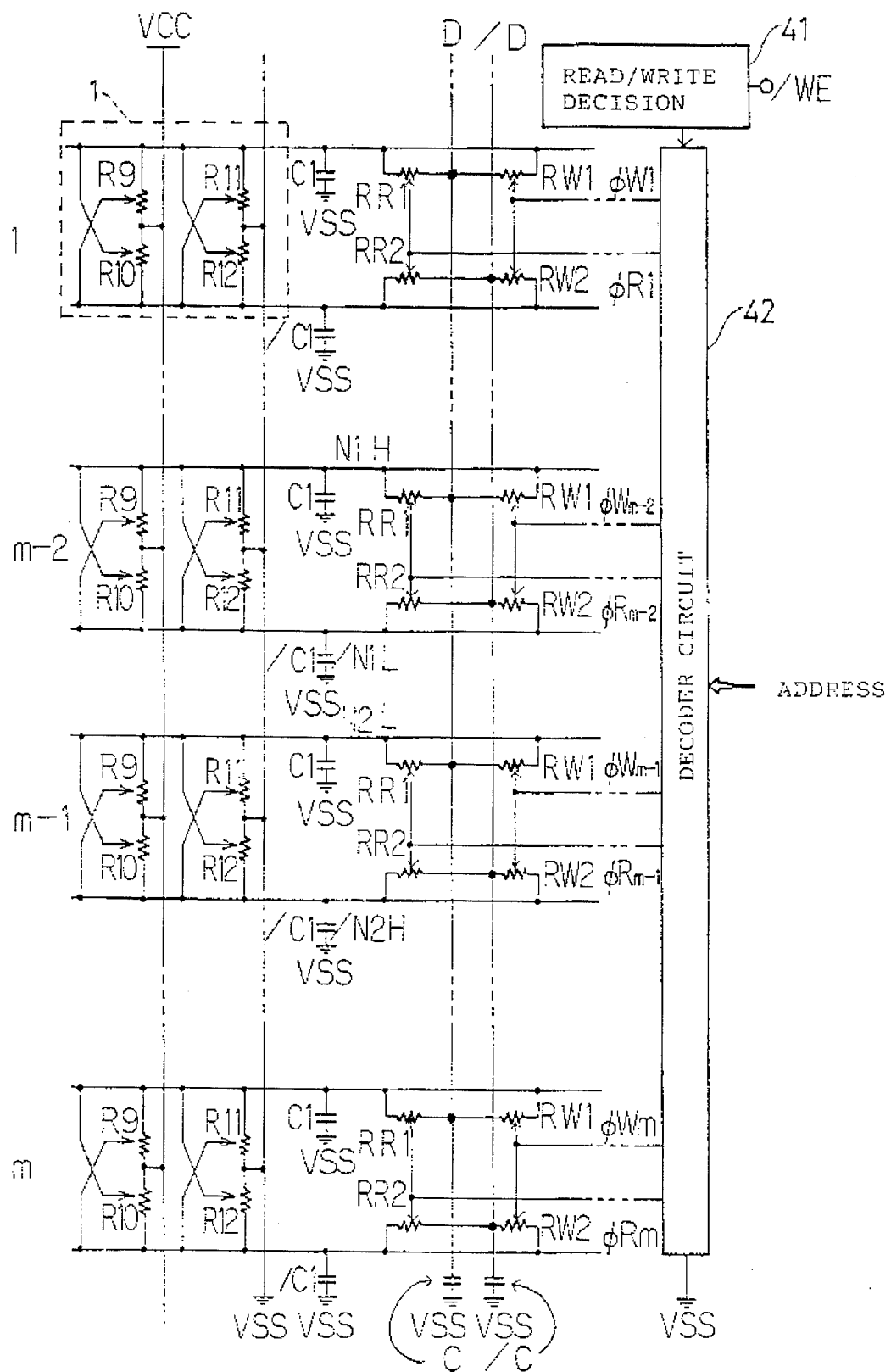
FIG. 34 is an equivalent circuit of the read operation of the circuit shown in FIG. 33.

FIG. 34 is an equivalent circuit of the configuration shown in FIG. 33 in the read operation. In FIG. 34, RR1 and RR2 denote the internal resistances of the transistors QR1 and QR2, respectively. Further, RW1 and RW" denote the internal resistances of the transistors QW1 and QW2, respectively. In the read operation, the select signals φW1–φWm are at the low level, and hence the internal resistances RW1 and RW2 are infinite.

Figure 35:
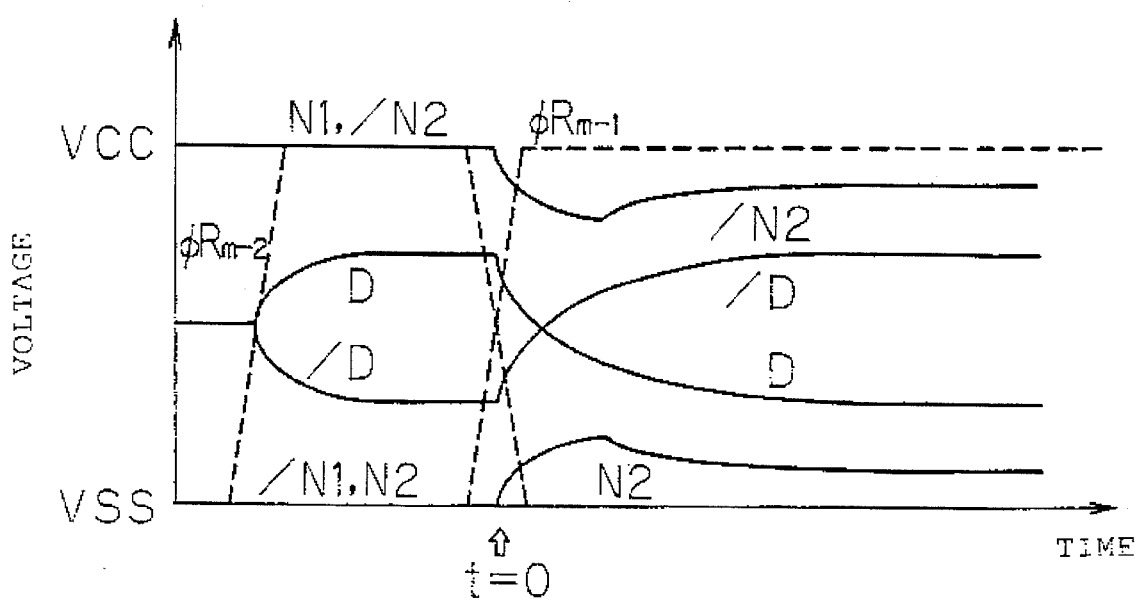
FIG. 35 is a waveform diagram of the read operation of the equivalent circuit shown in FIG. 34.

FIG. 35 is a waveform diagram of the read operation of the equivalent circuit shown in FIG. 34. More particularly, FIG. 35 shows the read operation observed when the select signal φRm–2 falls and the select signal φRm–1 rises while high-level data appearing at the node N1 of the (m–2)th flip-flop circuit 1 is read therefrom.

A possibility that the state of the flip-flop circuit 1 subjected to the read operation may be inverted due to charging and discharging regarding the parasitic capacitances C, /C, C1 and /C1 has been described with reference to FIG. 27. That is, if the internal resistances RR1 and RR2 are relatively small, charging from the parasitic capacitance C to C1 via the internal resistance RR1 and discharging from the parasitic capacitor/C to /C1 via the internal resistance RR2 are greater than discharging of the parasitic capacitor C1 to the ground via the internal resistance RR1 and charging of the parasitic capacitance /C1 from the power source VCC via the internal resistor R10. Hence, the charges (information) stored in the parasitic capacitances C1 and /C1 become equal to the charges (information) stored in the parasitic capacitances C and /C. This corresponds to a change in the stored information, and generates a read error when the next read operation on the (m–1)th flip-flop circuit 1 is performed.

In the write operation, the information stored in the (m–1)th flip-flop circuit 1 (the charges stored in the parasitic capacitances C1 and /C1) is likely to be affected by information on the parr of data lines D and /D (charges stored in the parasitic capacitances C and /C). Hence, it is necessary to facilitate the charging from C to C1 and the charging from /C1 to /C.

With the above in mind, in the write operation, the transistors QW1 and QW2 are driven in addition to the transistors QR1 and QR2 driven in the read operation in order to sufficiently reduce the internal resistances between the flip-flop circuit 1 in the write operation and the pair of data lines D and /D. When the transistors RQ1, RQ2, QW1 and QW2 are ON, the total gate width of the transistors QR1 and QW2 connected in parallel and the gate width of the transistors QR2 and QW1 connected in parallel are increased. The internal resistances obtained in the above state are RR1×RW1/(RR1+RW1) and RR2×RW2/(RR2+RW2). Hence, as shown in FIG. 35, the state inversion of the (m−1)th flip-flop circuit 1 can be prevented.

Figure 36:
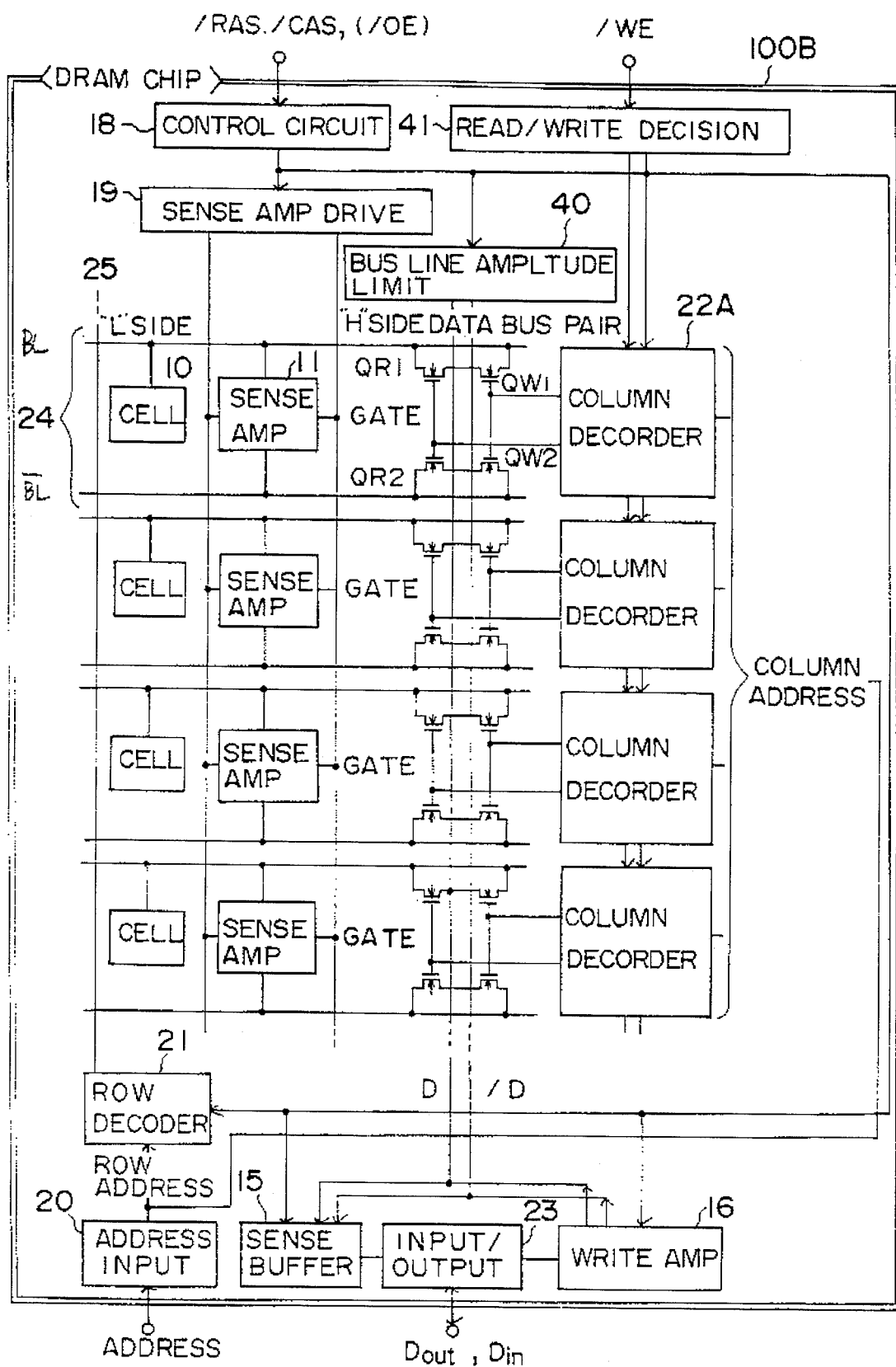
FIG. 36 is a block diagram of a DRAM device to which a fourth embodiment of the present invention is applied.

FIG. 36 is a block diagram of a DRAM device 100B according to the fourth embodiment of the present invention. In FIG. 36, parts that are the same as those shown in the previously described figures are given the same reference numerals as previously. Column decoders 22A selectively drive the select transistors QR1, QR2, QW1 and QW2 on the basis of the decision made by the read/write decision circuit 41.

Figure 37:
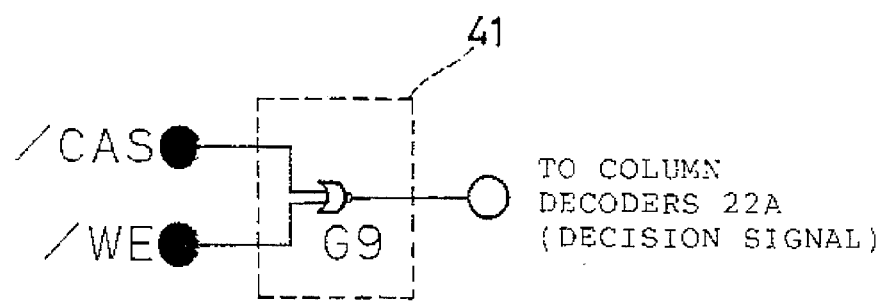
FIG. 37 is a circuit diagram of a read/write decision circuit shown in FIG. 36.

FIG. 37 is a diagram of the structure of the read/write decision circuit 41. As shown in FIG. 37, the read/write decision circuit 41 includes a NOR gate G9. The NOR gate G9 performs a NOR operation on the write enable signal /WE and the column address strobe signal /CAS, and outputs a decision signal to the column decoders 22A. The read/write decision circuit 41 shown in FIG. 33 is designed to operate on only the write enable signal /WE. In practice, it is preferable the read/write decision circuit 41 operates on the column address strobe signal /CAS in addition to the write enable signal /WE in terms of stability of the read operation.

Figure 38A:
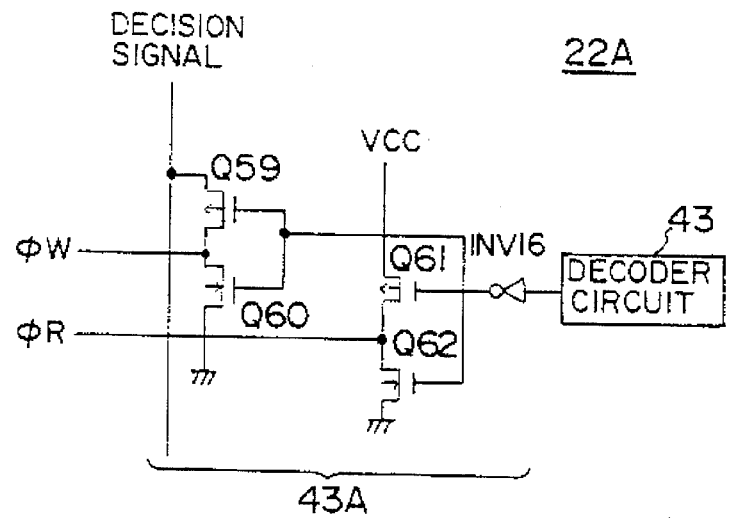
FIGS. 38A, 38B and 38C are diagrams of a configuration of a column decoder shown in FIG. 36.

FIG. 38A is a circuit diagram of each of the column decoders 22A. Each of the column decoders 22A includes a decoder circuit 43 and a driving circuit 43A having P-channel MOS transistors Q59 and Q61 and N-channel MOS transistors Q60 and Q62. The decoder circuit 43 has the same structure as shown in FIG. 30, but the power supply voltage applied to the NOR gates G5–G8 is fixed to VCC. The inverted version of the decoded signal is applied to the gates of the transistors Q59–Q62 via an inverter INV16. The power supply voltage VCC is applied to the source of the transistor Q61, and the decision signal from the read/write decision circuit 41 is applied to the transistor Q59. The select signal φR is output via the drains of the transistors Q61 and Q62, and the select signal φW is output via the drains of the transistors Q59 and Q60. In the write operation, the decision signal is switched to the high level, which sets the source of the transistor Q59 to the power supply voltage VCC. When the column decoder 22A shown in FIG. 38A is selected, the high-level decoded signal is output by the decoder circuit 43. In the read operation, only the select signal φR is switched to the high level. In the write operation, the select signals φR and φW are both switched to the high level.

Figure 38B:
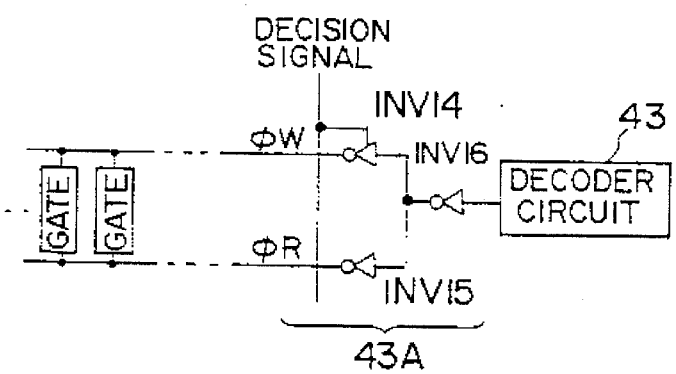

FIG. 38B shows a structure in which the decoder circuit and the driving circuit 43 are located close to each other on the chip and the select signals φW and φR output by the driving circuit 43A are applied to a plurality of sets of select transistors (which correspond to column selecting gates in the DRAM device). These gates are arranged in the traverse direction in FIG. 38B. Signal lines carrying the select signals φW and φR run over the column selecting gate 12, the sense amplifier 11 and the cell 10 shown in FIG. 36, and are connected to column selecting gates (not shown) located on the left sides of the cells 10 shown in FIG. 36. Of course, the sense amplifiers and the cells are connected to the respective column selecting gates.

Figure 38C:
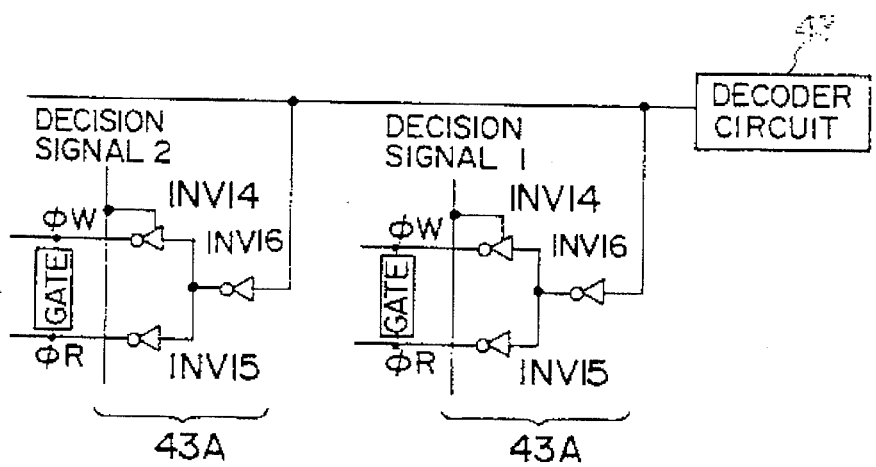

FIG. 38C shows a structure in which the output signal of the decoder circuit 43 is applied to a plurality of driving circuits 43A, and one set of select transistors is connected to each of the driving circuits 43A. In the structure shown in FIG. 38C, the distances between the decoder circuit 43 and the driving circuits 43A are long. A signal line carrying the output signal of the decoder circuit 43 laterally runs over the column selecting gate 12, the sense amplifier 11 and the cell 10. The driving circuits 43A shown in FIG. 38C are supplied with decision signals 1 and 2.

Figure 39A:
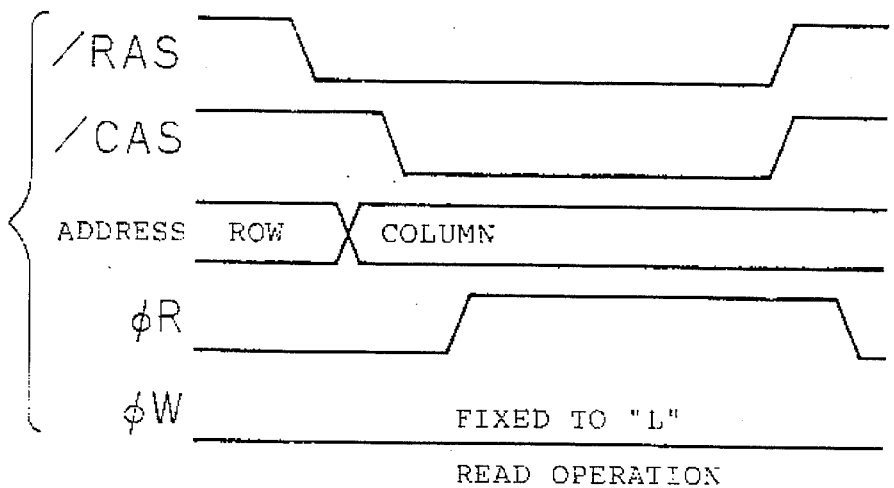
FIGS. 39A and 39B are waveform diagrams of the operation of the DRAM device shown in FIG. 36.
Figure 39B:
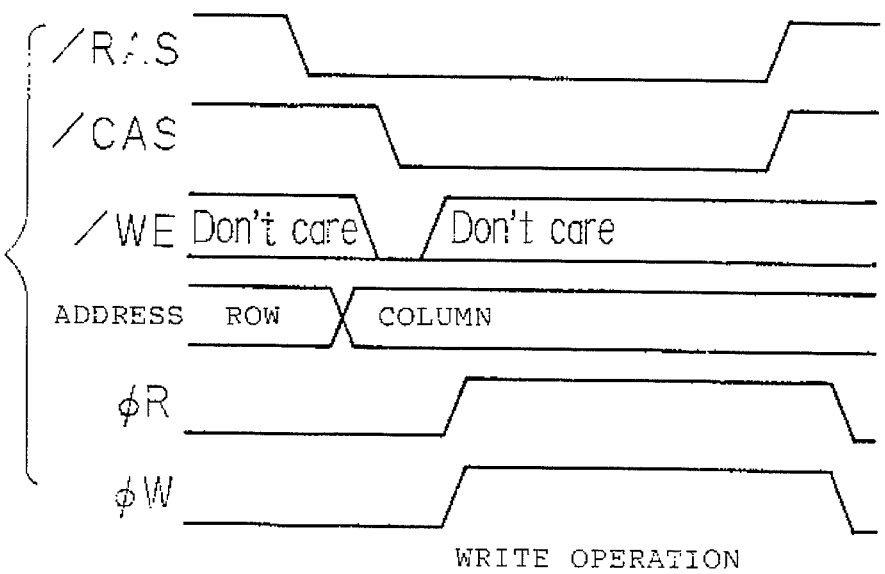

FIG. 39A is a waveform diagram of the read operation of the DRAM device 100B shown in FIG. 36, and FIG. 39B is a waveform diagram of the write operation thereof. In the read operation, only the select signal φR rises, and the select signal φW is fixed to the low level. In the write operation, both the select signal φR and φW rise.

Figure 40:
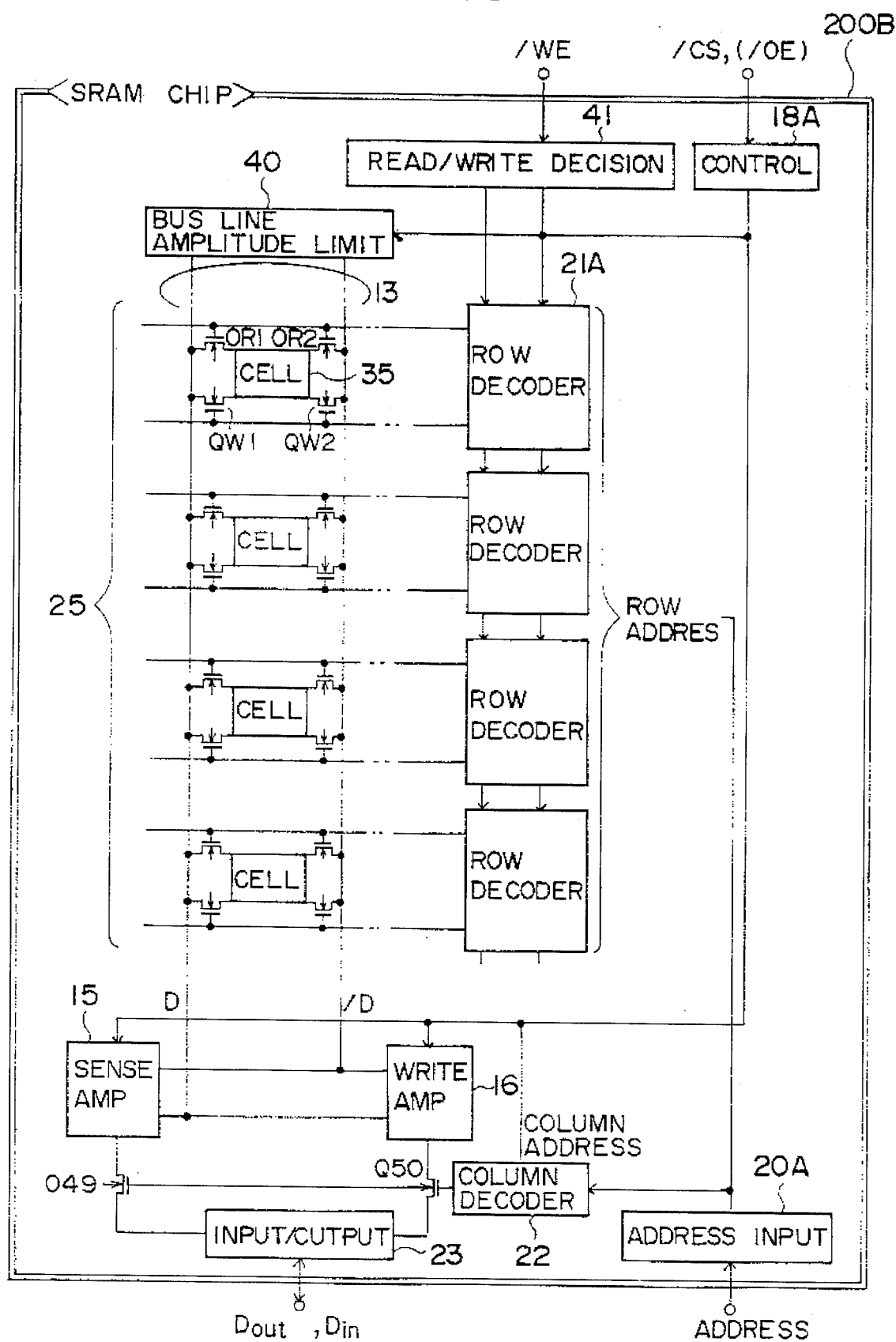
FIG. 40 is a block diagram of an SRAM device to which the fourth embodiment of the present invention is applied.

FIG. 40 is a block diagram of a SRAM device 200B according to the fourth embodiment of the present invention. In FIG. 40, parts that are the same as those shown in the previously described figures are given the same reference numerals. Row decoders 21A control corresponding m sets of select transistors QR1, QR2, QW2 and QW". Each of the row decoders 21A has the configuration shown in FIG. 38A or FIG. 38B.

A description will now be given of a fifth embodiment of the present invention.

As has been described with reference to FIG. 4, the sense buffer in the DRAM device or the sense amplifier in the SRAM device is formed with a current-mirror type read circuit made up of MOS transistors Q13 –Q22. It is known that such a current-mirror type read circuit has the best AC input/output characteristic (capable of operating at the highest speed) when the input signals D and /D are approximately equal to VCC/2. However, the conventional structure is designed to stabilize the operations of the flip-flop circuits 1 by precharging the data lines D and /D to the power supply voltage VCC. Hence, the read circuit 5 cannot be operated at the best input/output characteristic. That is, it is impossible to operate the read circuit 5 at high speed.

Figure 41:
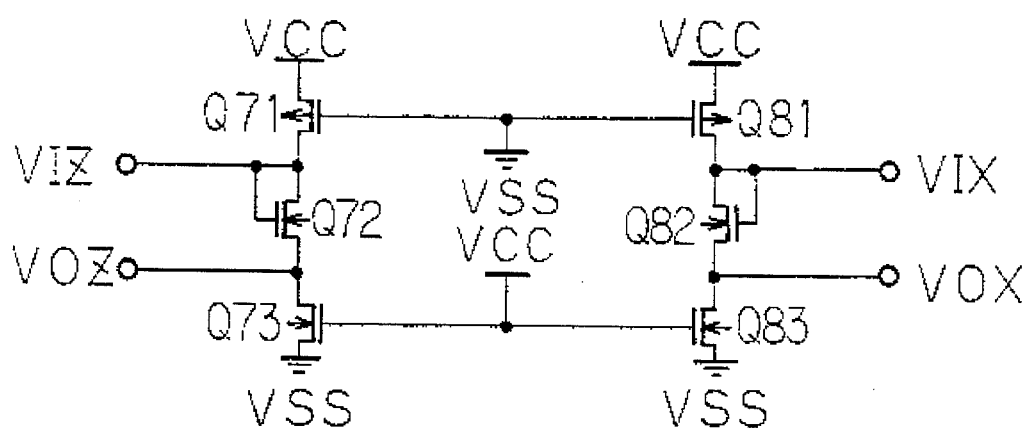
FIG. 41 is a circuit diagram of a conventional potential shift circuit.

For the above reason, conventionally, a potential shift circuit as shown in FIG. 41 is provided between the data line pair and the sense buffer in the DRAM device (sense amplifier in the SRAM device) in order to select the potentials of the data lines which make it possible to operate the read circuit with its best input/output characteristic. The conventional potential shift circuit shown in FIG. 41 includes transistors Q71–Q73 and Q81–Q83. complementary input signals VIX and VIZ are applied to the gates of the transistors Q72 and Q82, respectively. Complementary output signals VOX and VOZ are output via the drains of the transistors Q73 and Q83, respectively.

Figure 42A:
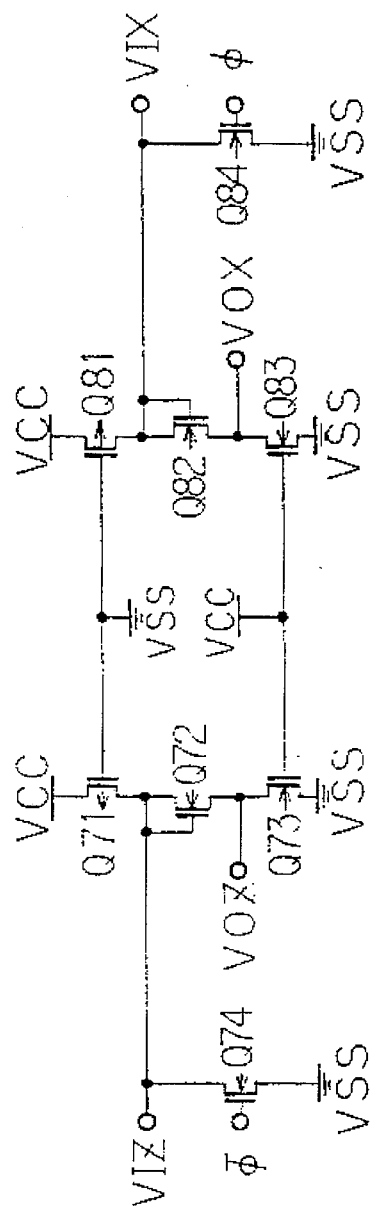
FIGS. 42A and 42B are equivalent circuit diagrams of the conventional potential shift circuit shown in FIG. 41.
Figure 42B:
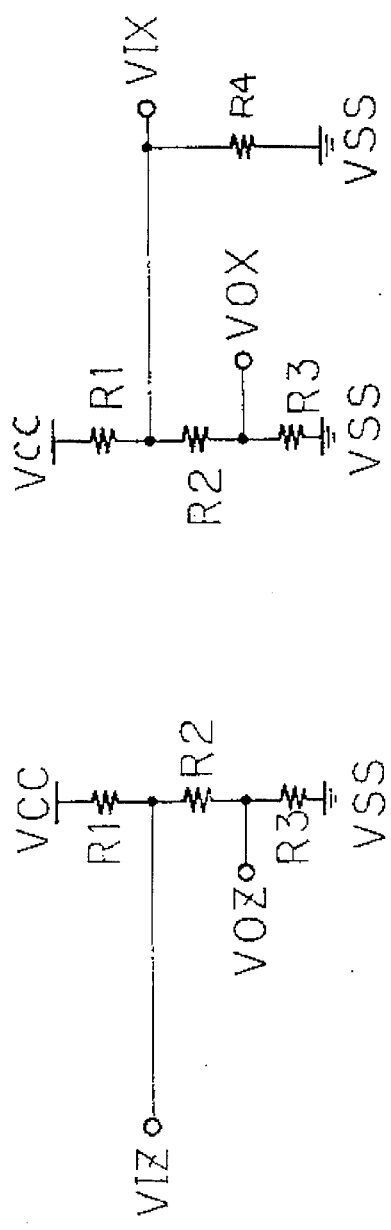

FIG. 42A shows a circuit configuration in which transistors Q84 and Q74 controlled by select signals φ and /φ are added to the potential shift circuit shown in FIG. 41. These transistors Q74 and Q84 form current paths. FIG. 42B is an equivalent circuit of the circuit shown in FIG. 42A in which a current path occurs on the output VIX side in response to the rise of the select signal φ and hence a potential difference between the input signals VIZ and VIX.

A description will now be given, with reference to FIG. 42B, of a mechanism in which the complementary output signals VOZ and VOX of the potential shift circuit shown in FIG. 41 are attenuated with respect to the complementary input signals VIZ and VIX.

On the VIZ side, the following equations stand:

$$VIZ = VCC \times (R2+R3)/(R1+R2+R3)$$

$$VOZ = VCC \times R3/(R1+R2+R3)$$

Hence, a shifted potential level $\Delta VZ$ is written as follows:

$$\begin{aligned}\Delta VZ &= VIZ - VOZ \\ &= R2/(R1+R2+R3)\end{aligned} \quad (1)$$

On the VIX side, the following equations stand:

$$VIX = VCC \times (R2+R3)R4/\{R1(R2+R3)+R4(R1+R2+R3)\}$$

$$VOX = VCC \times R3 \times R4/\{R1(R2+R3)+R4(R1+R2+R3)\}$$

Thus, the amount $\Delta VZ$ of potential shift is written as follows:

$$\begin{aligned}\Delta VX &= VIX - VOX \\ &= R2 \times R4/\{R1(R2+R3) + \\ &\quad R4(R1+R2+R3)\}\end{aligned} \quad (2)$$

The amplitude $\Delta VI$ of the complementary input signals is expressed as follows:

$$\begin{aligned}\Delta VI &= VIZ - VIX \\ &= VCC \times R1(R2+R3)^2/ \\ &\quad [(R1+R2+R3)\{R1(R2+R3)+ \\ &\quad R4(R1+R2+R3)\}]\end{aligned}$$

The amplitude $\Delta VO$ is written as follows:

$$\begin{aligned}\Delta VO &= VOZ - VOX \\ &= VCC \times R1R3(R2+R3)/ \\ &\quad [(R1+R2+R3)\{R1(R2+R3)+ \\ &\quad R4(R1+R2+R3)\}]\end{aligned}$$

It will now be assumed that A is:

$$A = VCC \times R1/[(R1+R2+R3)\{R1(R2+R3)+R4(R1+R2+R3)\}]$$

By using the above A, the following equations can be obtained:

$$\Delta VI = (R2+R3)^2 \times A$$

$$\Delta VO = R3(R2+R3) \times A$$

It can be seen from the above equations that $\Delta VO$ is attenuated with respect to $\Delta VI$, and the amount $\Delta VIO$ of this output attenuation is as follows:

$$\Delta VIO = R2(R2+R3)A \quad (3)$$

When R2 is set to be zero in order to reduce the attenuation, $\Delta VZ = \Delta VX = 0$ in the equations (1) and (2). This means that the potential shift cannot be performed.

As described above, the conventional potential shift circuit shown in FIG. 41 has a disadvantage in that the potential shift is performed with an attenuation of the complementary output signals with respect to the complementary input signals.

Figure 43:
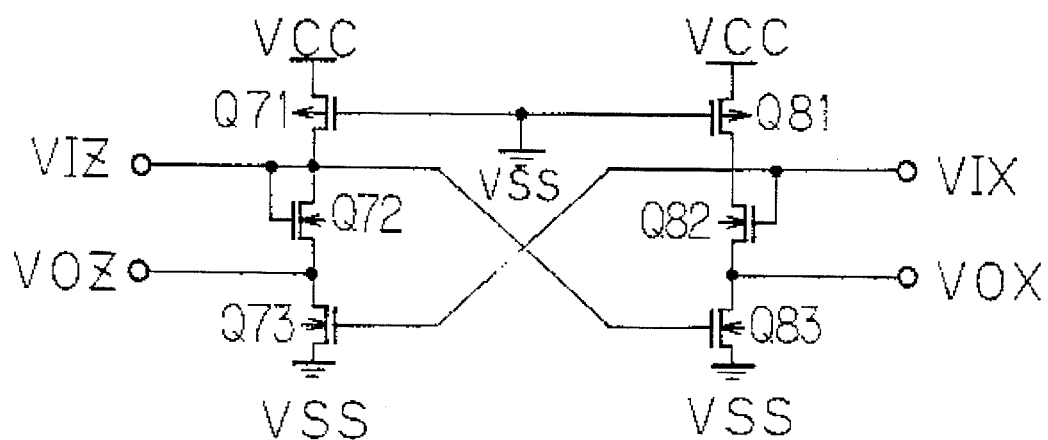
FIG. 43 is a circuit diagram of a fifth embodiment of the present invention.

FIG. 43 is a circuit diagram of a fifth embodiment of the present invention intended to overcome the above disadvantage. A potential shift circuit according to the fifth embodiment of the present invention includes the aforementioned P-channel MOS transistors Q71 and Q81, and the aforementioned N-channel MOS transistors Q72, Q73, Q82 and Q83. However, connections among these transistors shown in FIG. 43 are different from those shown in FIG. 41. The gate and drain of the transistor Q72 are connected together, and are connected to the gate of the transistor Q83. The gate and drain of the transistor Q82 are connected together, and are connected to the gate of the transistor Q73. The gates of the transistors Q71 and Q81 are grounded. In other words, the source of the transistor Q73 (Q83) is grounded. Further, the drain of the transistor Q73 (Q83) outputs the output signal with respect to one of the two input signals, and the gate thereof receives the other input signal.

FIG. 44A shows a circuit configuration in which current path transistors Q74 and Q84 are added to the potential shift circuit shown in FIG. 43. FIG. 44B is an equivalent circuit of the potential shift circuit shown in FIG. 43 in which a current path occurs on the VIX side in response to the rise of the select signal $\phi$, and hence a potential difference between the inputs VIZ and VIX occurs. It will be noted that transistors Q71 and Q81 functioning as load transistors and the transistors Q72 and Q82 for determining the amount of the shifted potential can be replaced by simple resistance elements. In this case, the same effect as those in the circuit shown in FIG. 44A can be obtained. That is, as shown in FIG. 44B, a series circuit having resistors R1 and R2 is connected to the transistor Q73 in series.

The equivalent circuit shown in FIG. 44B differs from the convention equivalent circuit shown in FIG. 42B in that the resistors R3 used in the conventional circuit are replaced by variable resistors, and the resistance value R3Z of the variable resistor on the VIZ side is different from the resistance value R3X of the variable resistor on the VIZ side.

On the VIZ side, the following equations stand:

$$VIZ = VCC \times (R2+R3Z)/(R1+R2+R3)$$

$$VOZ = VCC \times R3Z/(R1+R2+R3Z)$$

Hence, the amount $\Delta VZ$ of potential shift is as follows:

$$\begin{aligned}\Delta VZ &= VIZ - VOZ \\ &= R2/(R1+R2+R3Z)\end{aligned} \quad (4)$$

On the VIX side, the following equations stand:

$$VIX = VCC \times (R2+R3X)R4/\{R1(R2+R3X)+R4(R1+R2+R3X)\}$$

$$VOX = VCC \times R3X \times R4/\{R1(R2+R3X)+R4(R1+R2+R3X)\}$$

Hence, the amount $\Delta VX$ of potential shift can be written as follows:

$$\begin{aligned}\Delta VX &= VIX - VOX \\ &= R2 \times R4/\{R1(R2+R3X) + \\ &\quad R4(R1+R2+R3X)\}\end{aligned} \quad (5)$$

The amplitude $\Delta VI$ of the complementary input signals is:

$$\begin{aligned}\Delta VI &= VIZ - VIX \\ &= VCC \times R1\{(R2+R3Z)(R2+R3X) + \\ &\quad R4(R3Z-R3X)\} \div [(r1+r2+r3Z) \\ &\quad \{R1(R2+R3X)+R4(R1+R2+R3X)\}\end{aligned}$$

The amplitude ΔVO of the complementary output signals is:

$$\Delta VO = VOZ - VOX$$
$$= VCC \times R1\{R3Z(R2+R3X) +$$
$$R4(R1+R2)(R3Z-R3X)/R1\} \div$$
$$[(R1+R2+R3Z)\{R1(R2+R3X) +$$
$$R3(R1+R2+R2X)\}]$$

It will now be assumed that B is defined as:

$$B = VCC \times R1 \div [(R1+R2+R3Z)(\{R1(R2+R3X)+R4(R1+R2+R3X)\}].$$

Then, the following equations are obtained:

$$\Delta VI = (R2+R3Z)(R2+R3X) + R4(R3Z-R3X)\} \times B$$

$$\Delta VO = \{R3Z(R2+R3X) + R4(R1+R2) \times (R3Z-R3X)/R1\} \times B$$

The difference between the input signal amplitude and the output signal amplitude is calculated as follows:

$$\Delta VIO = VI - VO \quad (6)$$
$$= R2\{(R2+R3X) + R4/R1 \times$$
$$(R3Z-R3X)\} \times B$$

It can be seen that equation (6) is equivalent to equation (3) under the condition that R3Z=R3X=R3. The equation (6) shows the difference between the input signal amplitude and the output signal amplitude, the following stands:

ΔVIO>0: attenuation

ΔVIO=0: attenuation=amplification=0

ΔVIO<0: amplification

The above can be identified by using the following:

$$R2\{(R2+R3X)-R4/R1\times(R3z-R3X)\}\times B<0$$

From the above inequality, the following conditions can be obtained:

$$R3Z<(1+R1/R4)R3X+R1R3/R4: \text{attenuation}$$

$$R3Z=(1+R1/R4)R3X+R1R3/R4: \text{attenuation=amplification=0}$$

$$R3Z>(1+R1/R4)R3X+R1R3/R4: \text{amplification}$$

When the potential shift circuit according to the fifth embodiment of the present invention is applied to a differential amplifier in the DRAM devices, R1 is the internal resistance of the load transistors Q7 and Q8 (FIG. 6) connected to the data buses, R4 corresponds to the internal resistances of the column selecting transistors Q5 and Q6 (FIG. 6). In the SRAM devices, R1 is the internal resistances of the transistors Q7 and Q8 (FIG. 6), and R4 is the internal resistances of the word transfer transistors Q5 and Q6. In either case, the condition R1<<R4, the attenuation and amplification much depend on the difference between the resistance R3Z and the resistance R3X.

Figure 5:
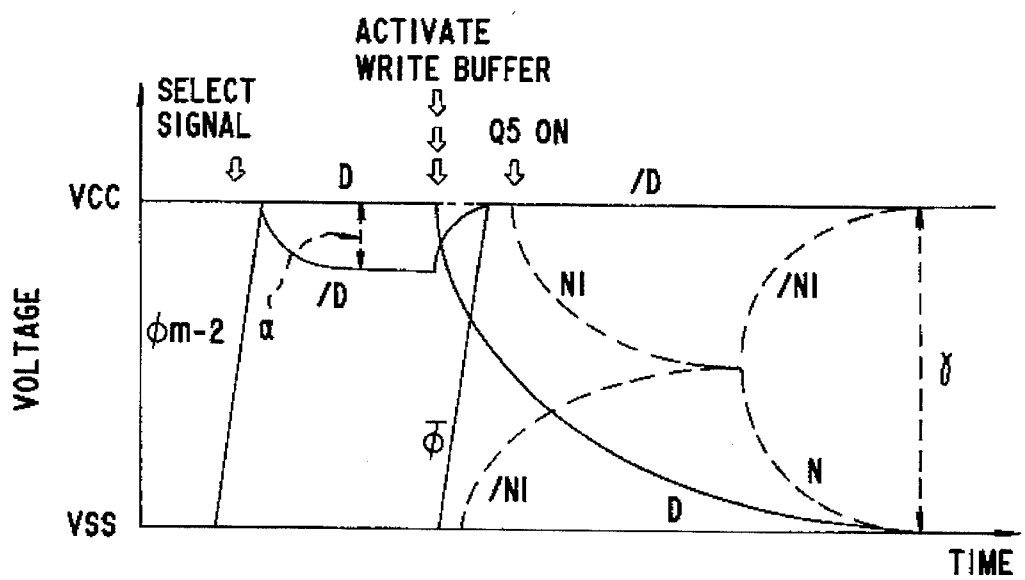
FIG. 5 is a waveform diagram of the operation of the circuit shown in FIG. 1 in a case where the pair of data lines is disconnected from a VCC power supply in the write operation.
Figure 45:
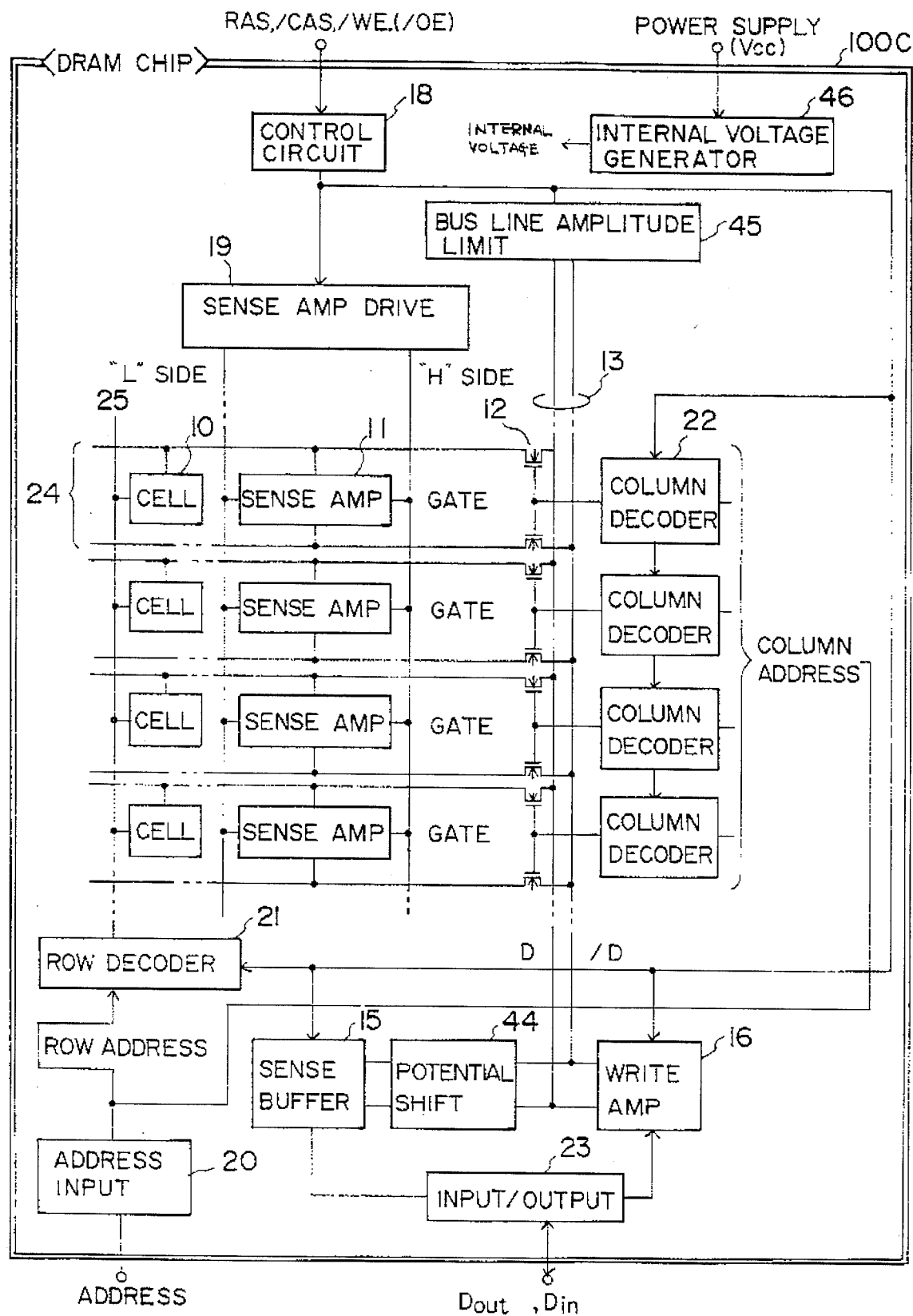
FIG. 45 is a block diagram of a DRAM device to which the fifth embodiment of the present invention is applied.

FIG. 45 is a block diagram of a DRAM device having the potential shift circuit 44 according to the fifth embodiment of the present invention. In FIG. 45, parts that are the same as those shown in the previously described figures are given the same reference numerals as previously. The potential shift circuit 44 according to the fifth embodiment of the present invention is connected between the sense buffer 15 and the pair 13 of bus lines. Since the DRAM device shown in FIG. 45 employs the potential shift circuit 44, the pair 13 of bus lines can be precharged to the power supply voltage VCC (see FIG. 5). This precharging is performed by a bus line amplitude limit circuit 45 shown in FIG. 45. An internal voltage generator 46 generates an internal voltage necessary for the operation from the power supply voltage VCC.

Figure 46:
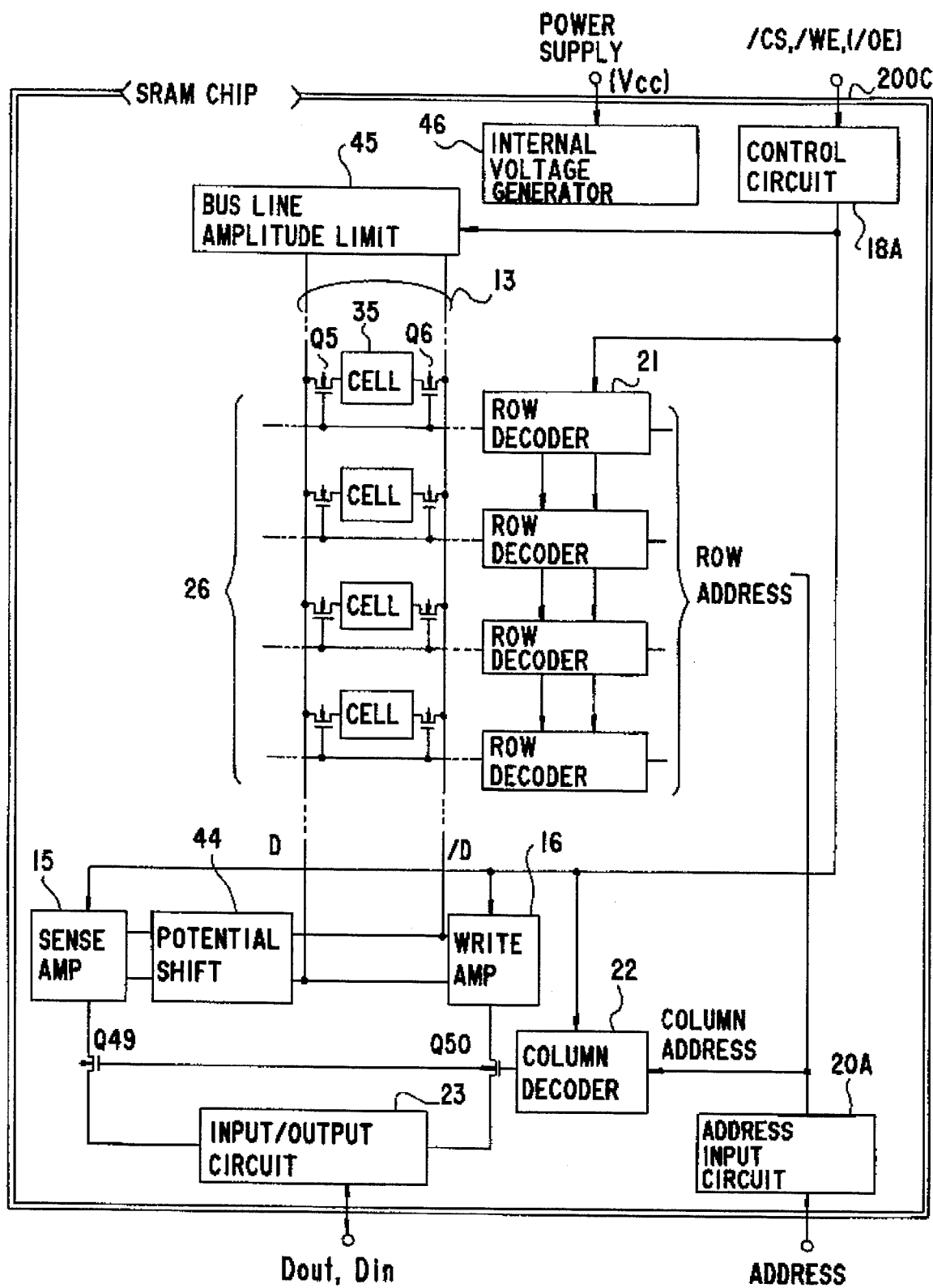
FIG. 46 is a block diagram of an SRAM device to which the fifth embodiment of the present invention is applied.

FIG. 46 is a block diagram of an SRAM device having the potential shift circuit 44 according to the fifth embodiment of the present invention. In FIG. 46, parts that are the same as those shown in the previously described figures are given the same reference numerals as previously. The potential shift circuit 44 is connected between the sense amplifier 15 and the pair 13 of bit lines. Since the SRAM device employs the potential shift circuit 44, the pair 13 of bit lines can be precharged to the power supply voltage by the bus line amplitude limit circuit 45.

Figure 47:
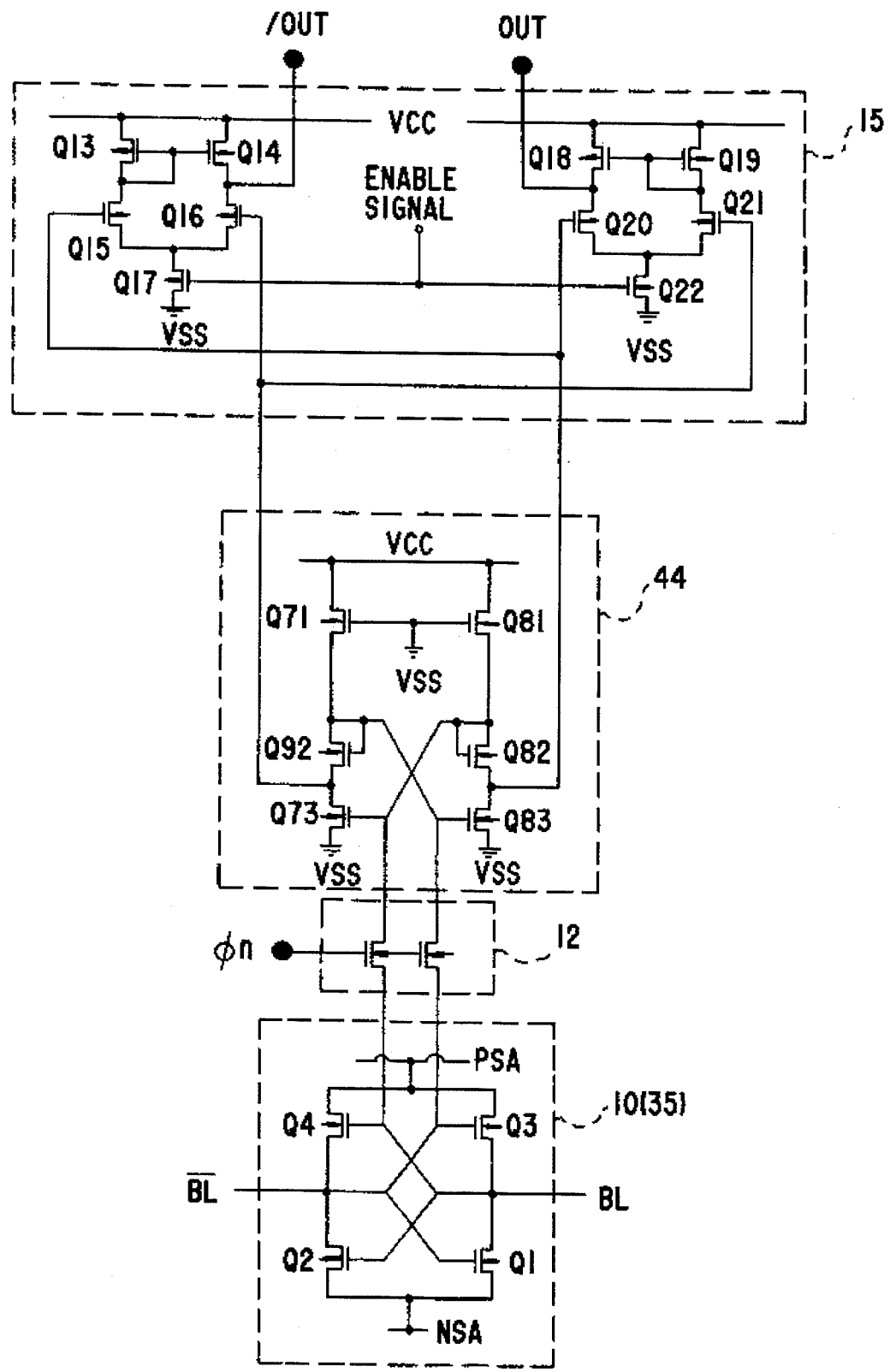
FIG. 47 is a circuit diagram of an essential part of the circuit shown in FIGS. 45 and 46.

FIG. 47 is a circuit diagram of an essential part of the DRAM device shown in FIG. 45. In FIG. 47, parts that are the same as those shown in the previously described figures are given the same reference numerals as previously. The signals PSA and NSA for driving the sense amplifiers 11 are generated by the circuit shown in FIG. 11. The circuit shown in FIG. 47 can be used for the SRAM device. In this case, the signals PSA and NSA are fixed to the power supply voltages VCC and VSS, respectively.

Figure 48:
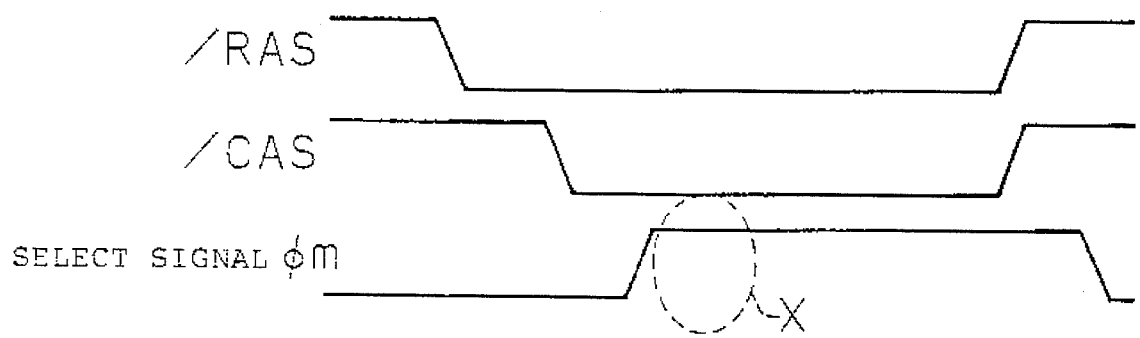
FIG. 48 is a waveform diagram of the operation of the DRAM device shown in FIG. 45.

FIG. 48 is a waveform diagram of the operation of the DRAM device shown in FIG. 45. The select signal φm shown in FIG. 48 is generated by the corresponding column decoder 22 in the DRAM device (when the mth flip-flop circuit 1 is selected). In the SRAM device, the select signal φm is generated by the related row decoder 21. The select signal φm can be generated by, for example, the circuit shown in FIG. 30.

The potential shift circuit shown in FIG. 43 functions to shift down the high-level input potential to the low-level output potential. It is also possible to provide a potential shift circuit having the function of shifting up a low-level input potential to a high-level output potential.

Figure 49:
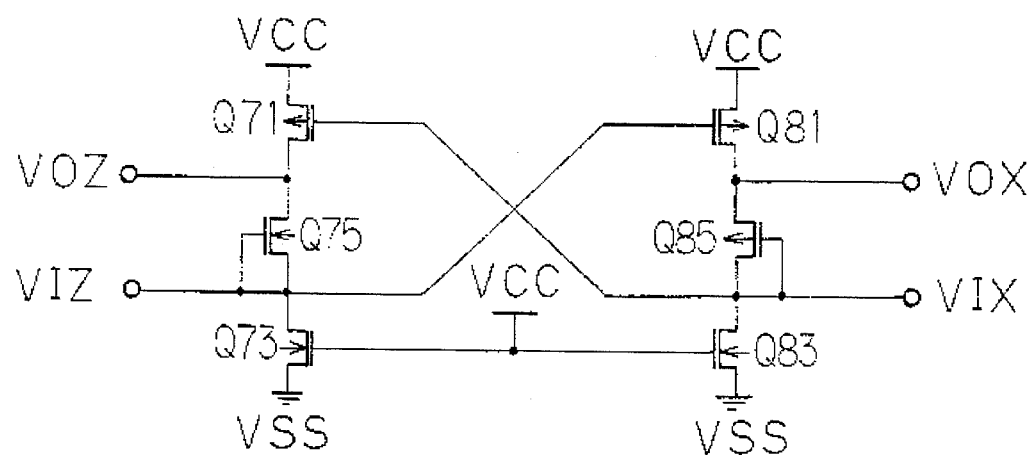
FIG. 49 is a circuit diagram of another configuration of the potential shift circuit according to the fifth embodiment of the present invention.

FIG. 49 is a circuit diagram of a potential shift circuit which shifts up a low-level input potential to a high-level output potential. In FIG. 49, P-channel MOS transistors Q75 and Q85 are substituted for the N-channel MOS transistors Q72 and Q82 shown in FIG. 43. Further, the N-channel MOS transistors Q74 and Q84 are replaced by P-channel MOS transistors Q76 and Q86. The input signal VIZ is applied to the gate and drain of the transistor Q75, the drain of the transistor Q73, and the gate of the transistor Q81. The input signal VIX is applied to the gate and drain of the transistor Q85, the drain of the transistor Q83 and the gate of the transistor Q71.

Figure 50A:
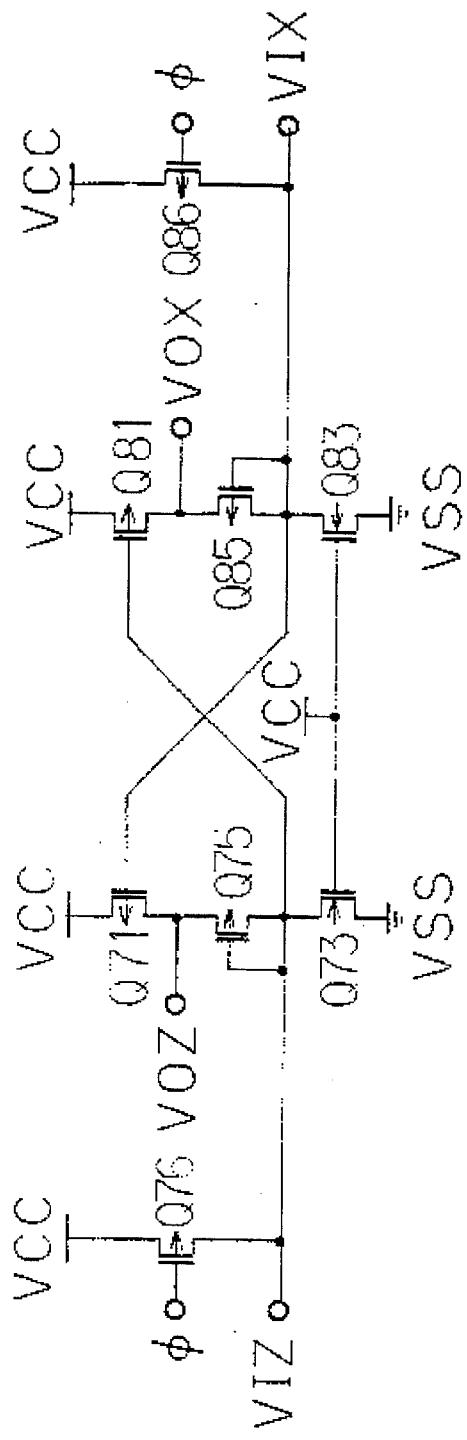
FIGS. 50A and 50B are equivalent circuit diagrams of the configuration shown in FIG. 49 obtained when a driving signal falls.
Figure 50B:
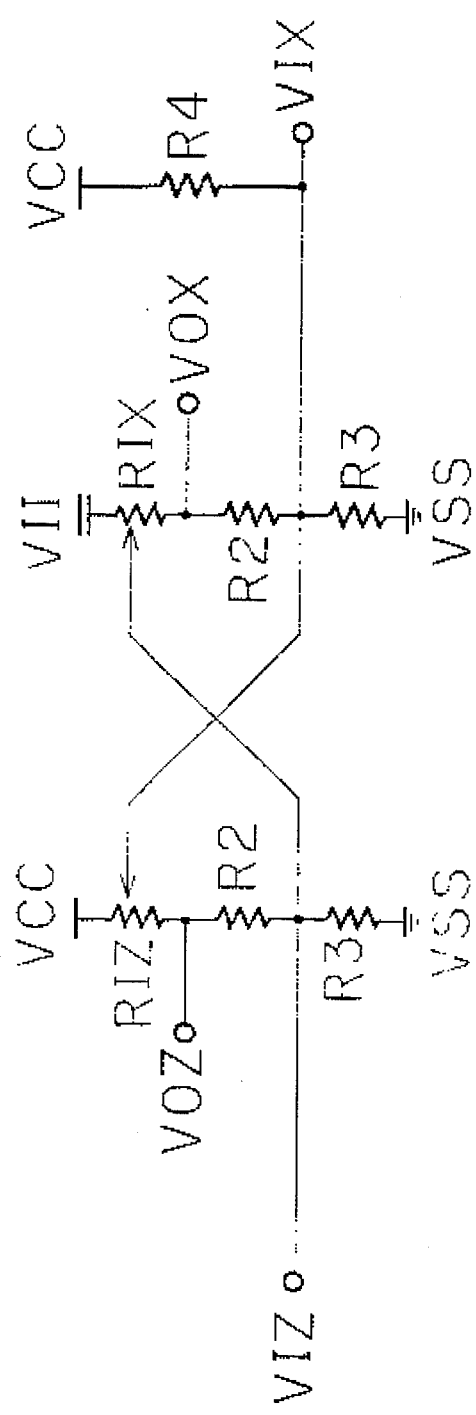

FIG. 50A shows a circuit configuration in which transistors Q76 and Q86 are added to the circuit shown in FIG. 49. FIG. 50B is an equivalent circuit of the circuit shown in FIG. 50A obtained when the driving signal φ falls. The transistors Q71 and Q81 function as variable resistors RIZ and RIX, respectively.

By applying the potential shift circuits according to the fifth embodiment of the present invention to DRAM or SRAM devices, it becomes possible to prevent attenuation of the output amplitude caused during the level shifting operation or to amplify the output amplitude. Further, the potential shift circuits are placed on the input sides of differential amplifiers, it becomes possible to increase the operation speed of the differential amplifiers and to contribute to facilitating the read operation of the semiconductor memory devices.

Figure 51A:
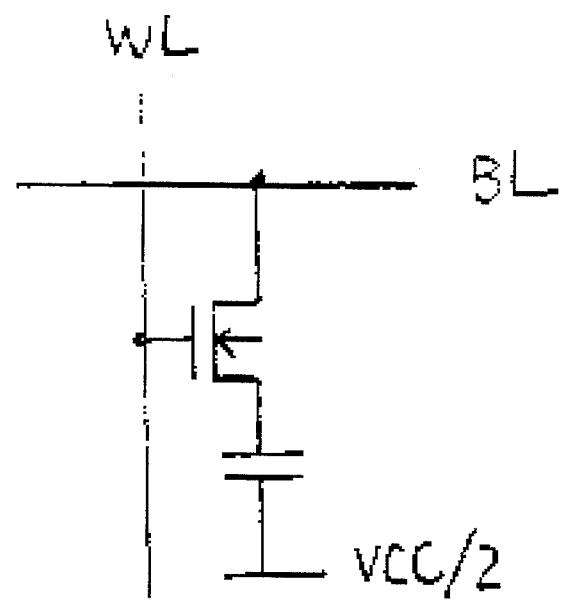
FIGS. 51A and 51B are circuit diagrams of memory cells used in a DRAM device and an SRAM device, respectively.
Figure 51B:
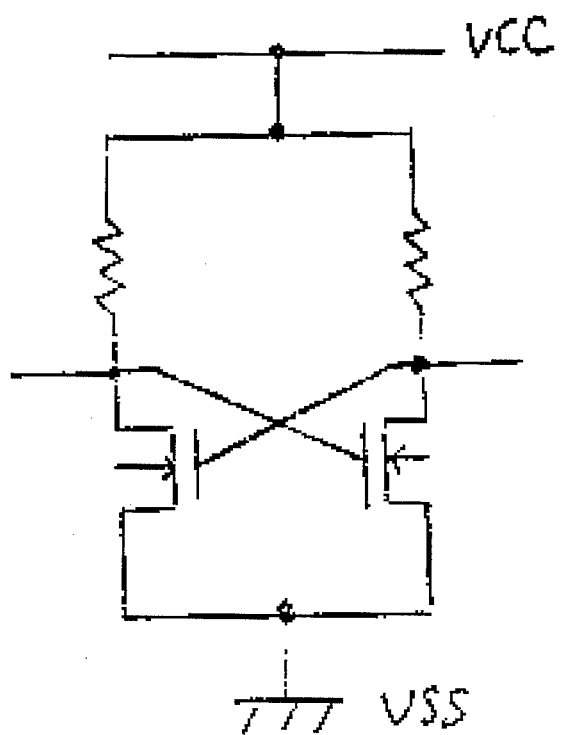

Finally, each of the memory cells 10 used in the DRAM devices has, for example, a circuit configuration shown in FIG. 51A. Each of the memory cells 35 used in the SRAM devices has, for example, a circuit configuration shown in FIG. 51B.

The present invention is not limited to the specifically disclosed embodiments, and variations and modifications may be made without departing from the scope of the present invention.

What is claimed is:

1. A semiconductor memory device comprising:

a flip-flop circuit;

a switch provided between the flip-flop circuit and a pair of data lines;

a write circuit writing data into the flip-flop circuit via the switch and the data lines; and a circuit applying an intermediate voltage between an upper power source voltage and a lower power source voltage to the pair of data lines when the write circuit performs a write operation so that a voltage amplitude on the pair of data lines is limited so as to be less than a voltage amplitude of the flip-flop circuit in the write operation.

2. The semiconductor memory device as claimed in claim 1, wherein the predetermined voltage applied by said circuit is a clamp voltage approximately equal to half the voltage amplitude of the flip-flop circuit.

3. The semiconductor memory device as claimed in claim 1, wherein the circuit comprises means for applying said predetermined voltage to the pair of data lines when a read operation is performed.

4. The semiconductor memory device as claimed in claim 1, further comprising voltage generating means for generating said predetermined voltage from an external power supply voltage corresponding to the voltage amplitude of the flip-flop circuit.

5. The semiconductor memory device as claimed in 1, wherein the flip-flop circuit comprises a resistance element for limiting data different from data stored in the flip-flop circuit from being input to the flip-flop circuit from the pair of data lines.

6. A semiconductor memory device comprising:

a flip-flop circuit;

a switch provided between the flip-flop circuit and a pair of data lines, wherein the switch comprises a first transistor connected between one of the pair of data lines and the flip-flop circuit, and a second transistor connected between the other one of the pair of data lines and the flip-flop circuit;

a write circuit writing data into the flip-flop circuit via the switch and the data lines;

a circuit applying a predetermined voltage to the pair of data lines when the write circuit performs a write operation so that a voltage amplitude on the pair of data lines is limited so as to be less than a voltage amplitude of the flip-flop circuit in the write operation; and means for varying a gate voltage applied to the first and second transistors in the read operation and the write operation so that internal resistances of the first and second transistors obtained in the read operation are different from those of the first and second transistors obtained in the write operation.

7. The semiconductor memory device as claimed in claim 6, wherein said means comprises:

internal voltage generating means for generating an internal voltage from an external power supply voltage; and voltage switch means for applying, as said gate voltage, either the external power supply voltage or the internal voltage to the gates of the first and second transistors, the internal voltage being lower than the external power supply voltage, said voltage switch means applying the internal voltage to the gates of the first and second transistors in the read operation.

8. The semiconductor memory device as claimed in claim 6, wherein the gate voltage applied in the read operation is lower than the gate voltage applied in the write operation.

9. A semiconductor memory device comprising:

a flip-flop circuit;

a switch provided between the flip-flop circuit and a pair of data lines, wherein the switch comprises a plurality of first transistors connected between one of the pair of data lines and the flip-flop circuit, and a plurality of second transistors connected between the other one of the pair of data lines and the flip-flop circuit;

a write circuit writing data into the flip-flop circuit via the switch and the data lines;

a circuit applying a predetermined voltage to the pair of data lines when the write circuit performs a write operation so that a voltage amplitude on the pair of data lines is limited so as to be less than a voltage amplitude of the flip-flop circuit in the write operation; and means for driving m first and second transistors among the plurality of first transistors and the plurality of second transistors in the read operation and for driving n (n>m) first and second transistors among the plurality of first transistors and the plurality of second transistors in the write operation, so that resistance between the pair of data lines and the flip-flop circuit is varied in the read operation and the write operation.

10. The semiconductor memory device as claimed in claim 9, wherein a composite internal resistance of the n first and second transistors is less than that of the m first and second transistors.

11. The semiconductor memory device as claimed in claim 9, wherein said means comprises decision means for determining whether the read operation or the write operation is performed on the basis of a write enable signal.

12. The semiconductor memory device as claimed in claim 1, further comprising a read circuit which comprises a current-mirror type read circuit having MOS transistors.

13. The semiconductor memory device as claimed in claim 1, further comprising dynamic type memory cells connected to the flip-flop circuit, so that the semiconductor memory device functions as a DRAM device in which the flip-flop circuit functions as a sense amplifier.

14. The semiconductor memory device as claimed in claim 1, wherein the flip-flop circuit functions as a static type memory cell, so that the semiconductor memory device functions as an SRAM device.

15. A semiconductor memory device comprising:

a flip-flop circuit;

a switch provided between the flip-flop circuit and a pair of data lines;

a write circuit writing data into the flip-flop circuit via the switch and the data lines; and potential shift means connected to the pair of data lines, for converting potentials of the pair of data line into different first and second potentials.

16. The semiconductor memory device as claimed in claim 15, wherein the potential shift means comprises first and second transistors, the first transistor having a gate connected to both a first data line and a source of said first transistor, said source receiving a first power supply voltage, and a drain outputting said first potential obtained by converting a potential of the second data line, the second transistor having a gate connected to both a second data line and a source of said second transistor, said source set to said first voltage, and a drain outputting said second potential obtained by converting a potential of the first data line, said first and second data lines corresponding to the pair of data lines.

17. The semiconductor memory device as claimed in claim 16, wherein the first power supply voltage differs from the second power supply voltage.

18. The semiconductor memory device as claimed in claim 15, further comprising a read circuit which comprises a current-mirror type read circuit.

19. The semiconductor memory device as claimed in claim 15, further comprising dynamic type memory cells connected to the flip-flop circuit, so that the semiconductor memory device functions as a DRAM device in which the flip-flop functions as a sense amplifier.

20. The semiconductor memory device as claimed in claim 15, wherein the flip-flop circuit functions as a static type memory cell, so that the semiconductor memory device functions as an SRAM device.

* * * * *